(12) United States Patent
Ogihara et al.

(10) Patent No.: US 9,971,245 B2
(45) Date of Patent: May 15, 2018

(54) SILICON-CONTAINING POLYMER, SILICON-CONTAINING COMPOUND, COMPOSITION FOR FORMING A RESIST UNDER LAYER FILM, AND PATTERNING PROCESS

(71) Applicant: SHIN-ETSU CHEMICAL CO., LTD., Tokyo (JP)

(72) Inventors: Tsutomu Ogihara, Jyoetsu (JP); Takeru Watanabe, Jyoetsu (JP); Kazunori Maeda, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 215 days.

(21) Appl. No.: 14/958,568

(22) Filed: Dec. 3, 2015

(65) Prior Publication Data
US 2016/0229939 A1 Aug. 11, 2016

(30) Foreign Application Priority Data
Feb. 5, 2015 (JP) .................................. 2015-021393

(51) Int. Cl.
*G03F 7/11* (2006.01)
*C08F 230/08* (2006.01)
(Continued)

(52) U.S. Cl.
CPC ................... *G03F 7/11* (2013.01); *C08F 8/12* (2013.01); *C08F 212/08* (2013.01);
(Continued)

(58) Field of Classification Search
CPC ...... G03F 7/0758; G03F 7/0045; G03F 7/039; G03F 7/11; C08F 8/12; C08F 230/08;
(Continued)

(56) References Cited

U.S. PATENT DOCUMENTS 4,690,993 A * 9/1987 Falcetta ................ C07F 7/0852
523/106
6,673,883 B1 * 1/2004 Rowan ................ A61F 9/00781
427/372.2
(Continued)

FOREIGN PATENT DOCUMENTS

JP 2001094787 A * 4/2001
JP 2001290273 A * 10/2001
(Continued)

OTHER PUBLICATIONS

Machine translation of JP 2007-284644 (no date).*
(Continued)

*Primary Examiner* — Amanda C Walke
(74) *Attorney, Agent, or Firm* — Oliff PLC

(57) ABSTRACT

The present invention provides a silicon-containing polymer which contains a repeating unit shown by the general formula (1-3) and one or more repeating units selected from repeating units shown by the general formulae (1-1) and (1-2) as a partial structure. There can be provided a composition for forming a silicon-containing resist under layer film, and a silicon-containing polymer and a silicon-containing compound to give the composition that is capable of forming a resist under layer film improved in adhesiveness
(Continued)

in any resist pattern, regardless of negative development or positive development.

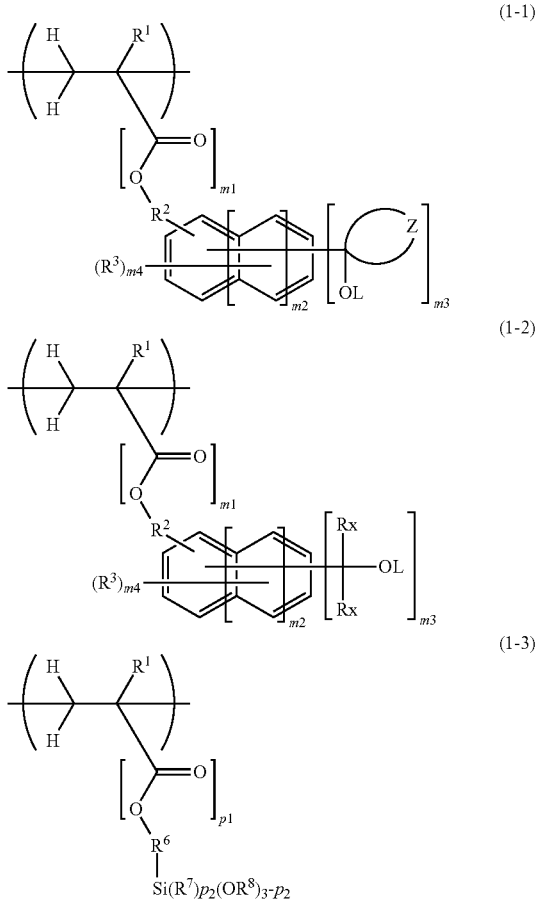

23 Claims, 1 Drawing Sheet

(51) Int. Cl.
| | | |
|---|---|---|
| *G03F 7/40* | (2006.01) | |
| *G03F 7/004* | (2006.01) | |
| *G03F 7/075* | (2006.01) | |
| *G03F 7/039* | (2006.01) | |
| *C08F 8/12* | (2006.01) | |
| *H01L 21/027* | (2006.01) | |
| *C08F 212/08* | (2006.01) | |
| *C08F 232/08* | (2006.01) | |
| *H01L 21/02* | (2006.01) | |
| *C08G 77/14* | (2006.01) | |
| *C08G 77/20* | (2006.01) | |
| *C08F 220/30* | (2006.01) | |

(52) U.S. Cl.
CPC ......... *C08F 220/30* (2013.01); *C08F 230/08* (2013.01); *C08F 232/08* (2013.01); *C08G 77/14* (2013.01); *C08G 77/20* (2013.01); *G03F 7/0045* (2013.01); *G03F 7/039* (2013.01); *G03F 7/0758* (2013.01); *G03F 7/40* (2013.01); *H01L 21/0274* (2013.01); *H01L 21/02123* (2013.01)

(58) Field of Classification Search
CPC .... C08F 212/08; C08F 232/08; C08F 220/30; H01L 21/0274; H01L 21/02123; C08G 77/14; C08G 77/20
USPC ......... 430/271.1, 270.1, 322, 325, 329, 330; 526/279, 319; 528/10, 32
See application file for complete search history.

(56) References Cited

U.S. PATENT DOCUMENTS

| | | | |
|---|---|---|---|
| 8,513,350 B2 * | 8/2013 | Kimura | C08F 230/08 524/189 |
| 8,932,953 B2 * | 1/2015 | Ogihara | G03F 7/091 216/51 |
| 9,567,477 B2 * | 2/2017 | Seshimo | C08F 212/08 |
| 2006/0019195 A1 | 1/2006 | Hatakeyama et al. | |
| 2009/0136869 A1 | 5/2009 | Ogihara et al. | |
| 2010/0003622 A1 | 1/2010 | Matsumaru et al. | |
| 2010/0210765 A1 * | 8/2010 | Nakajima | G03F 7/094 524/114 |
| 2010/0233632 A1 * | 9/2010 | Kawazu | C08G 77/04 430/323 |
| 2010/0285407 A1 | 11/2010 | Ogihara et al. | |
| 2013/0087529 A1 * | 4/2013 | Hatakeyama | H01L 21/0271 216/47 |
| 2013/0280912 A1 | 10/2013 | Ogihara et al. | |
| 2014/0205951 A1 | 7/2014 | Ogihara et al. | |
| 2015/0268556 A1 * | 9/2015 | Domon | G03F 7/30 430/5 |
| 2016/0299430 A1 * | 10/2016 | Domon | G03F 7/0045 |
| 2017/0210836 A1 * | 7/2017 | Domon | C08F 212/14 |

FOREIGN PATENT DOCUMENTS

| | | | | |
|---|---|---|---|---|
| JP | 2001330956 A | * | 11/2001 | |
| JP | 2003-337414 A | | 11/2003 | |
| JP | 2004-153125 A | | 5/2004 | |
| JP | 2005-128509 A | | 5/2005 | |
| JP | 2006077100 A | * | 3/2006 | |
| JP | 2007284644 A | * | 11/2007 | |
| JP | 2008-033174 A | | 2/2008 | |
| JP | 2009-126940 A | | 6/2009 | |
| JP | 2009133891 A | * | 6/2009 | |
| JP | 2010-262230 A | | 11/2010 | |
| JP | 2013041140 A | * | 2/2013 | ............ G03F 7/091 |
| JP | 2013-224279 A | | 10/2013 | |
| JP | 2014-141585 A | | 8/2014 | |

OTHER PUBLICATIONS

Maenhoudt M., et al., "Double Patterning Scheme for Sub-0.25 kl Single Damascene Structures at NA=0.75, lambda=193nm," Proceedings of SPIE vol. 5754, pp. 1508-1518.
Sep. 5, 2017 Office Action issued in Japanese Application No. 2015-021393.

* cited by examiner

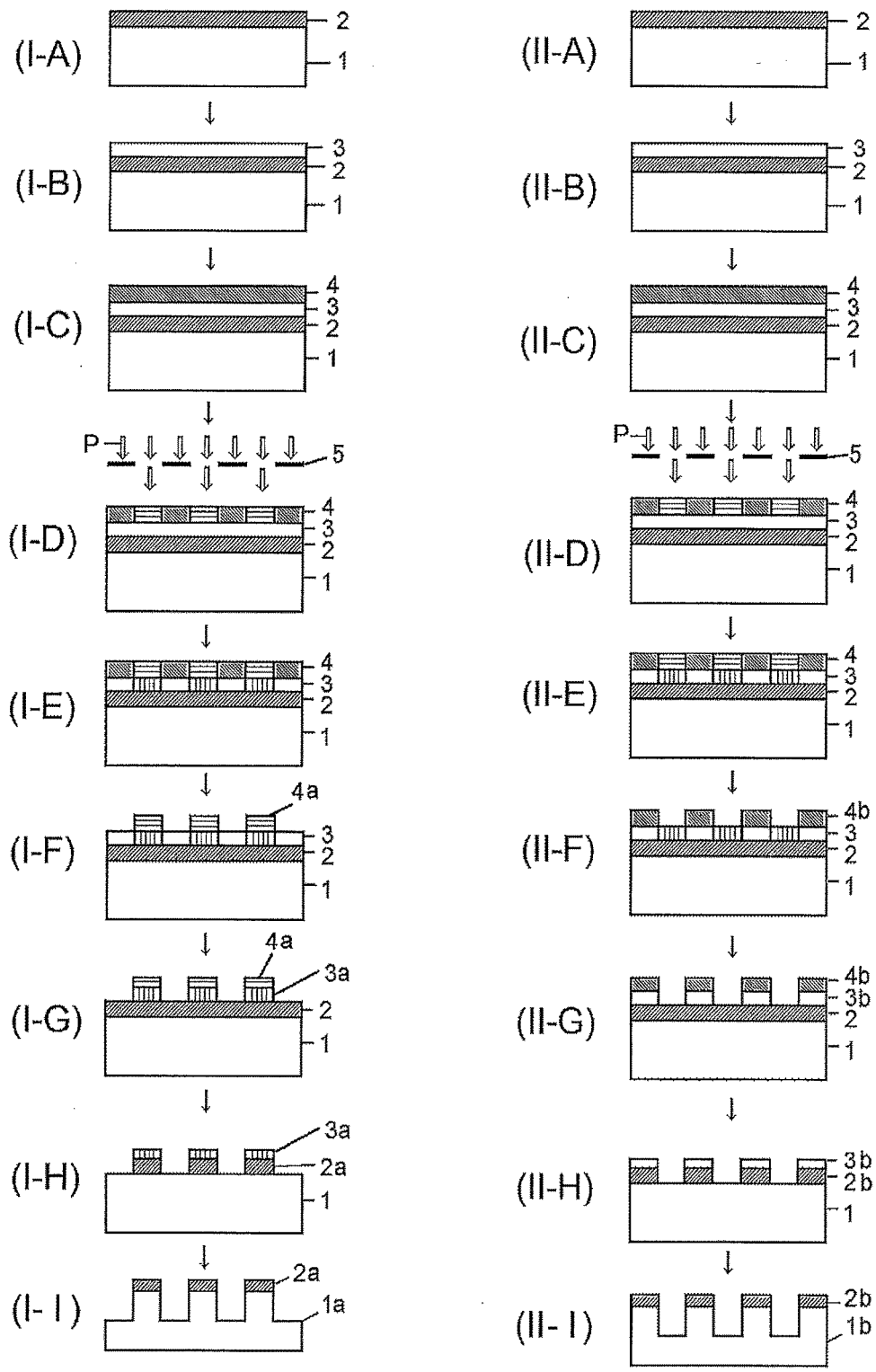

SILICON-CONTAINING POLYMER, SILICON-CONTAINING COMPOUND, COMPOSITION FOR FORMING A RESIST UNDER LAYER FILM, AND PATTERNING PROCESS

BACKGROUND OF THE INVENTION

Field of the Invention

The present invention relates to a silicon-containing polymer, a silicon-containing compound, a composition for forming a silicon-containing resist under layer film, and a patterning process using the same.

Description of the Related Art

In 1980s, photo-exposure using g-beam (436 nm) or i-beam (365 nm) of mercury lamp as a light source had been widely used in the resist patterning. As a means for finer patterning, shifting to a exposure light having shorter wavelength was assumed to be effective, so that, for the mass production process of DRAM (Dynamic Random Access Memory) with 64 MB (work size of 0.25 µm or less) in 1990s and later ones, KrF excimer laser (248 nm), whose wavelength is shorter than i-beam (365 nm), had been used in place of i-beam as the exposure light source. However, for production of DRAM with integration of 256 MB and 1 GB or higher requiring further finer processing technologies (work size of 0.2 µm or less), a light source having a further shorter wavelength was required, and thus, a photolithography using ArF excimer laser (193 nm) has been investigated seriously over a decade. It was expected at first that the ArF lithography would be applied to the fabrication of 180 nm-node devices. However, the KrF excimer lithography survived to the mass production of 130 nm-node devices, so that a full-fledged application of the ArF lithography started from the 90 nm-node. Furthermore, mass production of the 65 nm-node devices is now underway by combining the ArF lithography with a lens having an increased numerical aperture (NA) of 0.9. For the next 45 nm-node devices, further shortening the wavelength of exposure light is progressing, and the $F_2$ lithography with 157 nm wavelength became a candidate. However, there are many problems in the $F_2$ lithography: cost-up of a scanner due to use of a large quantities of expensive $CaF_2$ single crystal for a projection lens; extremely poor durability of a soft pellicle, which leads to change of an optical system due to introduction of a hard pellicle; decrease in etching resistance of a resist film, and so forth. Because of these problems, development of the $F_2$ lithography was suspended, and ArF immersion lithography was introduced.

In the ArF immersion lithography, water having a refractive index of 1.44 is introduced between a projection lens and a wafer by a partial fill method. This enables high speed scanning, and further, mass production of the 45 nm-node devices is now underway by using a lens with a NA of 1.3.

For the 32 nm-node lithography, a lithography with an extreme ultraviolet beam (EUV) of 13.5 nm wavelength is considered to be a candidate. Unfortunately, the EUV lithography has problems such as needs for a higher output power of the laser, a higher sensitivity of the resist film, a higher resolution, a lower line edge roughness (LER), a non-defect MoSi laminate mask, a lower aberration of the reflective mirror, and so forth; and thus, there are innumerable problems to be solved. Development of the immersion lithography with a high refractive index, which is another candidate for the 32 nm-node, was suspended because of low transmittance of LUAG, a candidate for a high refractive index lens, and an inability to obtain a target value of a liquid's refractive index at 1.8. As mentioned above, in the photo-exposure used as a general technology, resolution based on the wavelength of a light source is approaching to its inherent limit.

In recent years, a double patterning process, in which a first pattern is formed by first exposure and development, and then a pattern is formed exactly in the space of the first pattern by second exposure, is drawing an attention as a miniaturization technology (Non-Patent Document 1). Many processes are proposed as the double patterning process. One example is a method (1) that includes forming a photoresist pattern with an interval rate of a line to a space of 1:3 by first exposure and development; processing an under layer hard mask by dry etching; laying another hard mask thereon; forming a second line pattern by subjecting the photoresist film to exposure and development at a space obtained by the first exposure; processing the hard mask by dry etching to form a line and space pattern having half pitch of the first pattern. Also, there is another method (2) that includes forming a photoresist pattern with an interval rate of a space to a line of 1:3 by first exposure and development; processing an under layer hard mask by dry etching; applying a photoresist film thereon; forming a pattern on a remaining portion of the hard mask by second exposure; and processing the hard mask by dry etching using the pattern as a mask. In both methods, the hard mask is processed by dry etching twice.

To perform the dry etching only once, there is a method in which a negative resist composition is used in the first exposure and a positive resist composition is used in the second exposure. In addition, there is a method in which a positive resist composition is used in the first exposure and a negative resist composition dissolved in higher alcohol having 4 or more carbon, in which the positive resist composition does not dissolve, is used in the second exposure.

As an alternative method, there has been proposed a method in which a first pattern formed by first exposure and development is treated with a reactive metal compound to insolubilize the pattern, and then a second pattern is newly formed between the first patterns by exposure and development (Patent Document 1).

As mentioned above, to form a finer pattern, many methods have been investigated. Among them, the common object is to prevent the collapse of a fine pattern to be formed. To accomplish this object, it is desired to improve adhesiveness between an upper resist pattern and a resist under layer film.

PRIOR ART DOCUMENTS

Patent Documents

Patent Document 1: Japanese Patent Application Publication No. 2008-33174
Non-Patent Document 1: Proc. SPIE Vol. 5754 p 1508 (2005)

SUMMARY OF THE INVENTION

An object of the present invention is to provide a composition for forming a silicon-containing resist under layer film, and provide a silicon-containing polymer and a silicon-containing compound that can give the composition capable of forming a resist under layer film improved in adhesiveness in any resist pattern, regardless of negative development or positive development.

To achieve the object, the present invention provides a silicon-containing polymer comprising a repeating unit shown by the general formula (1-3) and one or more repeating units selected from repeating units shown by the general formulae (1-1) and (1-2) as a partial structure,

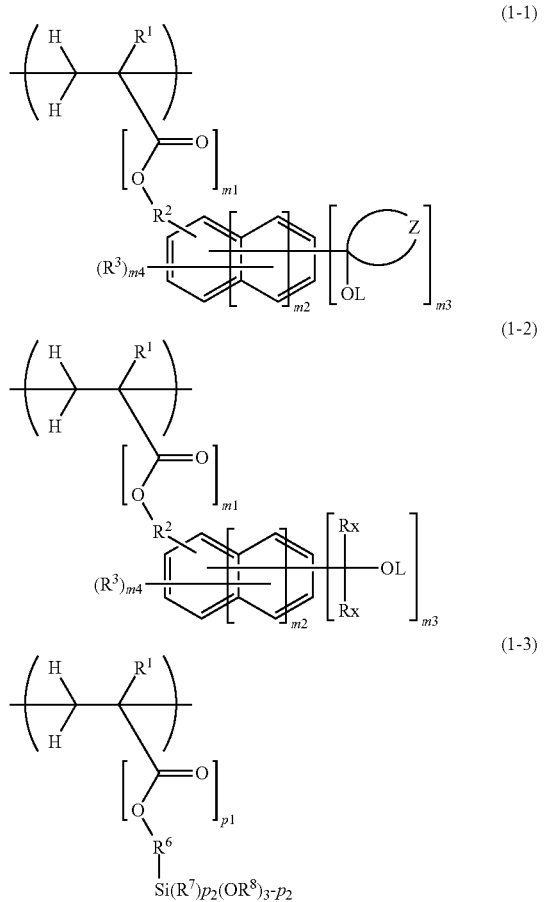

wherein $R^1$ represents a hydrogen atom, a fluorine atom, a methyl group, or a trifluoromethyl group; $R^2$ represents a single bond or an alkylene group having 1 to 10 carbon atoms and optionally containing an ether oxygen atom within the chain of the alkylene group; $R^3$ represents a hydrogen atom, a halogen atom, a linear, branched, or cyclic acyloxy group having 2 to 8 carbon atoms and optionally substituted with halogen, a linear, branched, or cyclic alkyl group having 1 to 6 carbon atoms and optionally substituted with halogen, or a linear, branched, or cyclic alkoxy group having 1 to 6 carbon atoms and optionally substituted with halogen; $R^6$ represents a single bond, a phenylene group optionally containing a substituent, or an alkylene group having 1 to 10 carbon atoms and optionally containing an ether oxygen atom within the chain of the alkylene group; $R^7$ represents a hydrogen atom or an organic group having 1 to 30 carbon atoms; $R^8$ represents a hydrogen atom or an alkyl group having 1 to 6 carbon atoms; $R_x$ and $R_y$ independently represent a hydrogen atom or an alkyl group having 1 to 15 carbon atoms and optionally substituted with a hydroxyl group or an alkoxy group, wherein $R_x$ and $R_y$ may be mutually bonded to form a ring with the carbon atoms to which $R_x$ and $R_y$ are bonded, with the proviso that $R_x$ and $R_y$ do not both represent hydrogen atoms; L represents a hydrogen atom, a linear, branched, or cyclic aliphatic monovalent hydrocarbon group having 1 to 10 carbon atoms and optionally containing an ether oxygen atom, a carbonyl group, or a carbonyloxy group within the chain of the hydrocarbon atom, or a monovalent aromatic group optionally containing a substituent; Z represents an alicyclic group formed together with the carbon atom to which Z is bonded, the alicyclic group having 5 to 15 carbon atoms and optionally containing a heteroatom; m1 represents 0 or 1; m2 represents an integer of 0 to 2; m3 represents an integer of 1 to 3; m4 represents an integer satisfying 5+2×m2−m3; p1 represents 0 or 1; and p2 represents an integer of 0 to 2.

The silicon-containing polymer of the present invention has a OL group (where L is as defined above) on the carbon atom directly bonded to the aromatic ring, and this group serves as a leaving group capable of easily leaving by effect of heat, acid or both of them (hereinafter, referred to as a heat/acid leaving group. When such a silicon-containing polymer is used for a resist under layer film, reactive active species generated by leaving the heat/acid leaving group are continuously reacted, thereby changing the film surface. As a result, pattern adhesiveness is improved in any resist pattern regardless of negative development or positive development, and a film surface excellent in pattern shape can be obtained.

The silicon-containing polymer preferably further comprises a repeating unit shown by the general formula (1-4) as the partial structure,

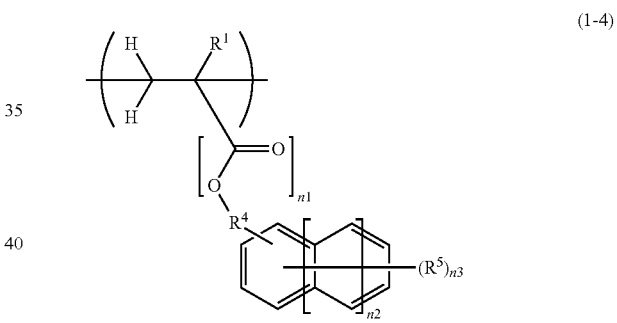

wherein $R^1$ has the same meaning as defined above; $R^4$ represents a single bond or an alkylene group having 1 to 10 carbon atoms and optionally containing an ether oxygen atom within the chain of the alkylene group; $R^5$ represents a hydroxyl group, a halogen atom, a linear, branched, or cyclic acyloxy group having 2 to 8 carbon atoms and optionally substituted with halogen, a linear, branched, or cyclic alkyl group having 1 to 6 carbon atoms and optionally substituted with halogen, or a linear, branched, or cyclic alkoxy group having 1 to 6 carbon atoms and optionally substituted with halogen; n1 represents 0 or 1; n2 represents an integer of 0 to 2; and n3 represent an integer of 0 to 3.

When a composition for forming a silicon-containing resist under layer film containing such a silicon-containing polymer is used, a resist under layer film further excellent in adhesiveness with an upper resist pattern can be formed, and pattern collapse does not occur even in a fine pattern, in both negative development and positive development.

In addition, the present invention provides a silicon-containing compound obtained by hydrolysis or hydrolysis condensation of a single substance or a mixture of one or more silicon-containing polymers selected from the above-mentioned silicon-containing polymer.

Further, the present invention provides a silicon-containing compound obtained by hydrolysis or hydrolysis condensation of a mixture containing one or more hydrolysable silicon compounds shown by the general formula (2) and one or more of the silicon-containing polymer and the above-mentioned silicon-containing compound (hydrolysate or hydrolysis condensate of the silicon-containing polymer),

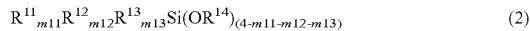
$$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and $0 \leq m11+m12+m13 \leq 3$.

When a composition for forming a silicon-containing resist under layer film containing such a silicon-containing compound is used, excellent adhesiveness with an upper resist pattern can be provided and, a pattern excellent in surface roughness can be formed without pattern collapse, in both negative development and positive development.

In addition, the present invention provides a composition for forming a silicon-containing resist under layer film, comprising (A) one or more of the silicon-containing polymer and the silicon-containing compound mentioned above.

When the inventive composition for forming a silicon-containing resist under layer film is used, a resist under layer film excellent in pattern adhesiveness can be formed.

The composition for forming a silicon-containing resist under layer film preferably further comprises (B) a silicon-containing compound obtained by hydrolysis condensation of one or more hydrolysable silicon compounds shown by the general formula (2).

Alternatively, the composition for forming a silicon-containing resist under layer film preferably further comprises (B) a silicon-containing compound obtained by hydrolysis or hydrolysis condensation of a mixture containing one or more hydrolysable silicon compounds shown by the general formula (2) and one or more of the silicon-containing polymer and the silicon-containing compound mentioned above, the component (B) being different from the silicon-containing compound used as the component (A).

In these cases, it is preferred that a mass ratio between the component (A) and the component (B) is (B)(A).

By using the silicon-containing polymer or the silicon-containing compound of the present invention with an appropriate mass ratio and with an appropriate compound, it is possible to obtain a composition capable of forming a resist under layer film having not only excellent etching selectivity and pattern adhesiveness but also patterning properties stable in both negative development and positive development.

In addition, the present invention provides a patterning process comprising: forming an organic under layer film on a body to be processed by using a coating-type organic under layer film material; forming a silicon-containing resist under layer film on the organic under layer film by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an exposed part of the photoresist film by using an alkaline developer to form a positive pattern; transferring the pattern to the silicon-containing resist under layer film by dry etching using the photoresist film having the formed pattern as a mask; transferring the pattern to the organic under layer film by dry etching using the silicon-containing resist under layer film having the transferred pattern as a mask; and further transferring the pattern to the body to be processed by dry etching using the organic under layer film having the transferred pattern as a mask.

At this time, the coating-type organic under layer film material preferably contains a resin having a naphthalene skeleton.

When such a coating-type organic under layer film material is used, pattern collapse hardly occur in the formation of a fine pattern.

In addition, the present invention provides a patterning process comprising: forming a hard mask mainly consisting of carbon on a body to be processed by a CVD method; forming a silicon-containing resist under layer film on the CVD hard mask by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an exposed part of the photoresist film by using an alkaline developer to form a positive pattern; transferring the pattern to the resist under layer film by dry etching using the photoresist film having the formed pattern as a mask; transferring the pattern to the CVD hard mask by dry etching using the resist under layer film having the transferred pattern as a mask; and further transferring the pattern to the body to be processed by dry etching using the CVD hard mask having the transferred pattern as a mask.

In addition, the present invention provides a patterning process comprising: forming an organic under layer film on a body to be processed by using a coating-type organic under layer film material; forming a silicon-containing resist under layer film on the organic under layer film by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an unexposed part of the photoresist film by using an organic solvent as a developer to form a negative pattern; transferring the pattern to the silicon-containing resist under layer film by dry etching using the photoresist film having the formed pattern as a mask; transferring the pattern to the organic under layer film by dry etching using the silicon-containing resist under layer film having the transferred pattern as a mask; and further transferring the pattern to the body to be processed by dry etching using the organic under layer film having the transferred pattern as a mask.

At this time, the coating-type organic under layer film material preferably contains a resin having a naphthalene skeleton.

When such a coating-type organic under layer film material is used, pattern collapse hardly occur in the formation of a fine pattern.

In addition, the present invention provides a patterning process comprising: forming a hard mask mainly consisting of carbon on a body to be processed by a CVD method; forming a silicon-containing resist under layer film on the CVD hard mask by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an unexposed part of the photoresist film by using an organic solvent as a developer to form a negative pattern; transferring the pattern to the silicon-containing resist under layer film by dry etching using the photoresist film having the formed pattern as a mask; transferring the pattern to the CVD hard mask by dry etching using the silicon-containing resist under layer film having the transferred pattern as a mask; and further transferring the pattern to the body to be processed by dry etching using the CVD hard mask having the transferred pattern as a mask.

When pattern formation is carried out by using the composition for forming a silicon-containing resist under layer film of the present invention, by optimizing the combination of the CVD film or the organic under layer film as mentioned above, the pattern formed in the photoresist can be transferred to a substrate without generating the difference in size conversion.

The body to be processed is preferably a semiconductor apparatus substrate or the semiconductor apparatus substrate coated with any of a metal film, a metal carbide film, a metal oxide film, a metal nitride film, a metal oxycarbide film, and a metal oxynitride film.

Moreover, the metal of the body to be processed is preferably any of silicon, titanium, tungsten, hafnium, zirconium, chromium, germanium, copper, aluminum, indium, gallium, arsenic, palladium, iron, tantalum, iridium, molybdenum, or an alloy thereof.

The patterning process of the present invention can form a pattern by processing the body to be processed as mentioned above.

As mentioned above, when a resist under layer film formed from a composition that contains the silicon-containing polymer or the silicon-containing compound of the present invention is used, the formed resist pattern becomes excellent in adhesiveness, and a pattern having excellent surface roughness can be formed without pattern collapse in both alkaline development (positive development) and organic solvent development (negative development). Further, since this resist under layer film has high etching selectivity relative to an organic material, the formed photoresist pattern can be successively transferred to the silicon-containing resist under layer film and the organic under layer film or the CVD carbon film by dry etching process. Especially, as the manufacturing process of a semiconductor apparatus progresses toward further miniaturization in recent years, the upper resist layer is made thinner in order to prevent pattern collapse after development, which leads to difficulty in pattern transfer to the under layer film. However, when the inventive composition for forming a silicon-containing resist under layer film is used, the pattern can be transferred to the substrate with high precision while suppressing the deformation of the upper resist pattern during dry etching even if a thinned upper resist is used as etching mask.

In addition, in practical manufacturing process of a semiconductor apparatus, all the patterning processes are not replaced to the negative development, but only a part of an ultrafine process is replaced; and thus, it may be assumed that the conventional positive development process remains unchanged. In this case, if the resist under layer film is solely dedicated to negative development or positive development, the equipment may become complicated and quality control may also become cumbersome. Accordingly, when a composition for forming a silicon-containing resist under layer film usable in both positive and negative processes, like the one in the present invention, is used, rational management is possible in both equipment and quality control.

BRIEF DESCRIPTION OF THE DRAWINGS

FIG. 1 shows a flow diagram of an example of the patterning process of the present invention.

DETAILED DESCRIPTION OF THE PREFERRED EMBODIMENTS

As mentioned above, it has been desired to develop a composition for forming a silicon-containing resist under layer film, and a silicon-containing polymer and a silicon-containing compound to give the composition that is capable of forming a resist under layer film improved in adhesiveness in any resist pattern, regardless of negative development or positive development.

So far, the present inventors have proposed a composition for forming a silicon-containing resist under layer film in which the contact angle is decreased at the exposed part by blending a polymer having an acid-labile group and a polymer not having the same with an appropriate ratio to improve adhesiveness of a positive pattern and a negative pattern (Japanese Patent Laid-Open Publication No. 2013-224279). To improve adhesiveness, the present invention has focused an attention on the structure of an organic group on the surface of the coating film. For improvement of adhesiveness, it is effective to change the surface structure of the coating film. Thus, to change the surface structure of the coating film, a component having an organic group that generates reactive active species by the effect of heat or acid is introduced as a partial structure into a composition for forming a resist under layer film. As a result, they found that when a composition for forming a resist under layer film that contains such a component is used, the organic group is continuously reacted to change the surface of the coating film; and thus not only adhesiveness of the under layer film with the upper resist pattern is improved, but also a pattern shape without foot printing can be obtained, thereby bringing the present invention to completion.

That is, the present invention is a silicon-containing polymer comprising a repeating unit shown by the general formula (1-3) and one or more repeating units selected from repeating units shown by the general formulae (1-1) and (1-2) as a partial structure,

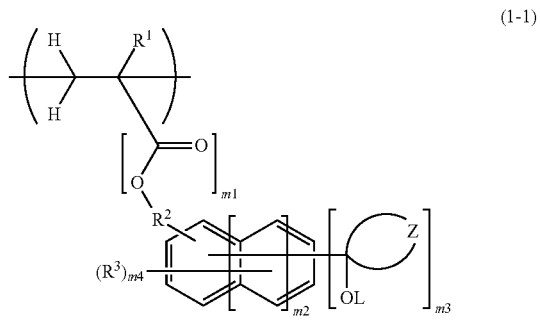

-continued

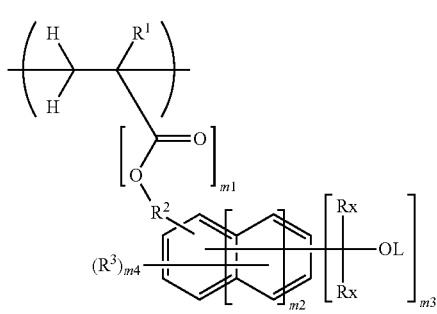

(1-2)

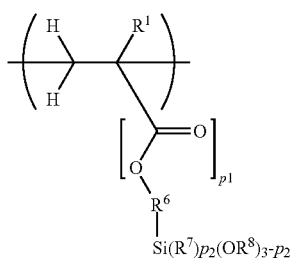

(1-3)

wherein $R^1$ represents a hydrogen atom, a fluorine atom, a methyl group, or a trifluoromethyl group; $R^2$ represents a single bond or an alkylene group having 1 to 10 carbon atoms and optionally containing an ether oxygen atom within the chain of the alkylene group; $R^3$ represents a hydrogen atom, a halogen atom, a linear, branched, or cyclic acyloxy group having 2 to 8 carbon atoms and optionally substituted with halogen, a linear, branched, or cyclic alkyl group having 1 to 6 carbon atoms and optionally substituted with halogen, or a linear, branched, or cyclic alkoxy group having 1 to 6 carbon atoms and optionally substituted with halogen; $R^6$ represents a single bond, a phenylene group optionally containing a substituent, or an alkylene group having 1 to 10 carbon atoms and optionally containing an ether oxygen atom within the chain of the alkylene group; $R^7$ represents a hydrogen atom or an organic group having 1 to 30 carbon atoms; $R^8$ represents a hydrogen atom or an alkyl group having 1 to 6 carbon atoms; $R_x$ and $R_y$ independently represent a hydrogen atom or an alkyl group having 1 to 15 carbon atoms and optionally substituted with a hydroxyl group or an alkoxy group, wherein $R_x$ and $R_y$ may be mutually bonded to form a ring with the carbon atoms to which $R_x$ and $R_y$ are bonded, with the proviso that $R_x$ and $R_y$ do not both represent hydrogen atoms; L represents a hydrogen atom, a linear, branched, or cyclic aliphatic monovalent hydrocarbon group having 1 to 10 carbon atoms and optionally containing an ether oxygen atom, a carbonyl group, or a carbonyloxy group within the chain of the hydrocarbon atom, or a monovalent aromatic group optionally containing a substituent; Z represents an alicyclic group formed together with the carbon atom to which Z is bonded, the alicyclic group having 5 to 15 carbon atoms and optionally containing a heteroatom; m1 represents 0 or 1; m2 represents an integer of 0 to 2; m3 represents an integer of 1 to 3; m4 represents an integer satisfying 5+2×m2−m3; p1 represents 0 or 1; and p2 represents an integer of 0 to 2.

Hereinafter, embodiments of the present invention are explained, but the present invention is not limited thereto. Herein, "Me" represents a methyl group, "Et" represents an ethyl group, and "Ac" represents an acetyl group.

[Silicon-Containing Polymer]

The silicon-containing polymer of the present invention contains one or more repeating units selected from repeating units shown by the general formulae (1-1) and (1-2). The structure of the repeating units shown by the general formulae (1-1) and (1-2) is characterized by having a "heat/acid leaving group" on the carbon atom directly bonded to the aromatic ring, which is capable of easily leaving by effect of heat, acid or both of them. In the present invention, reactive active species generated by leaving the heat/acid leaving group are continuously reacted, thereby changing the film surface, as shown below. As a result, pattern adhesiveness is improved, and a film surface excellent in pattern shape can be obtained.

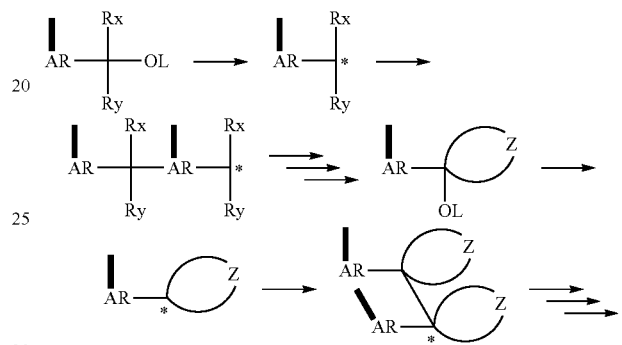

As the repeating units shown by the general formulae (1-1) and (1-2), repeating units shown by the general formulae (1-1a) and (1-2a) are preferably used, respectively.

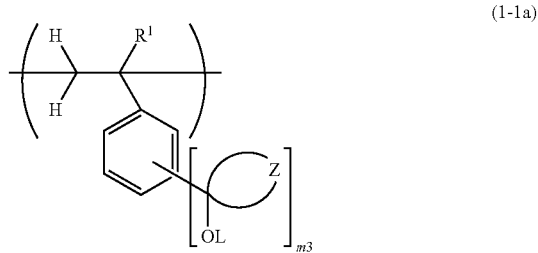

(1-1a)

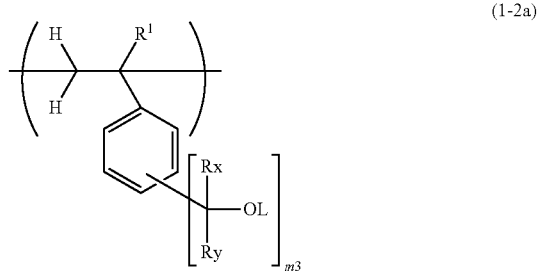

(1-2a)

In the general formulae (1-1), (1-2), (1-1a), and (1-2a), $R^1$ represents a hydrogen atom, a fluorine atom, a methyl group, or a trifluoromethyl group. $R^3$ represents a hydrogen atom, a halogen atom, a linear, branched, or cyclic acyloxy group having 2 to 8 carbon atoms and optionally substituted with halogen, a linear, branched, or cyclic alkyl group having 1 to 6 carbon atoms and optionally substituted with halogen, or a linear, branched, or cyclic alkoxy group having 1 to 6 carbon atoms and optionally substituted with halogen.

The side chain containing the heat/acid leaving group is introduced as a substituent of the aromatic ring, and the substituent number m3 is an integer of 1 to 3. L represents a hydrogen atom, a linear, branched, or cyclic aliphatic monovalent hydrocarbon group having 1 to 10 carbon atoms and optionally containing an ether oxygen atom, a carbonyl group, or a carbonyloxy group within the chain of the hydrocarbon group, or a monovalent aromatic group optionally containing a substituent. Illustrative examples thereof include a hydrogen atom, a methyl group, an ethyl group, a propyl group, an isopropyl group, a cyclopentyl group, a cyclohexyl group, an adamantyl group, a methylcarbonyl group, and a phenyl group.

Z represents an alicyclic group formed together with the carbon atom to which Z is bonded, and the alicyclic group has 5 to 15 carbon atoms and optionally contains a heteroatom. Illustrative examples of the alicyclic group having 5 to 15 carbon, formed together with the carbon atom to which Z is bonded include groups shown below. In the following formula, C represents the carbon atom to which Z is bonded.

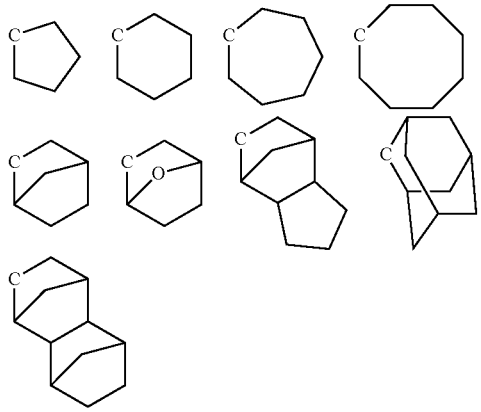

$R_x$ and $R_y$ independently represent a hydrogen atom or an alkyl group having 1 to 15 carbon atoms and optionally substituted with a hydroxyl group or an alkoxy group. $R_x$ and $R_y$ may be mutually bonded to form a ring with the carbon atoms to which $R_x$ and $R_y$ are bonded, with the proviso that $R_x$ and $R_y$ do not both represent hydrogen atoms. At least one of $R_x$ and $R_y$ is preferably an alicyclic monovalent hydrocarbon group having 5 to 15 carbon atoms. As preferable structures of $R_x$ and $R_y$ other than cyclic structure, there may be mentioned a methyl group, an ethyl group, a propyl group, a butyl group, and a group in which a part or whole of hydrogen atoms of these groups is substituted with a hydroxyl group or an alkoxy group.

The aromatic ring shown in the general formulae (1-1) and (1-2) may be bonded to the main chain by a single bond, or may be bonded via an ester bond or a linker $R^2$. m2 represents an integer of 0 to 2; and when m2 is 0, 1, or 2, each corresponds to benzene ring, naphthalene ring, or anthracene ring, respectively.

$R^2$ represents a single bond or an alkylene group having 1 to 10 carbon atoms and optionally containing an ether oxygen atom (ether bond) within the chain of the alkylene group. Preferable examples of the alkylene group include a methylene group, an ethylene group, a propylene group, a butylene group, a pentylene group, a hexylene group, and structural isomers with carbon skeleton having branched or cyclic structure. In the case that ether oxygen is contained, when m1 in the general formulae (1-1) and (1-2) is 1, ether oxygen may be at any position except the position between α-carbon and β-carbon relative to the ester oxygen. When m1 is 0, the atom bonded to the main chain is ether oxygen, and second ether oxygen may contained at any position except the position between α-carbon and β-carbon relative to the first ether oxygen.

Preferable examples of the repeating units shown by the general formulae (1-1) and (1-2) are shown below.

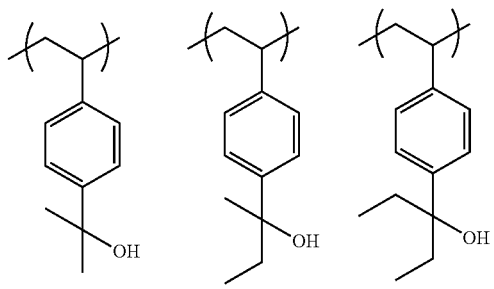

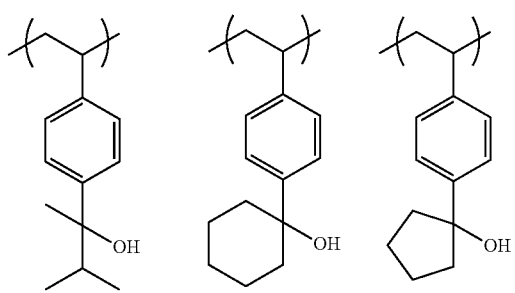

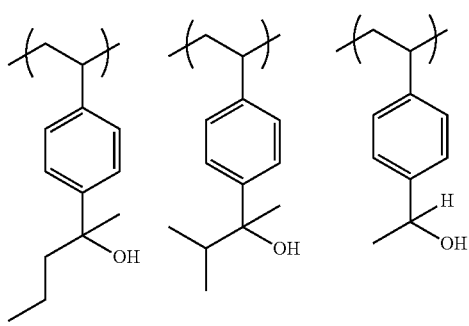

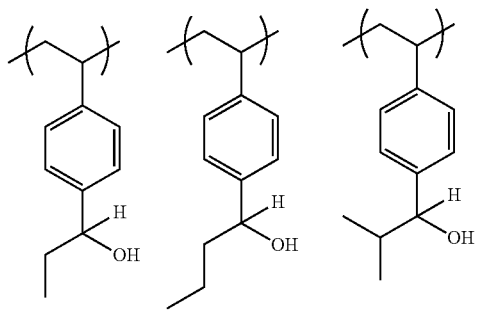

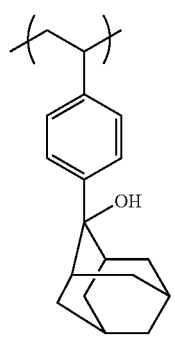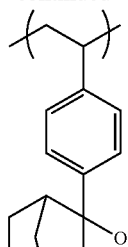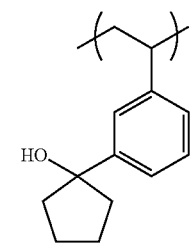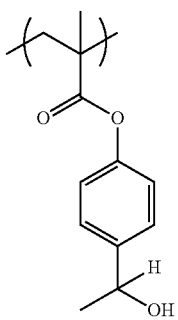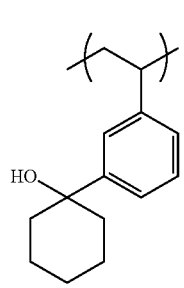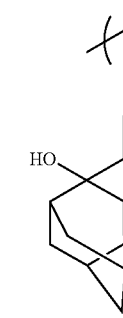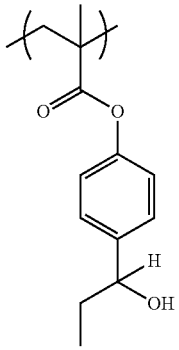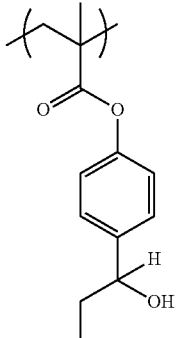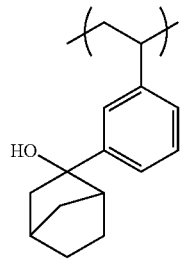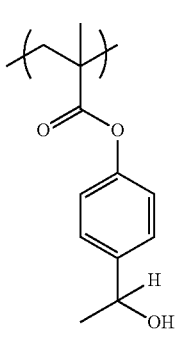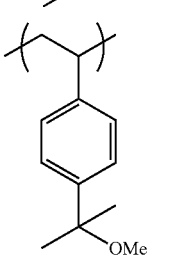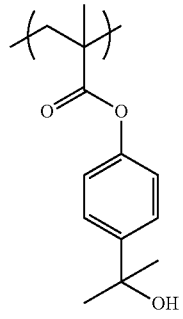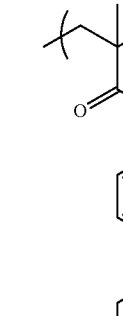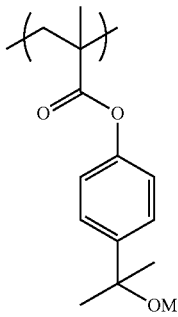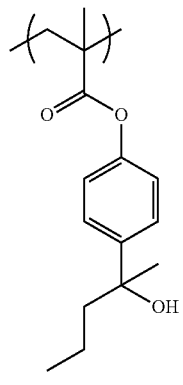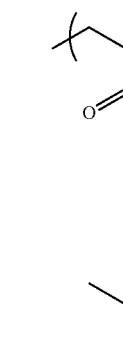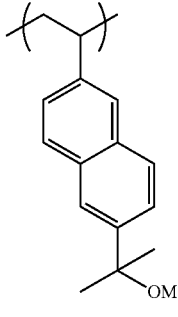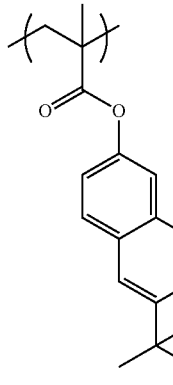

-continued
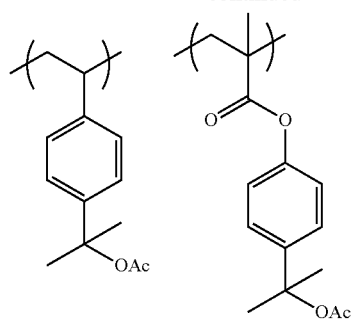
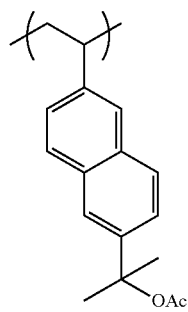
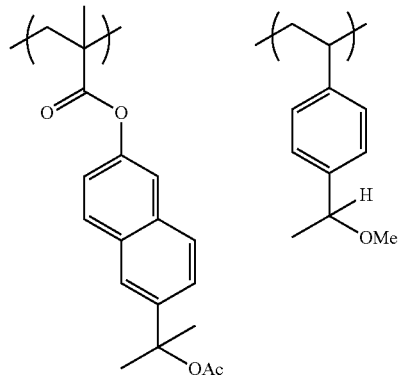
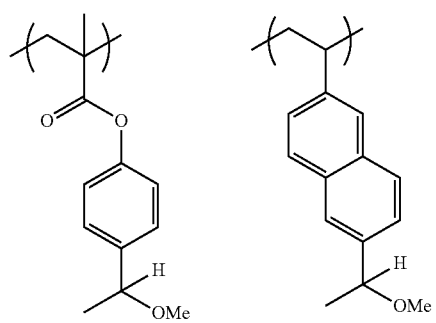
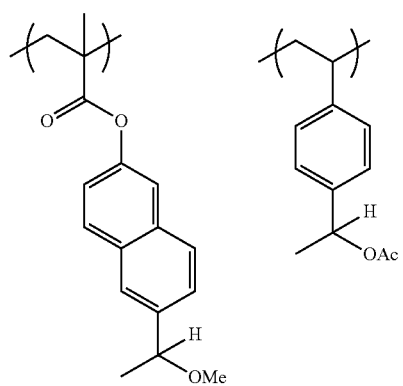
-continued
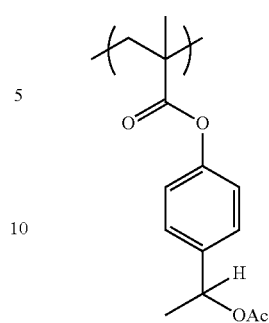
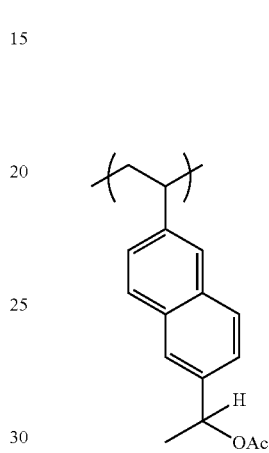
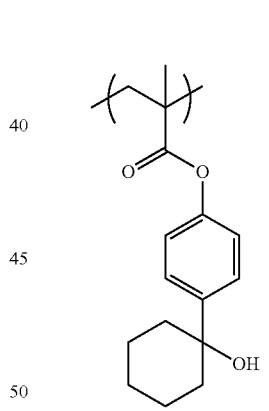
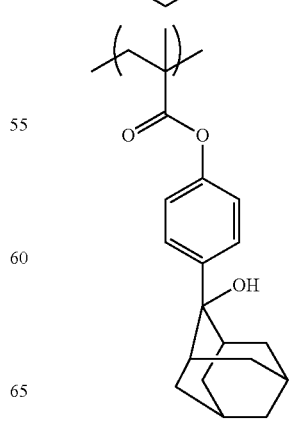
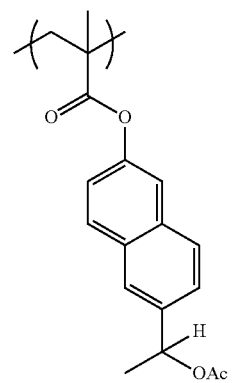
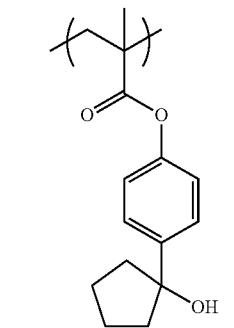
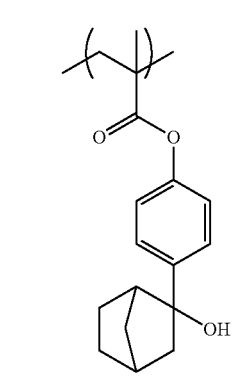

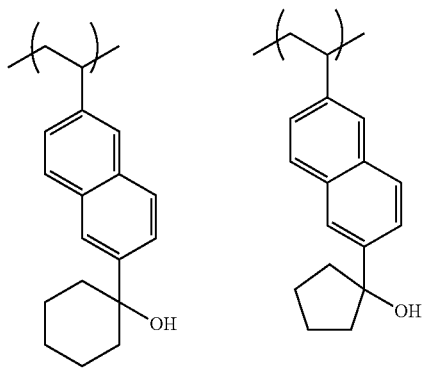
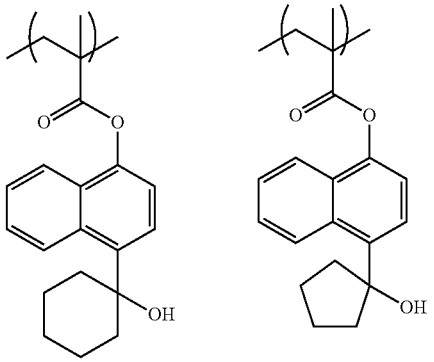
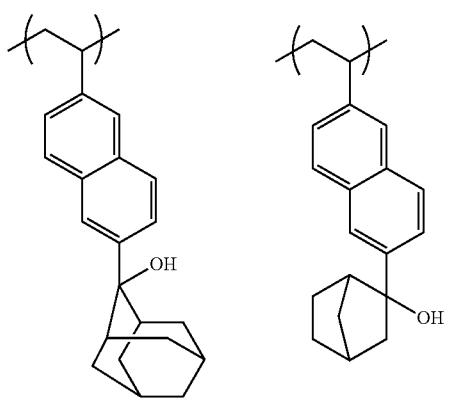
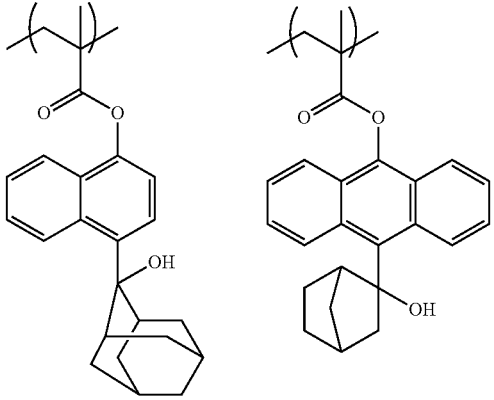
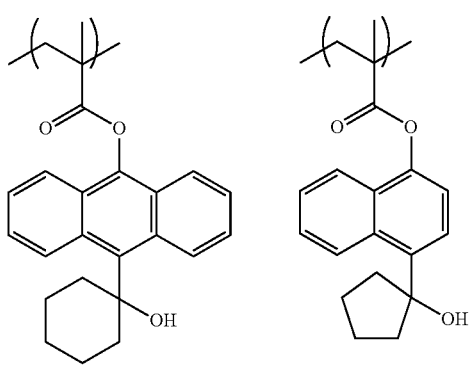
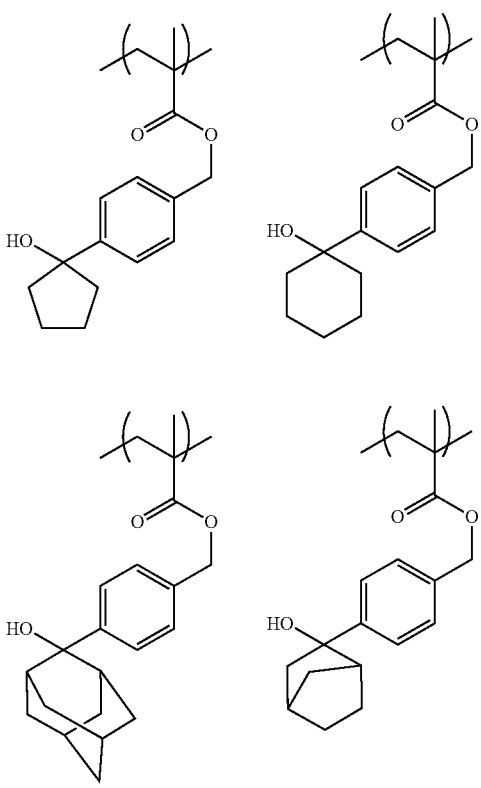

19
-continued
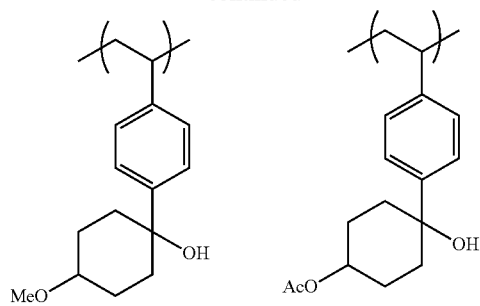
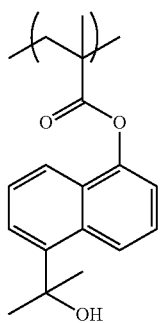
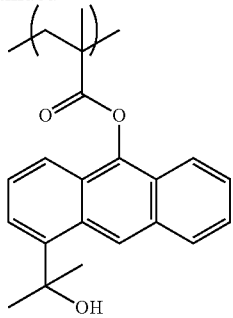
20
-continued
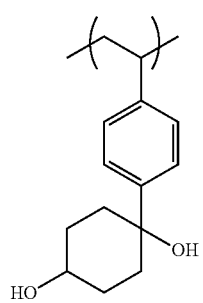
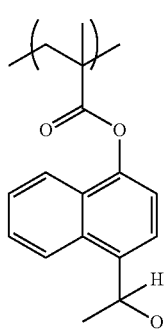
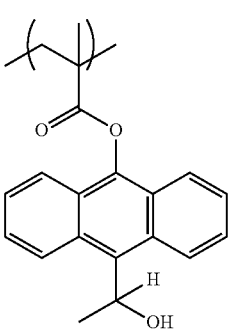
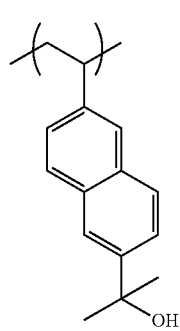
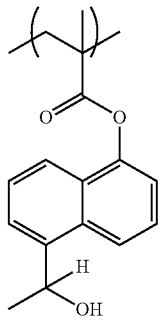
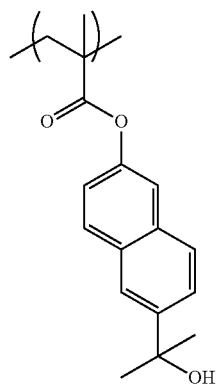
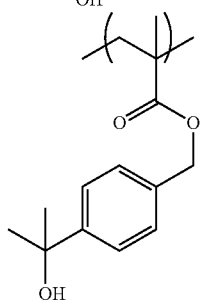
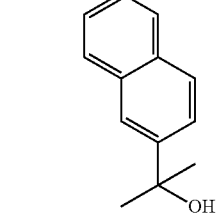
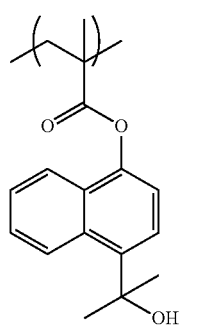
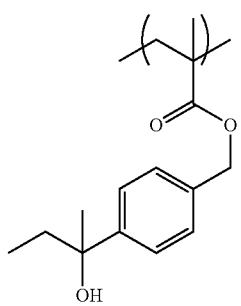
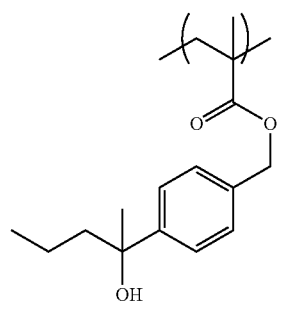

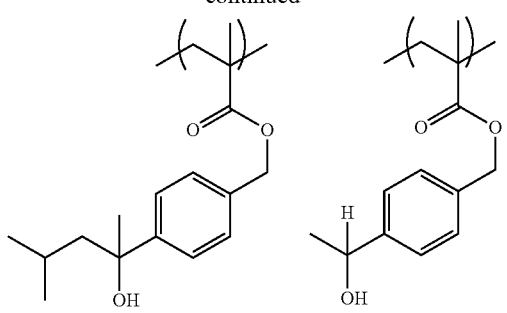
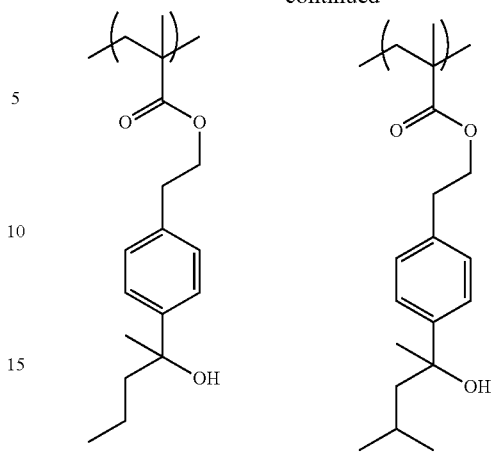
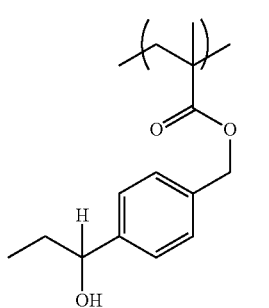
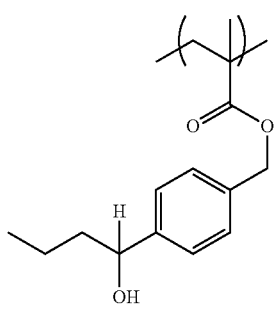
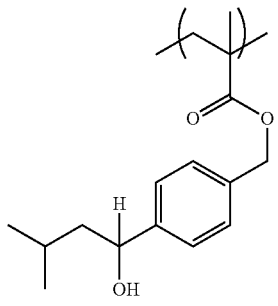
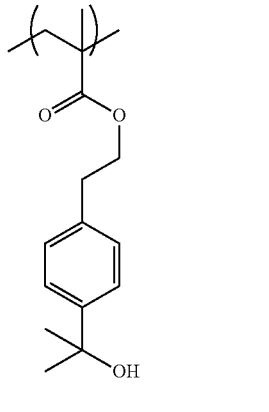

-continued
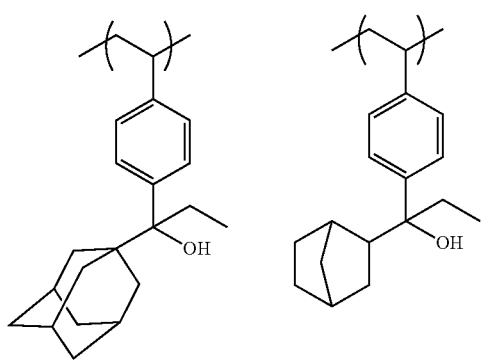
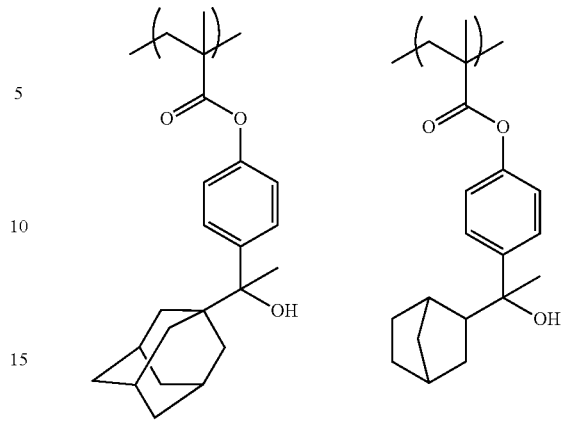
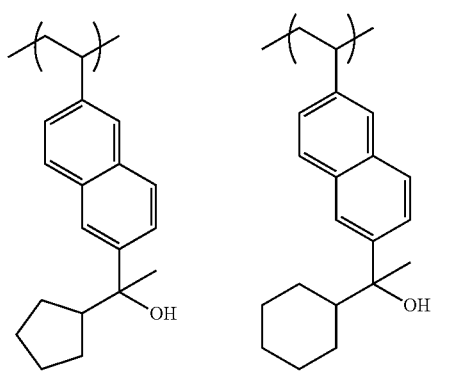
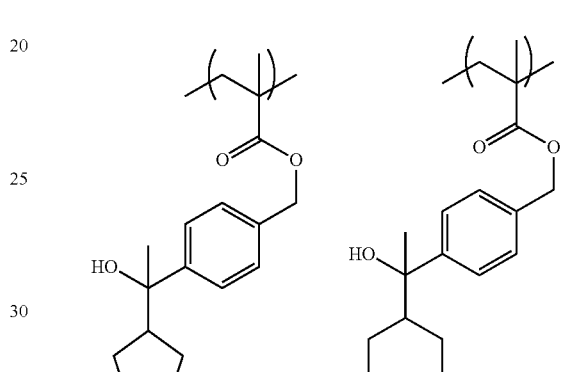
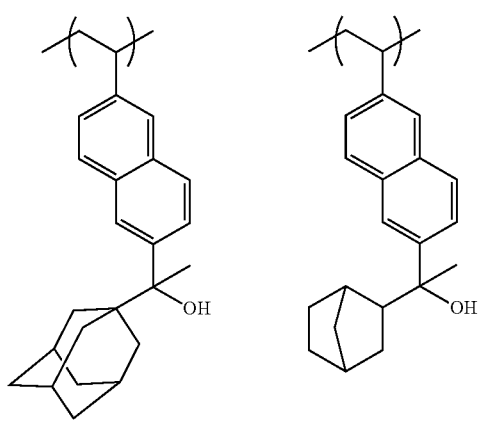
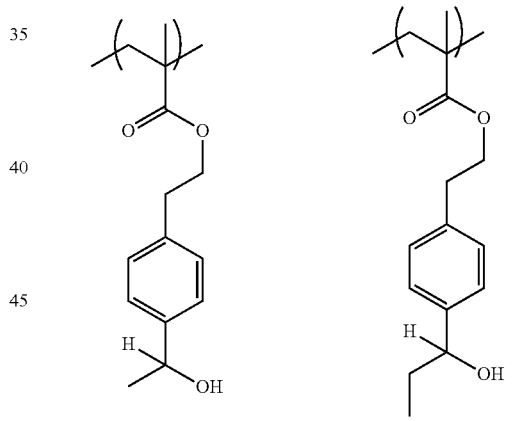
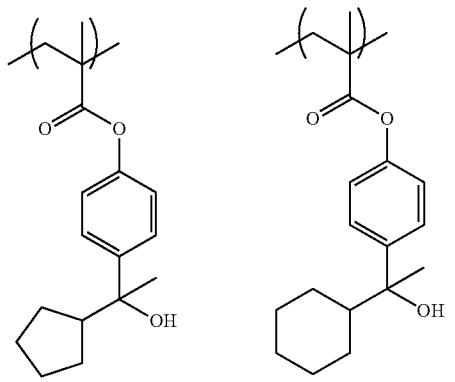
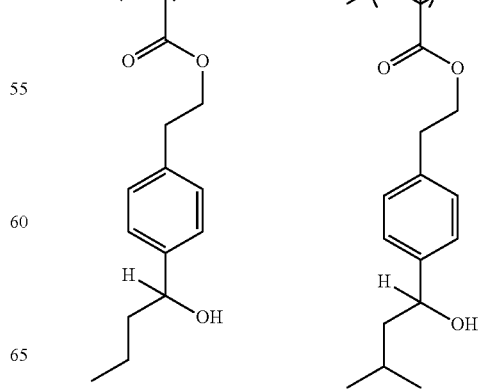

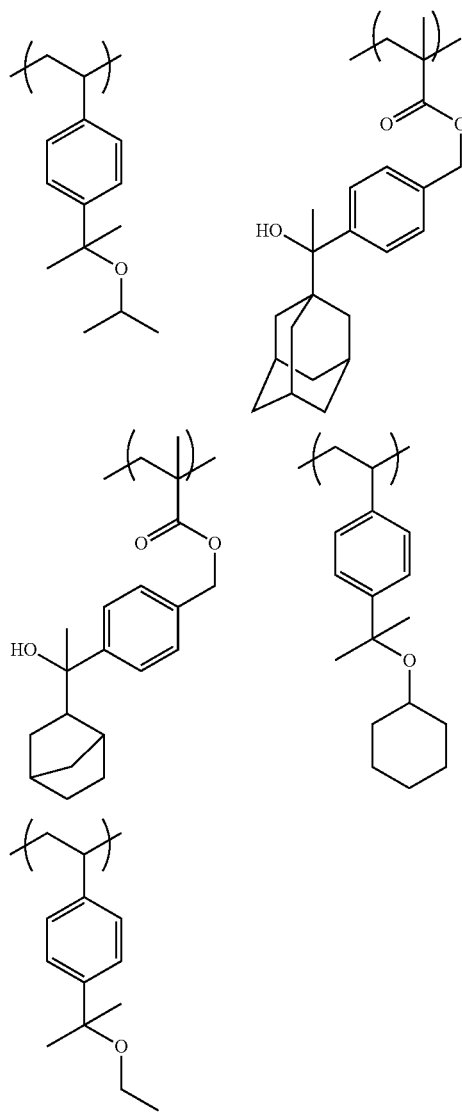
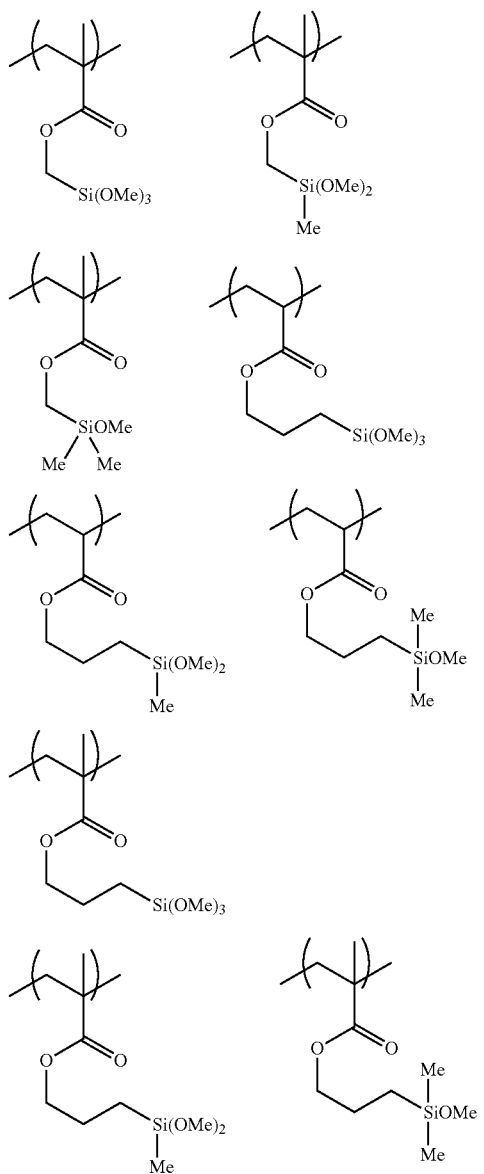
In addition, the silicon-containing polymer of the present invention contains a repeating unit shown by the general formula (1-3). Preferable examples of the repeating unit shown by the general formula (1-3) are shown below.
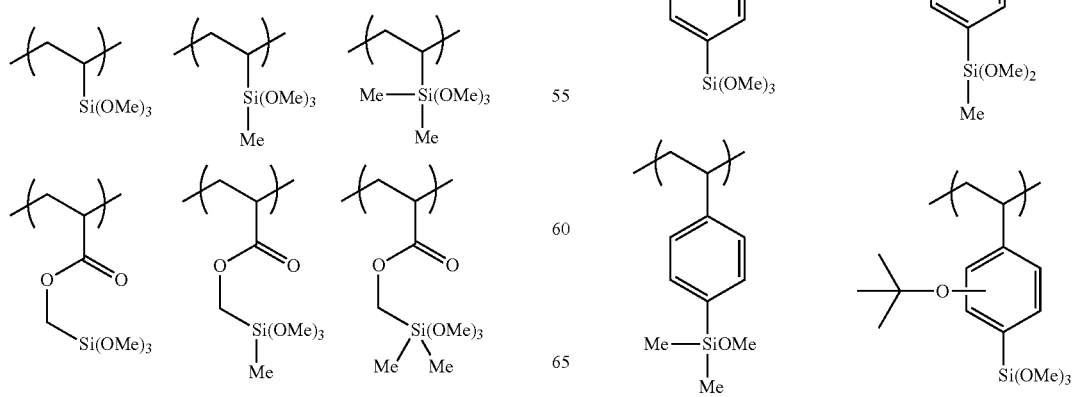

27
-continued
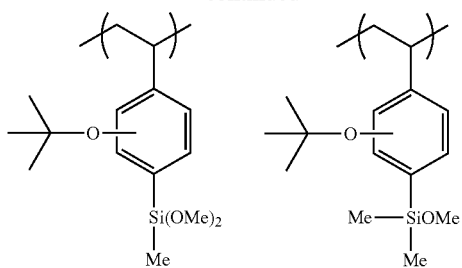
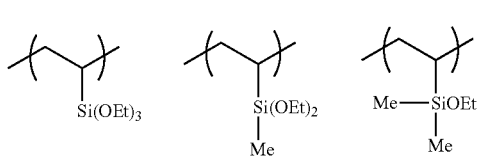
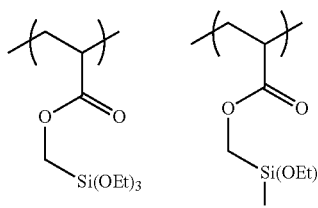
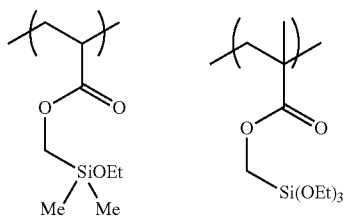
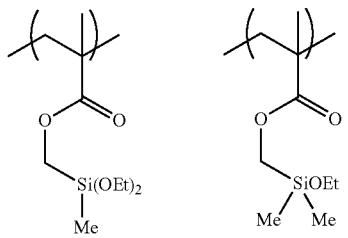
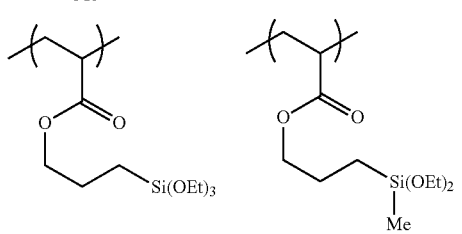
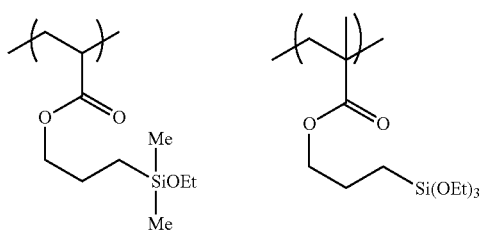
28
-continued
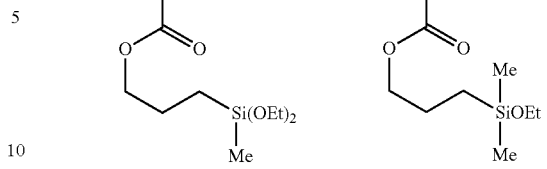
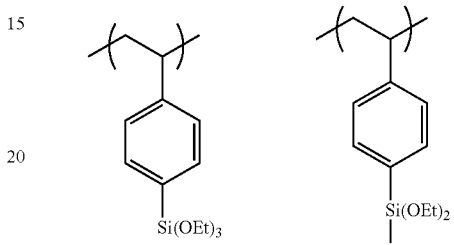
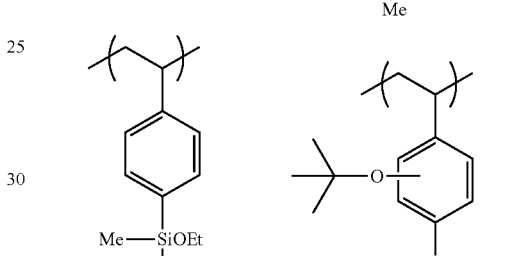
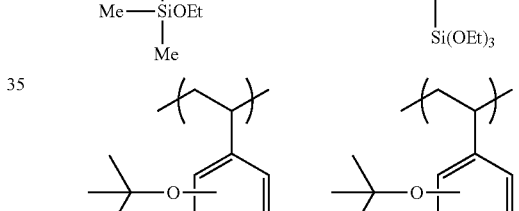
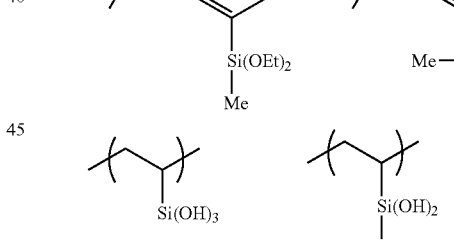
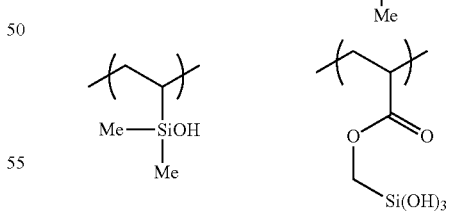
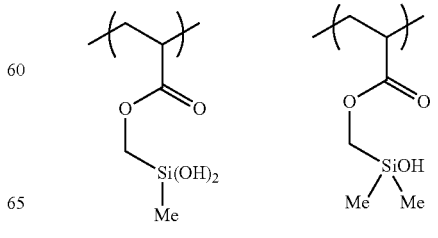

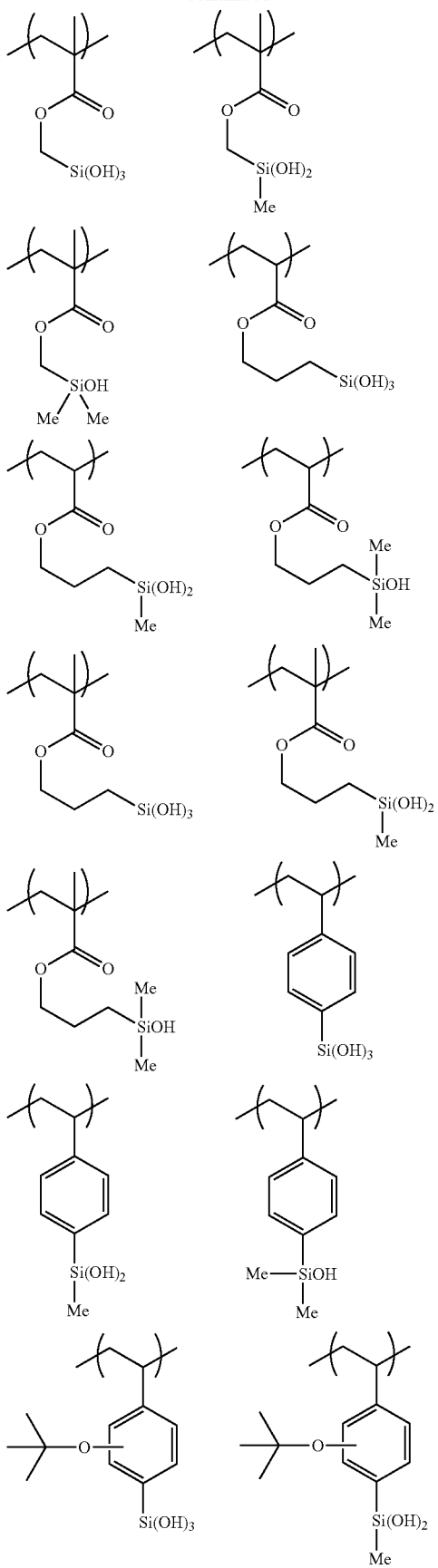

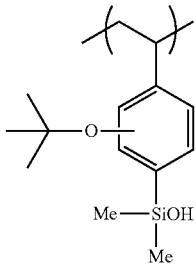

Moreover, the silicon-containing polymer of the present invention preferably further contains a repeating unit shown by the general formula (1-4) as the partial structure,

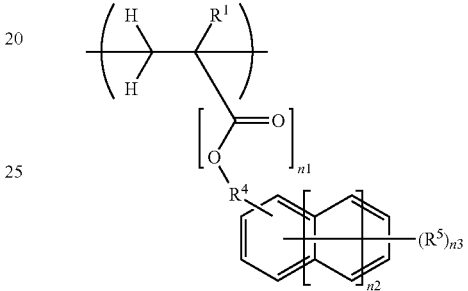

(1-4)

wherein $R^1$ has the same meaning as defined above; $R^4$ represents a single bond or an alkylene group having 1 to 10 carbon atoms and optionally containing an ether oxygen atom within the chain of the alkylene group; $R^5$ represents a hydroxyl group, a halogen atom, a linear, branched, or cyclic acyloxy group having 2 to 8 carbon atoms and optionally substituted with halogen, a linear, branched, or cyclic alkyl group having 1 to 6 carbon atoms and optionally substituted with halogen, or a linear, branched, or cyclic alkoxy group having 1 to 6 carbon atoms and optionally substituted with halogen; n1 represents 0 or 1; n2 represents an integer of 0 to 2; and n3 represent an integer of 0 to 3.

It has been empirically known that making a contact angle of a resist pattern coincident with a contact angle of a resist under layer film is effective in enhancing adhesiveness and reducing roughness of the resist pattern. For example, when a tertiary alkoxy group is introduced as $R^5$, the tertiary alkyl group is released at an exposed part by effect of acid generated in the upper resist layer, thereby generating a phenolic hydroxyl group. Thus, the contact angle thereof approximates to that of a pattern formed by negative development, which results in improved adhesiveness with the resist pattern. On the other hand, at an unexposed part, acid is not generated in the upper resist layer, so that the tertiary alkyl group is not released. Thus, the contact angle thereof approximates to that of a positive pattern of the upper resist layer, and therefore pattern adhesiveness is maintained at the unexposed part. In this way, more suitable resist under layer film can be obtained in any of negative and positive development processes. That is, excellent adhesiveness with an upper resist pattern can be achieved in both processes, and pattern collapse does not occur even in a fine pattern.

The repeating unit shown by the general formula (1-4) may be selected according to a patterning process to be applied. For example, in a negative development process using an organic solvent developer, the following repeating units are preferably used.

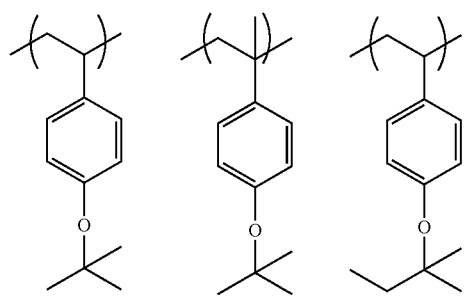
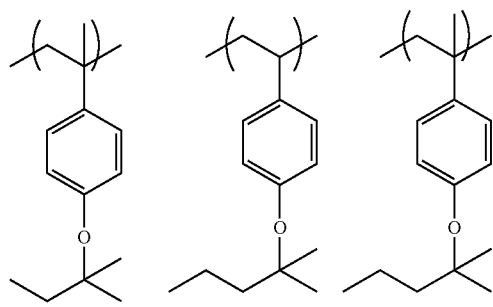
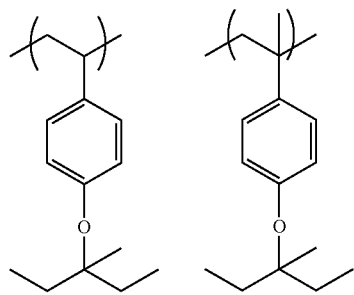
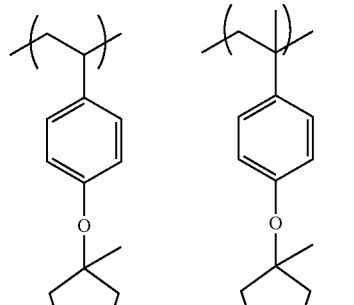
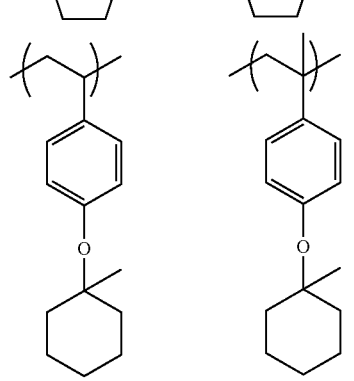
-continued
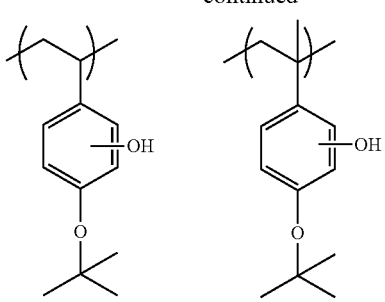
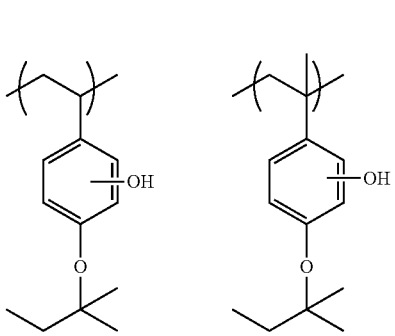
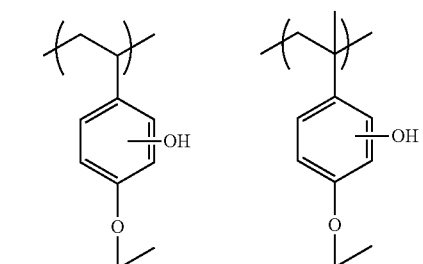
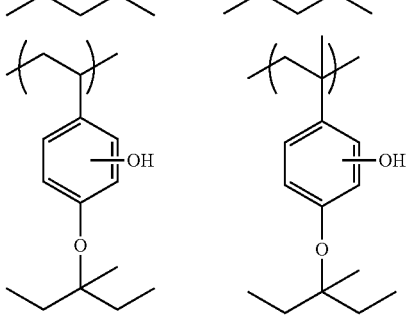
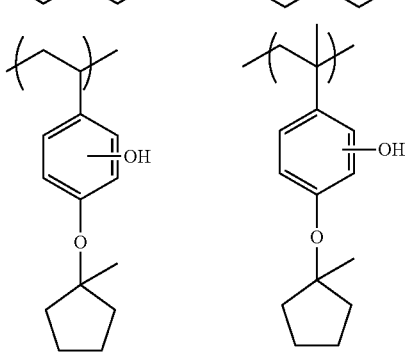

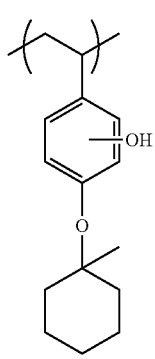 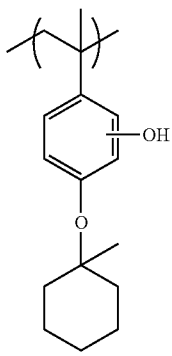 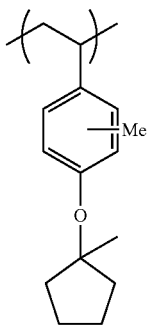 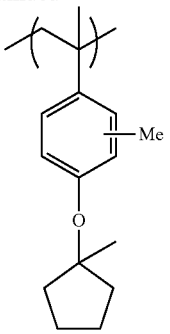
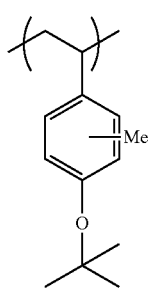 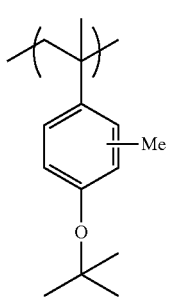 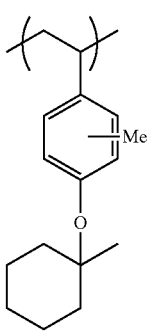 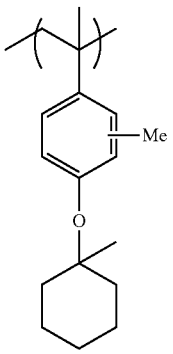
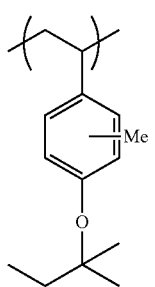 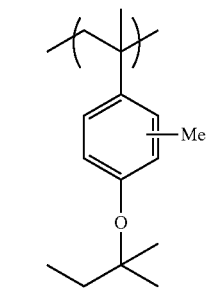 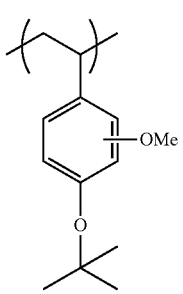 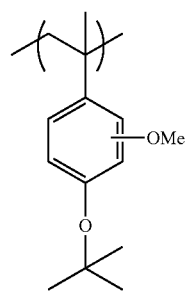
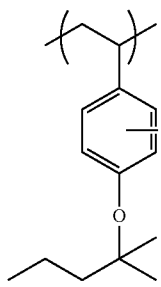 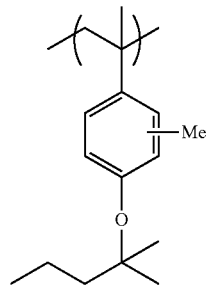 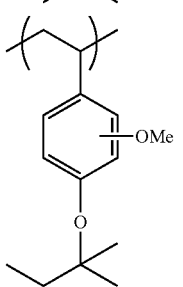 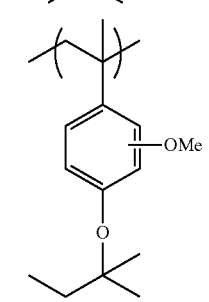
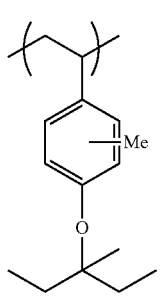 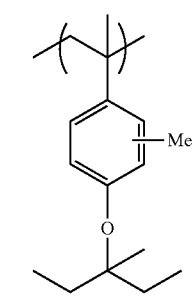 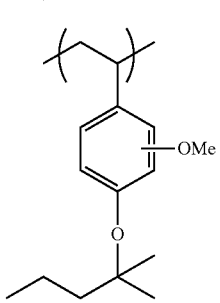 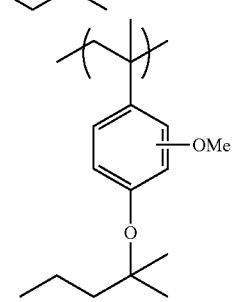

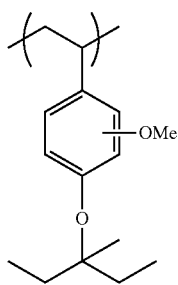 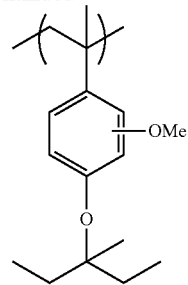 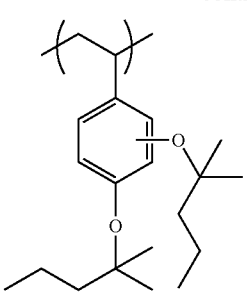 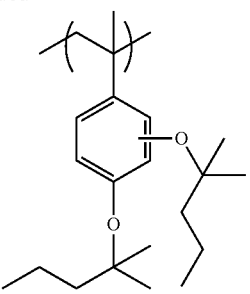
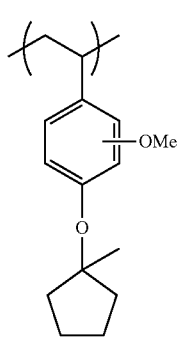 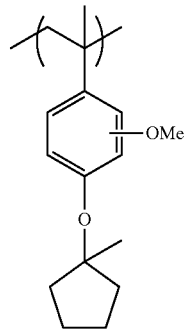 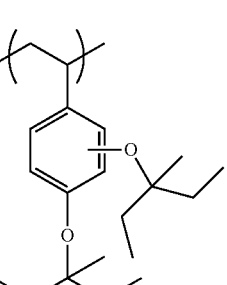 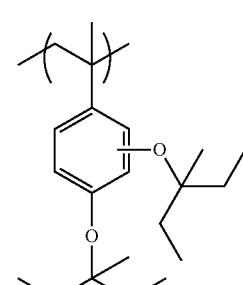
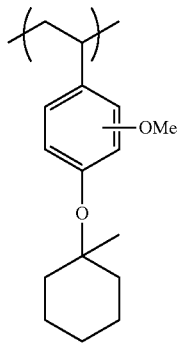 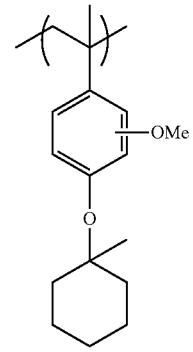 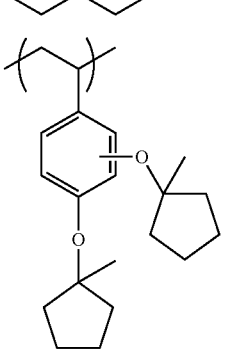 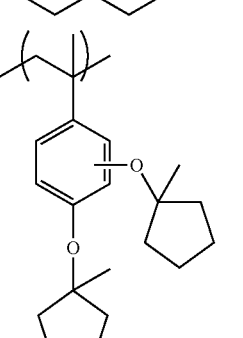
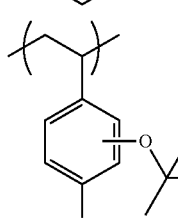 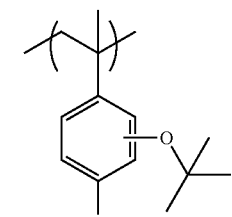 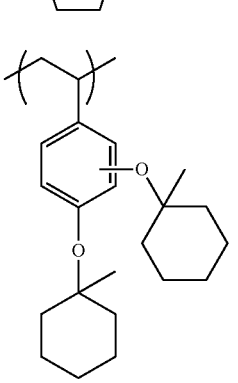 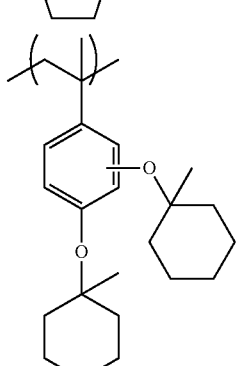
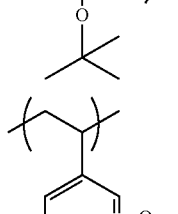 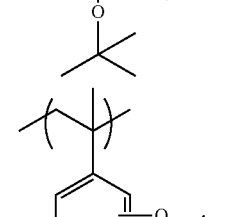 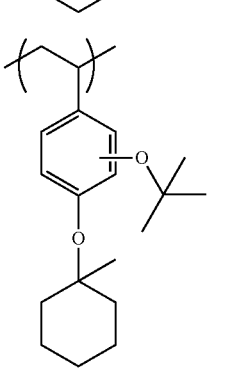 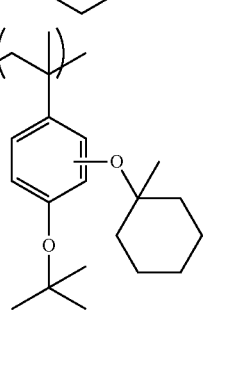
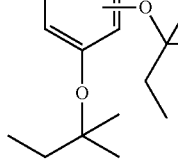 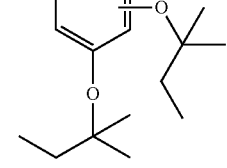

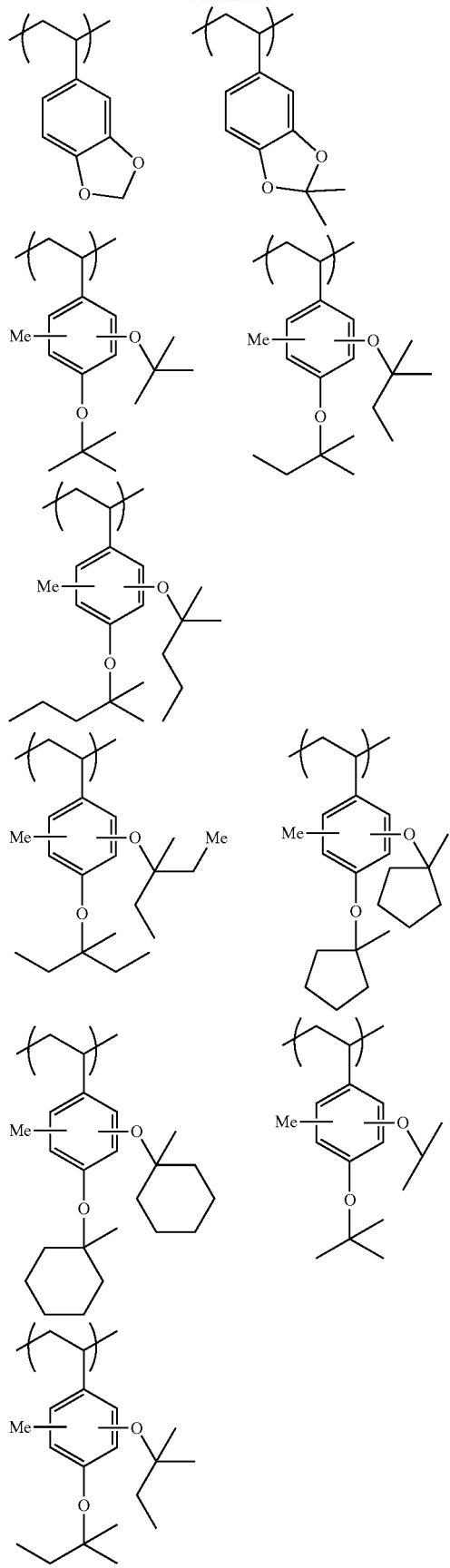
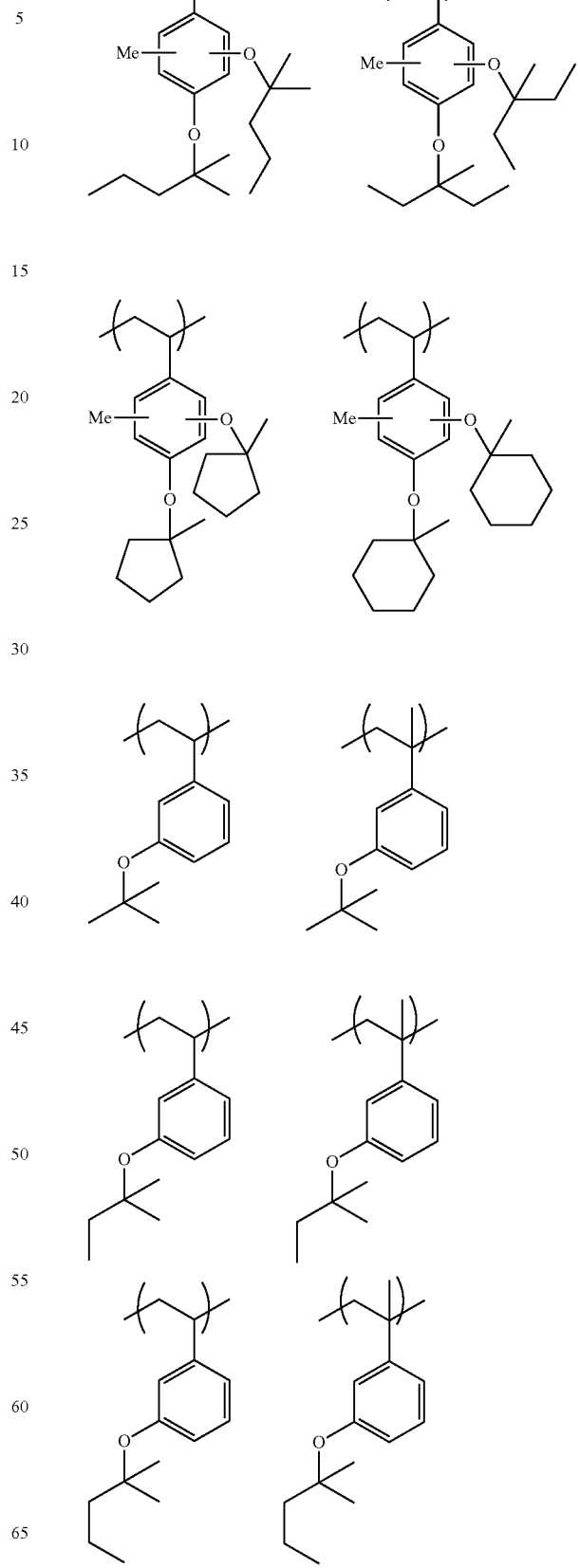

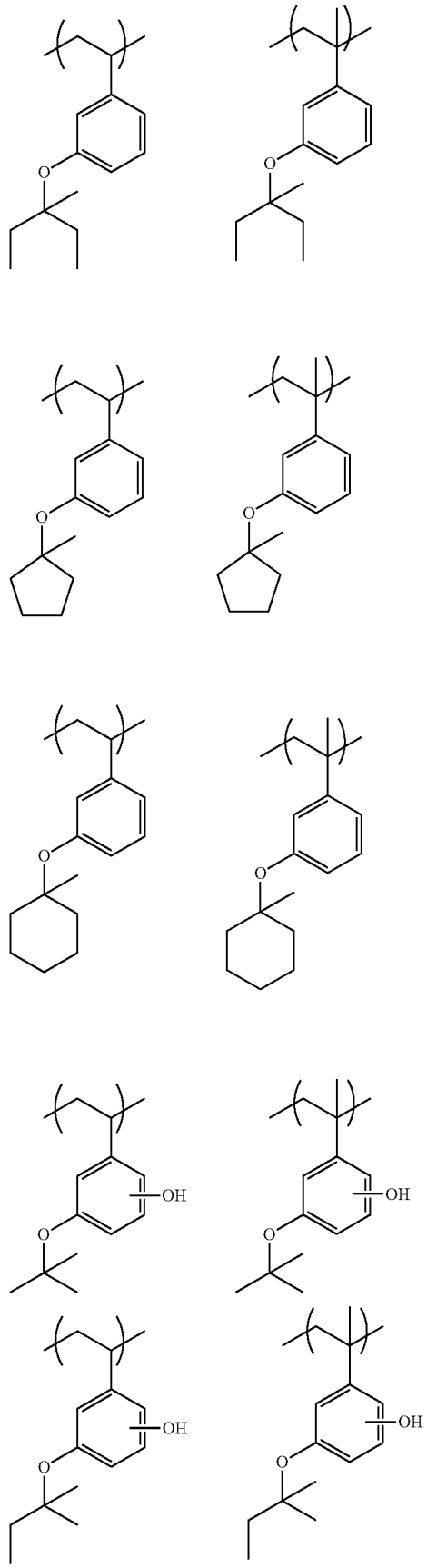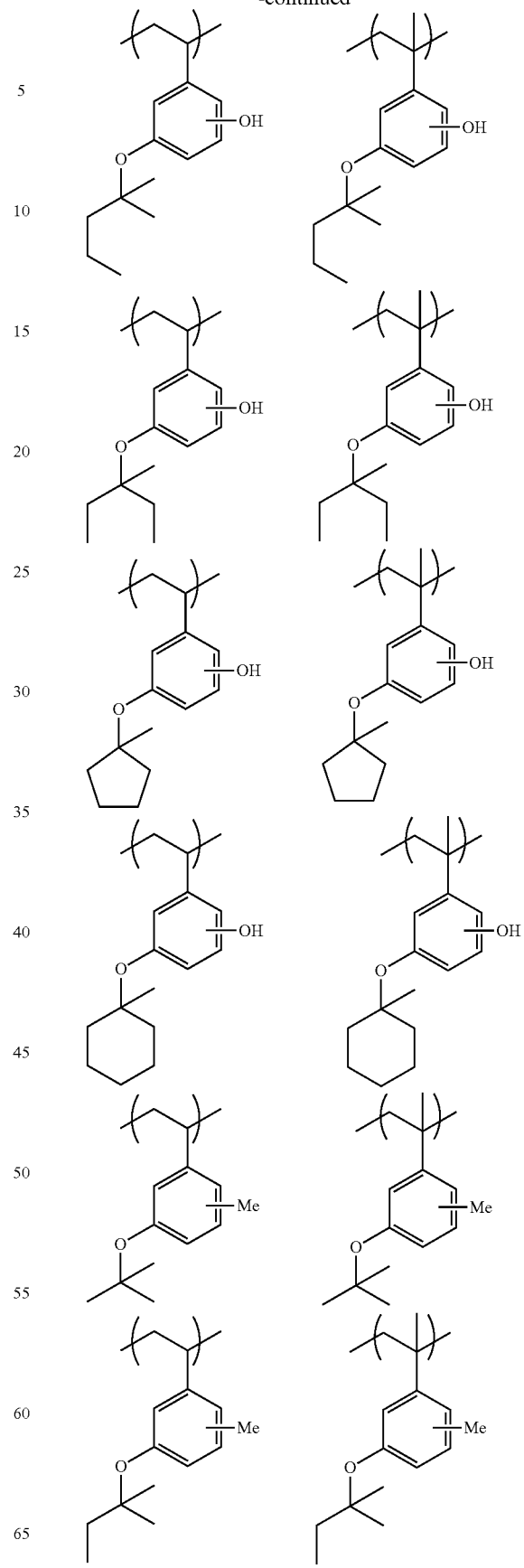

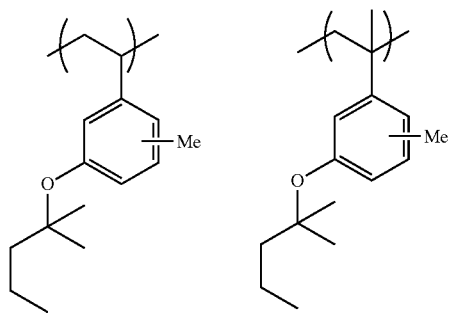
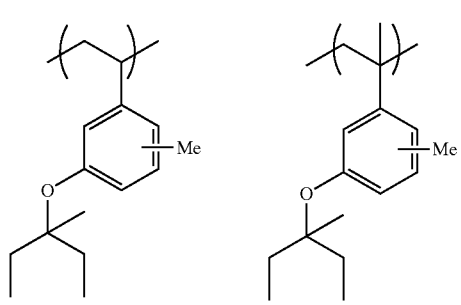
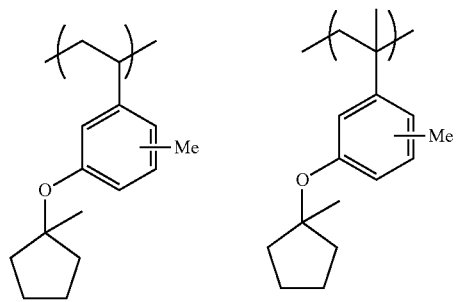
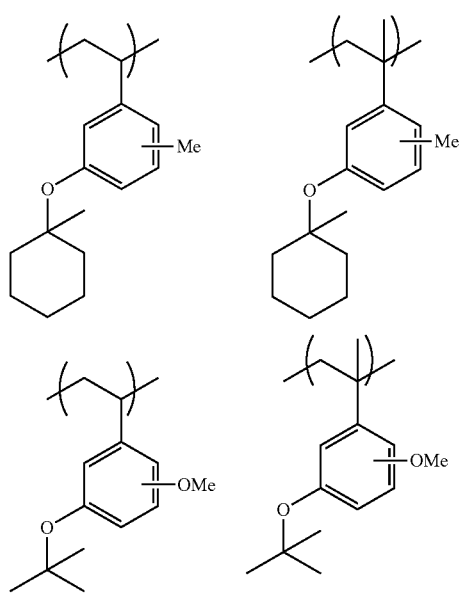
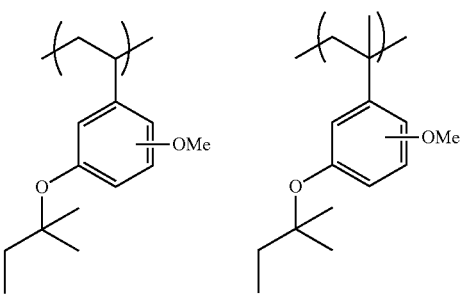
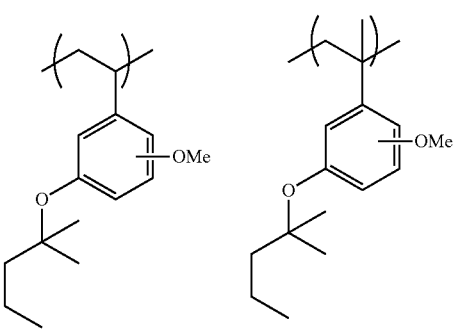
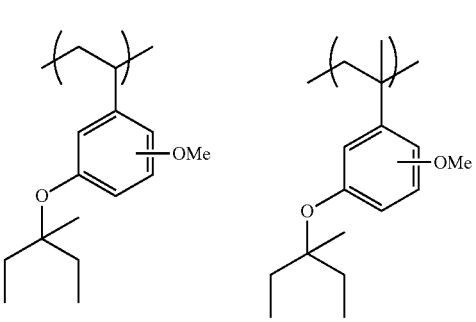
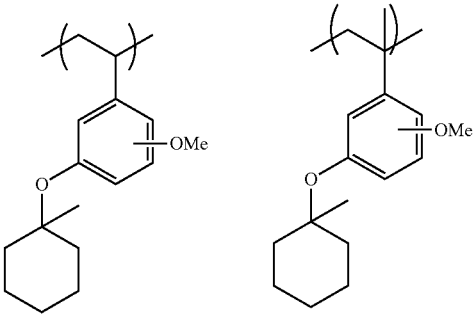

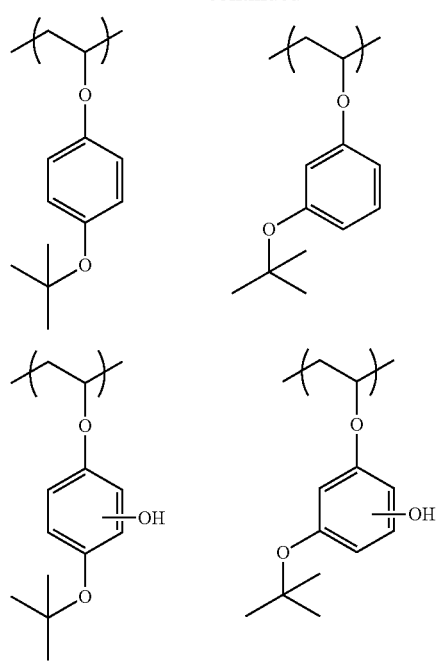
In contrast, in a positive development process using an alkaline developer, the following repeating units can be used as the repeating unit shown by the general formula (1-4) although the above repeating units are also available.
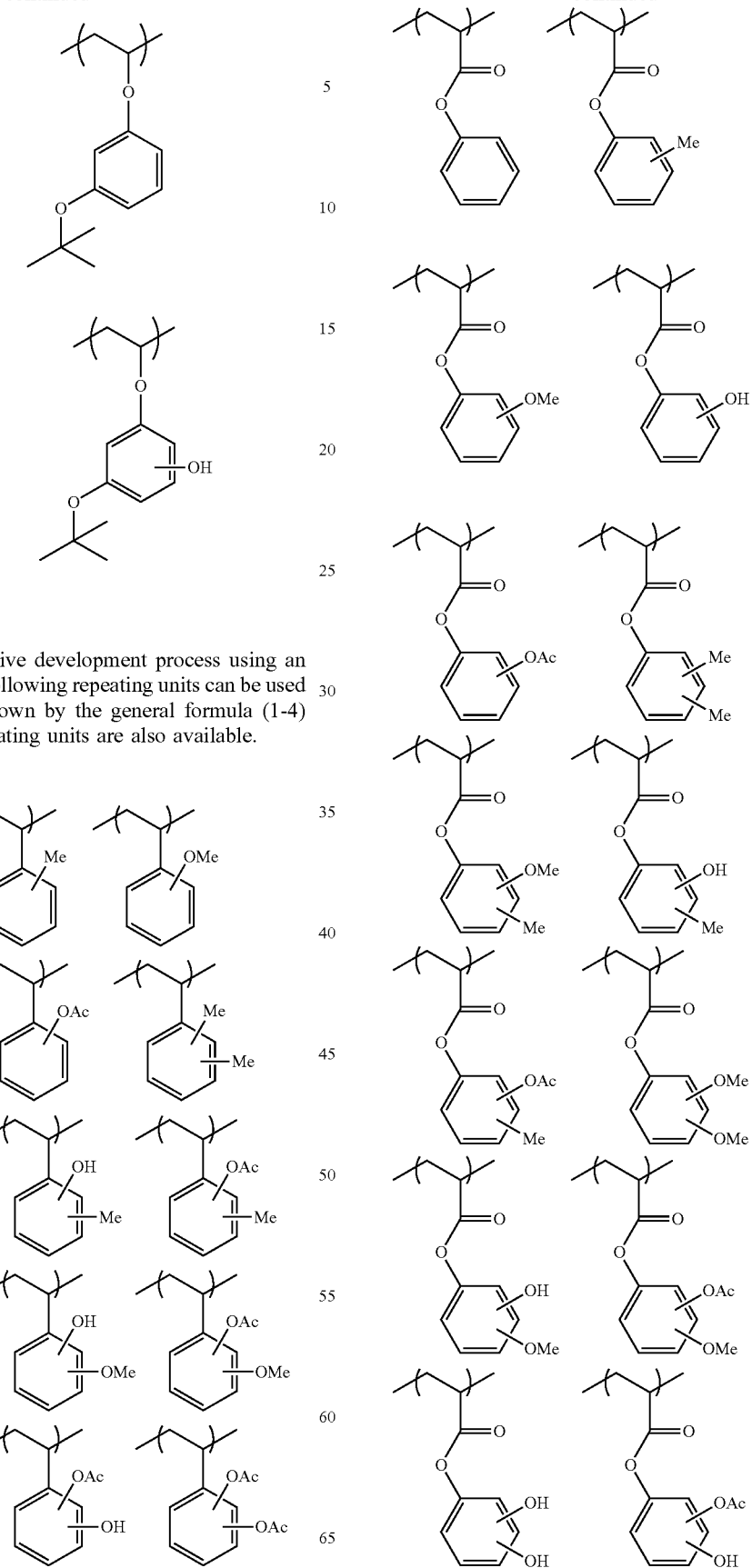

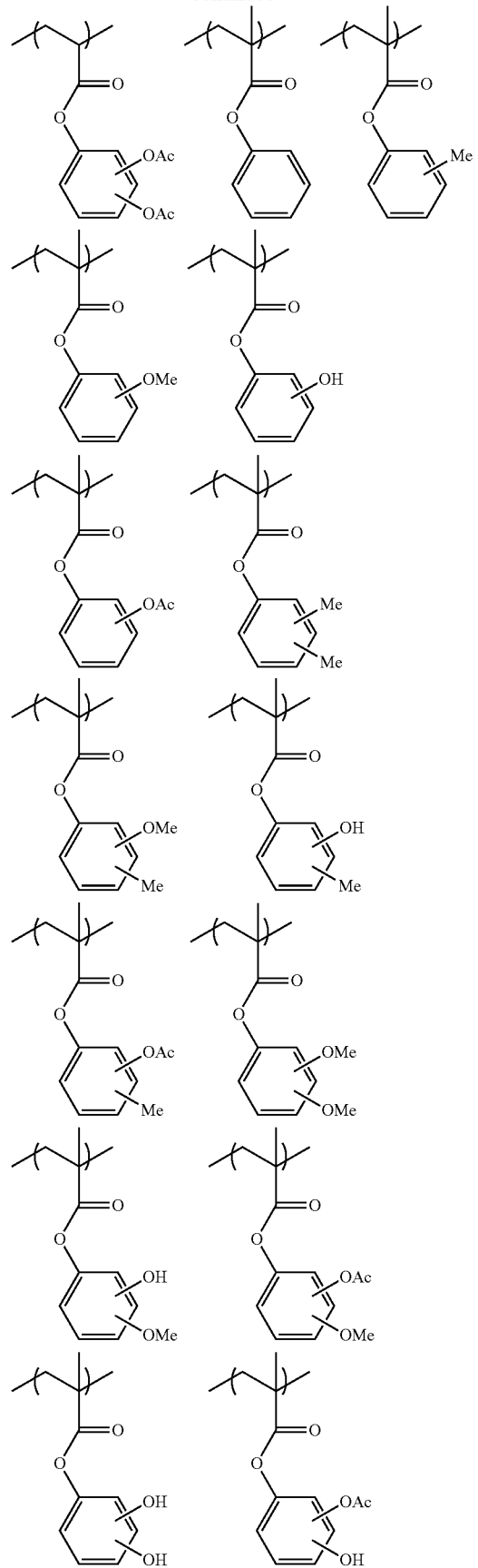
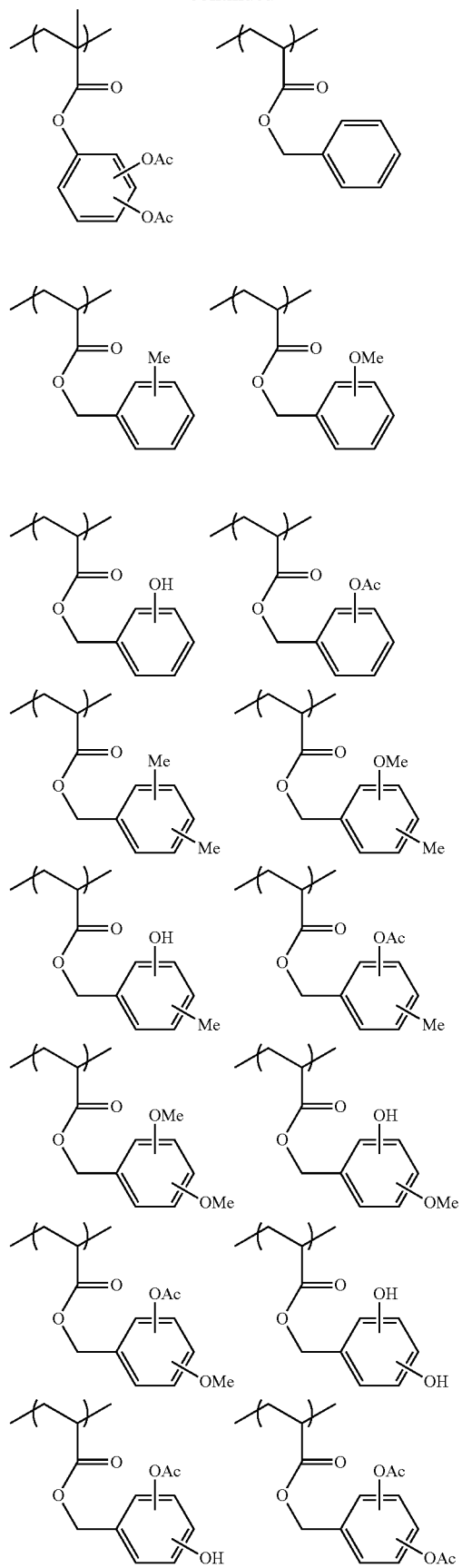

-continued

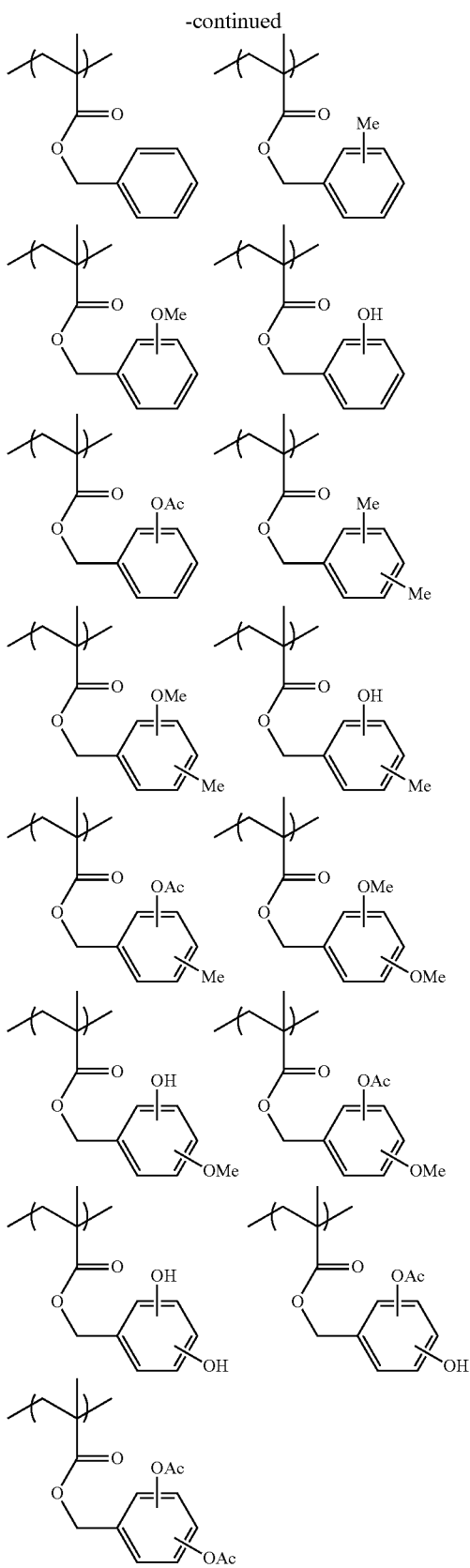

The silicon-containing polymer of the present invention is a polymer compound that contains one or more repeating units selected from the repeating units shown by the general formulae (1-1) and (1-2), and the repeating unit shown by the general formula (1-3) containing a hydrolysable silicon substituent, as essential units. Examples of such a polymer compound include copolymer (A-1) consisting of one or more repeating units selected from the repeating units shown by the general formulae (1-1) and (1-2), and the repeating unit shown by the general formula (1-3).

The copolymerization ratio is preferably $0.1 \leq (1\text{-}1)+(1\text{-}2) \leq 0.95$ and $0.05 \leq (1\text{-}3) \leq 0.9$. The ratio of (1-1) to (1-2) may be any ratio depending on intended properties, and either one may be contained alone in some cases.

In addition, the silicon-containing polymer of the present invention is preferably a polymer compound that further contains the repeating unit shown by the general formula (1-4) having an aromatic ring, as the partial structure. Examples of such a polymer compound include copolymer (A-2) consisting of one or more repeating units selected from the repeating units shown by the general formulae (1-1) and (1-2), the repeating unit shown by the general formula (1-3), and the repeating unit shown by the general formula (1-4).

The copolymerization ratio is preferably $0.1 \leq (1\text{-}1)+(1\text{-}2) \leq 0.95$, $0.05 \leq (1\text{-}3) \leq 0.9$, and $0.01 \leq (1\text{-}4) \leq 0.9$. The ratio of (1-1) to (1-2) may be any ratio depending on intended properties, and either one may be contained alone in some cases.

As example of the method for synthesizing the silicon-containing polymer (copolymer) of the present invention, there may be mentioned a thermal polymerization of an olefin monomer having a repeating unit capable of generating a phenolic hydroxyl group with an olefin monomer having a repeating unit containing a hydrolysable silicon substituent in the presence of a radical polymerization initiator or a cationic polymerization initiator in an organic solvent. Illustrative examples of the organic solvent used in the polymerization include toluene, benzene, tetrahydrofuran, diethyl ether, and dioxane. Illustrative examples of the radical polymerization initiator include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide, and the polymerization may be carried out by heating these reaction materials preferably at 50 to 80° C. Illustrative examples of the cationic polymerization initiator include acid such as sulfuric acid, phosphoric acid, hydrochloric acid, nitric acid, hypochlorous acid, trichloroacetic acid, trifluoroacetic acid, methane sulfonic acid, trifluoromethane sulfonic acid, camphor sulfonic acid, and tosic acid; a Friedel-Craft catalyst such as $BF_3$, $AlCl_3$, $TiCl_4$, and $SnCl_4$; and a substance easily generating a cation, such as $I_2$ and $(C_6H_5)_3CCl$.

[Silicon-Containing Compound]

The silicon-containing compound of the present invention can be obtained by hydrolysis or hydrolysis condensation of a single substance or a mixture of one or more silicon-containing polymers selected from the silicon-containing polymer of the present invention.

Among the above silicon-containing polymers, two or more polymers having different compositions, different molecular weights, different initiators, or different reaction conditions may be selected and subjected to co-hydrolysis condensation to produce another polymer (silicon-containing compound). For example, silicon-containing compound (A3) can be produced by selecting two or more polymers having different compositions, different molecular weights, different initiators, or different reaction conditions from the copolymers (A1) and (A2), and subjecting them to co-hydrolysis condensation.

[Method for Producing Silicon-Containing Compound]

The silicon-containing compound can be produced by hydrolysis or hydrolysis condensation of one or more silicon-containing polymers (hereinafter, referred to as hydrolysable material) of the present invention by using a substance that exhibits acidity or basicity in water as a catalyst.

(Synthesis Method 1: Acidic Catalyst)

The silicon-containing compound of the present invention can be synthesized by hydrolysis condensation of hydrolysable materials, using an acidic catalyst of one or more compounds selected from an inorganic acid, an organic carboxylic acid, an organic sulfonic acid, a carboxylic acid obtained by substituting one or more hydrogen atoms contained in the organic group with fluorine, and a sulfonic acid obtained by substituting one or more hydrogen atoms contained in the organic group with fluorine.

Illustrative examples of the acidic catalyst used in this case include hydrofluoric acid, hydrochloric acid, hydrobromic acid, nitric acid, sulfuric acid, perchloric acid, phosphoric acid, formic acid, acetic acid, oxalic acid, maleic acid, citric acid, trifluoroacetic acid, methanesulfonic acid, trifluoromethanesulfonic acid, benzenesulfonic acid, toluenesulfonic acid, and benzoic acid. The amount of the catalyst to be used is $1 \times 10^{-6}$ to 10 mol, preferably $1 \times 10^{-5}$ to 5 mol, more preferably $1 \times 10^{-4}$ to 1 mol per 1 mol of the hydrolysable material.

The amount of water to be added for obtaining a silicon-containing compound by hydrolysis condensation of these hydrolysable materials is preferably in the range of 0.01 to 100 mol, more preferably 0.05 to 50 mol, much more preferably 0.1 to 30 mol per 1 mol of the hydrolysable substituent bonded to the hydrolysable material. If the amount is 100 mol or less, a reaction device can be made small, resulting in economical.

In operation, for example, hydrolysable material is added to a catalyst aqueous solution to start hydrolysis condensation reaction. In this case, organic solvent may be added to the catalyst aqueous solution, or hydrolysable material may be diluted with the organic solvent, or both may be performed. The reaction temperature is preferably in the range of 0 to 100° C., more preferably 5 to 80° C. Preferable method is to maintain the reaction temperature in the range of 5 to 80° C. when the hydrolysable material are dropped, and then age the mixture at 20 to 80° C.

Preferable examples of the organic solvent that can be added to the catalyst aqueous solution or can dilute hydrolysable materials include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, 3-hydroxy-3-methyl-2-butanone, 3-acetyl-1-propanol, diacetone alcohol, ethyl lactate, 3-pentanol, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, and mixture thereof.

Among them, water-soluble solvent is preferable, and illustrative examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; tetrahydrofuran, etc. Particularly preferable is a solvent with a boiling point of 100° C. or less.

The amount of the organic solvent to be used is preferably in the range of 0 to 1,000 mL, and particularly preferably 0 to 500 mL, per 1 mol of the hydrolysable materials. Smaller amount of the organic solvent is more economical because a reaction device can be made small.

Then, if necessary, neutralization reaction of the catalyst is carried out to obtain a reaction mixture aqueous solution. The amount of an alkaline substance to be used for neutralization is preferably 0.1 to 2 equivalent, relative to the acid used as the catalyst. The alkaline substance may be any substance so long as it shows basicity in water.

Subsequently, it is preferable to remove, from the reaction mixture, by-products such as alcohol produced due to hydrolysis condensation by a procedure such as removal under reduced pressure. The temperature for heating the reaction mixture is preferably in the range of 0 to 100° C., more preferably 10 to 90° C., much more preferably 15 to 80° C., though it is depending on the kinds of the added organic solvent and an alcohol produced by the reaction. Degree of vacuum is preferably atmospheric pressure or less, more preferably 80 kPa or less in the absolute pressure, much more preferably 50 kPa or less in the absolute pressure, though it is depending on the kinds of the organic solvent and an alcohol to be removed, an exhausting equipment, and a condensation equipment, as well as heating temperature. In this case, although it is difficult to exactly examine the amount of the alcohol to be removed, it is preferable that about 80% by mass or more of a produced alcohol and so forth be removed.

Next, the acidic catalyst used in hydrolysis condensation reaction may be removed from the reaction mixture. For removing the acidic catalyst, there may be mentioned a method in which water is mixed with a silicon-containing compound, and the silicon-containing compound is extracted by an organic solvent. As the organic solvent to be used, solvents that can dissolve the silicon-containing compound and achieve two-layer separation by mixing with water is preferable. Illustrative examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc., and mixture thereof.

Moreover, mixture of water-soluble organic solvent and slightly water-soluble organic solvent can also be used. Preferable examples thereof include methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycol monomethyl ether+ethyl acetate mixture, ethylene glycol monomethyl ether+ethyl acetate mixture, butanediol monoethyl ether+ethyl acetate mixture, propylene glycol monoethyl ether+ethyl acetate mixture, ethylene glycol monoethyl ether+ethyl acetate mixture, butanediol monopropyl ether+ethyl acetate mixture, propylene glycol monopropyl ether+ethyl acetate mixture, ethylene glycol monopropyl ether+ethyl acetate mixture, methanol+methyl isobutyl ketone mixture, ethanol+methyl isobutyl ketone mixture, 1-propanol+methyl isobutyl ketone mixture, 2-propanol+methyl isobutyl ketone mixture, propylene glycol monomethyl ether+methyl isobutyl ketone mixture, ethylene glycol monomethyl ether+methyl isobutyl ketone mixture, propylene glycol monoethyl ether+methyl isobutyl ketone mixture, ethylene glycol monoethyl ether+methyl isobutyl ketone mixture, propylene glycol monopropyl ether+methyl isobutyl ketone mixture, ethylene glycol monopropyl ether+methyl isobutyl ketone mixture, methanol+cyclopentyl methyl ether mixture, ethanol+cyclopentyl methyl ether mixture, 1-propanol+cyclopentyl methyl ether mixture, 2-propanol+cyclopentyl methyl ether mixture, propylene glycol monomethyl ether+cyclopentyl methyl ether mixture, ethylene glycol monomethyl ether+cyclopentyl methyl ether mixture, propylene glycol monoethyl ether+cyclopentyl methyl ether mixture, ethylene glycol monoethyl ether+cyclopentyl methyl ether mixture, propylene glycol monopropyl ether+cyclopentyl methyl ether mixture, ethylene glycol monopropyl ether+cyclopentyl methyl ether mixture, methanol+propylene glycol methyl ether acetate mixture, ethanol+propylene glycol methyl ether acetate mixture, 1-propanol+propylene glycol methyl ether acetate mixture, 2-propanol+propylene glycol methyl ether acetate mixture, propylene glycol monomethyl ether+propylene glycol methyl ether acetate mixture, ethylene glycol monomethyl ether+propylene glycol methyl ether acetate mixture, propylene glycol monoethyl ether+propylene glycol methyl ether acetate mixture, ethylene glycol monoethyl ether+propylene glycol methyl ether acetate mixture, propylene glycol monopropyl ether+propylene glycol methyl ether acetate mixture, ethylene glycol monopropyl ether+propylene glycol methyl ether acetate mixture, etc., but are not restricted to combination of these mixtures.

The mixing ratio of the water-soluble organic solvent and the slightly water-soluble organic solvent is appropriately determined. The amount of the water-soluble organic solvent is preferably in the range of 0.1 to 1,000 parts by mass, more preferably 1 to 500 parts by mass, much more preferably 2 to 100 parts by mass, based on 100 parts by mass of the slightly water-soluble organic solvent.

Subsequently, the reaction mixture may be washed with neutral water. The neutral water may be water called deionized water or ultrapure water. The amount of the water is preferably in the range of 0.01 to 100 L, more preferably 0.05 to 50 L, much more preferably 0.1 to 5 L per 1 L of the silicon-containing compound solution. The washing may be performed by putting both the reaction mixture and water into the same container, stirring them, and then leaving to stand to separate a water layer. The number of washing may be 1 time or more, and preferably about 1 to 5 times because washing of 10 times or more is not worth to have full effects thereof.

Other methods for removing the acidic catalyst include a method using an ion-exchange resin and a method for removing the acidic catalyst after neutralization with an epoxy compound such as ethylene oxide and propylene oxide. These methods can be appropriately selected depending on the acidic catalyst used in the reaction.

In this water-washing operation, the number of washing and the amount of water for washing may be appropriately determined in view of effects of catalyst removal and fractionation because there is a case that a part of the silicon-containing compound escapes into a water layer, thereby substantially the same effect as fractionation operation is obtained.

A final solvent is then added to the silicon-containing compound solution in either case that the acidic catalyst remains therein or has been removed therefrom, and solvent-exchange is performed under reduced pressure to obtain a desired silicon-containing compound solution. The temperature during the solvent-exchange is preferably in the range of 0 to 100° C., more preferably 10 to 90° C., much more preferably 15 to 80° C. though it is depending on the kinds of the reaction solvent and the extraction solvent to be removed. Degree of vacuum in this operation is preferably atmospheric pressure or less, more preferably 80 kPa or less in the absolute pressure, much more preferably 50 kPa or less in the absolute pressure though it is depending on the kinds of the solvents to be removed, an exhausting equipment, condensation equipment, and heating temperature.

In this operation, sometimes the silicon-containing compound may become unstable by solvent-exchange. This occurs due to incompatibility of the silicon-containing compound with the final solvent. Thus, in order to prevent this problem, a monohydric, dihydric, or polyhydric alcohol having cyclic ether substituent, described in paragraphs (0181) to (0182) of Japanese Patent Laid-Open Publication No. 2009-126940 may be added thereto as a stabilizer. The adding amount thereof is preferably in the range of 0 to 25 parts by mass, more preferably 0 to 15 parts by mass, much more preferably 0 to 5 parts by mass, or 0.5 parts by mass or more when it is added, based on 100 parts by mass of the silicon-containing compound contained in the solution before the solvent-exchange. If necessary, a monohydric, dihydric, or polyhydric alcohol having cyclic ether substituent may be added to the solution before the solvent-exchange operation.

There is a fear that condensation reaction of the silicon-containing compound progresses when the compound is concentrated above a certain concentration level, thereby becoming insoluble into an organic solvent. Thus, it is desirable to maintain the solution state with a proper concentration. If the concentration thereof is too dilute, the amount of the solvent becomes excessively large; and thus, the solution state with a proper concentration is desirable in view of economy. Preferable concentration at this time is 0.1 to 50% by mass.

Preferable final solvent added to the silicon-containing compound solution is a solvent having a hydroxyl group, particularly a monoalkyl ether derivative of ethylene glycol, diethylene glycol, triethylene glycol, propylene glycol, dipropylene glycol, butanediol, etc. Illustrative examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, 3-hydroxy-3-methyl-2-butanone, 3-acetyl-1-propanol, diacetone alcohol, ethyl lactate, 3-pentanol, 4-methyl-2-pentanol, etc.

In addition, if these solvents are used as a main solvent, a solvent having no hydroxyl group may be added thereinto as an adjuvant solvent. Illustrative examples of this adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc.

As an alternative operation, water or a water-containing organic solvent may be added to the hydrolysable materials or an organic solution of the hydrolysable materials to start hydrolysis reaction. In this operation, the catalyst may be added to the hydrolysable materials or the organic solution of the hydrolysable materials, or may be added to the water or the water-containing organic solvent. The reaction temperature is preferably in the range of 0 to 100° C., and more preferably 10 to 80° C. Preferable method is that the mixture is heated at 10 to 50° C. while adding dropwise water, and then further heated at 20 to 80° C. to age the mixture.

As the organic solvent, water-soluble solvent is preferable, and illustrative examples thereof include methanol, ethanol, 1-propanol, 2-propanol, 1-butanol, 2-butanol, 2-methyl-1-propanol, acetone, tetrahydrofuran, acetonitrile, polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, etc., and a mixture thereof.

The amount of the organic solvent to be used is preferably in the range of 0 to 1,000 mL, and particularly preferably 0 to 500 mL, per 1 mol of the hydrolysable materials. Smaller amount of the organic solvent is more economical because a reaction device can be made small. Subsequently, the obtained reaction mixture may be treated in the same manner as mentioned above to obtain a silicon-containing compound.

(Synthesis Method 2: Alkaline Catalyst)

In addition, the silicon-containing compound can be produced by hydrolysis condensation reaction of hydrolysable materials in the presence of an alkaline catalyst. Illustrative examples of the alkaline catalyst to be used in the reaction include methylamine, ethylamine, propylamine, butylamine, ethylene diamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclononene, diazabicycloundecene, hexamethylene tetramine, aniline, N,N-dimethylaniline, pyridine, N,N-dimethylaminopyridine, pyrrole, piperazine, pyrrolidine, piperidine, picoline, tetramethylammonium hydroxide, corrin hydroxide, tetrapropylammonium hydroxide, tetrabutylammonium hydroxide, ammonia, lithium hydroxide, sodium hydroxide, potassium hydroxide, barium hydroxide, and calcium hydroxide. The amount of the catalyst to be used is preferably $1 \times 10^{-6}$ to 10 mol, more preferably $1 \times 10^{-5}$ to 5 mol, much more preferably $1 \times 10^{-4}$ to 1 mol per 1 mol of the hydrolysable materials.

The amount of water to be added for obtaining a silicon-containing compound by hydrolysis condensation of these hydrolysable materials is preferably in the range of 0.1 to 50 mol per 1 mol of the hydrolysable substituent bonded to the hydrolysable material. If the amount is 50 mol or less, a reaction device can be made small, resulting in economical.

In operation, for example, the hydrolysable material is added to a catalyst aqueous solution to start hydrolysis condensation reaction. In this case, organic solvent may be added to the catalyst aqueous solution, or hydrolysable material may be diluted with the organic solvent, or both may be performed. The reaction temperature is preferably in the range of 0 to 100° C., more preferably 5 to 80° C. Preferable method is to maintain the reaction temperature in the range of 5 to 80° C. when the hydrolysable material are dropped, and then age the mixture at 20 to 80° C.

As the organic solvent that can be added to the aqueous alkaline catalyst solution or can dilute the hydrolysable materials, the same organic solvents as those exemplified as the example that can be added to the acidic catalyst aqueous solution, may be used preferably. The amount of the organic solvent to be used is preferably 0 to 1,000 mL per 1 mol of the hydrolysable materials since the reaction can be performed economically.

Then, if necessary, neutralization reaction of the catalyst is carried out to obtain a reaction mixture aqueous solution. The amount of an acidic substance to be used for neutralization is preferably 0.1 to 2 equivalent, relative to the alkaline substance used as the catalyst. The acidic substance may be any substance so long as it shows acidity in water.

Subsequently, it is preferable to remove, from the reaction mixture, by-products such as alcohol produced due to hydrolysis condensation by a procedure such as removal under reduced pressure. The temperature for heating the reaction mixture is preferably in the range of 0 to 100° C., more preferably 10 to 90° C., much more preferably 15 to 80° C., though it is depending on the kinds of the added organic solvent and an alcohol produced by the reaction. Degree of vacuum is preferably atmospheric pressure or less, more preferably 80 kPa or less in the absolute pressure, much more preferably 50 kPa or less in the absolute pressure, though it is depending on the kinds of the organic solvent and an alcohol to be removed, an exhausting equipment, and a condensation equipment, as well as heating temperature. In this case, although it is difficult to exactly examine the amount of the alcohol to be removed, it is preferable that about 80% by mass or more of a produced alcohol and so forth be removed.

Then, for removing the alkaline catalyst used in hydrolysis condensation reaction, the silicon-containing compound is extracted by an organic solvent. As the organic solvent to be used, solvents that can dissolve the silicon-containing compound and achieve two-layer separation by mixing with water is preferable. Further, a mixture of water-soluble organic solvent and slightly water-soluble organic solvent can also be used.

Illustrative examples of the organic solvent used for removing the alkaline catalyst include the organic solvents and the mixture of water-soluble organic solvent and slightly water-soluble organic solvent used for removing the acidic catalyst as exemplified above.

The mixing ratio of the water-soluble organic solvent and the slightly water-soluble organic solvent is appropriately determined. The amount of the water-soluble organic solvent is preferably in the range of 0.1 to 1,000 parts by mass, more preferably 1 to 500 parts by mass, much more preferably 2 to 100 parts by mass, based on 100 parts by mass of the slightly water-soluble organic solvent.

Subsequently, the reaction mixture may be washed with neutral water. The neutral water may be water called deionized water or ultrapure water. The amount of the water is preferably in the range of 0.01 to 100 L, more preferably 0.05 to 50 L, much more preferably 0.1 to 5 L per 1 L of the silicon-containing compound solution. The washing may be performed by putting both the reaction mixture and water into the same container, stirring them, and then leaving to stand to separate a water layer. The number of washing may be 1 time or more, and preferably about 1 to 5 times because washing of 10 times or more is not worth to have full effects thereof.

A final solvent is then added to the silicon-containing compound solution in either case that the alkaline catalyst remains therein or has been removed therefrom, and solvent-exchange is performed under reduced pressure to obtain a desired silicon-containing compound solution. The temperature during the solvent-exchange is preferably in the range of 0 to 100° C., more preferably 10 to 90° C., much more preferably 15 to 80° C. though it is depending on the kinds of the extraction solvent to be removed. Degree of vacuum in this operation is preferably atmospheric pressure or less, more preferably 80 kPa or less in the absolute pressure, much more preferably 50 kPa or less in the absolute pressure though it is depending on the kinds of the solvents to be removed, an exhausting equipment, condensation equipment, and heating temperature.

At this time, a monohydric, dihydric, or polyhydric alcohol having cyclic ether substituent may be added as a stabilizer similarly to the case where the acidic catalyst is used. The concentration of the silicon-containing compound solution may be the same as in the case where the acidic catalyst is used.

Preferable final solvent added to the silicon-containing compound solution is a solvent having a hydroxyl group, and the same solvent may be used as exemplified in the case where the acidic catalyst is used.

As an alternative operation using an alkaline catalyst, water or a water-containing organic solvent may be added to the hydrolysable materials or an organic solution of the hydrolysable materials to start hydrolysis reaction. In this operation, the catalyst may be added to the hydrolysable materials or the organic solution of the hydrolysable materials, or may be added to the water or the water-containing organic solvent. The reaction temperature is preferably in the range of 0 to 100° C., and more preferably 10 to 80° C. Preferable method is that the mixture is heated at 10 to 50° C. while adding dropwise water, and then further heated at 20 to 80° C. to age the mixture.

As the organic solvent, water-soluble solvent is preferable, and illustrative examples thereof include methanol, ethanol, 1-propanol, 2-propanol, 1-butanol, 2-butanol, 2-methyl-1-propanol, acetone, tetrahydrofuran, acetonitrile, polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, etc., and a mixture thereof.

The molecular weight of the silicon-containing compound obtained by the above synthesis method 1 or 2 can be adjusted not only by selecting hydrolysable materials, but also controlling reaction conditions during condensation. The molecular weight of the obtained silicon-containing compound is not particularly restricted, but the weight average molecular weight of the polymer is preferably 100,000 or less, more preferably in the range of 200 to 50,000, and much more preferably 300 to 30,000. If the weight average molecular weight is 100,000 or less, generation of foreign matters and coating spots can be suppressed. Meanwhile, the above weight average molecular weight is obtained as data, in terms of polystyrene by means of gel-permeation chromatography (GPC) using polystyrene as a reference material, refractive index (RI) detector as a detector, and tetrahydrofuran as an eluent.

Further, another silicon-containing compound may be obtained by hydrolysis or hydrolysis condensation of a mixture containing one or more of the silicon-containing polymers and the silicon-containing compounds of the present invention, and one or more hydrolysable silicon compounds shown by the general formula (2)

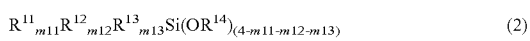

$$R^{11}{}_{m11}R^{12}{}_{m12}R^{13}{}_{m13}Si(OR^{14})_{(4-m11-m12-m13)} \qquad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and $0 \leq m11+m12+m13 \leq 3$.

For example, silicon-containing compound (A4) can be produced by hydrolysis or hydrolysis condensation of a mixture containing one or more of the compounds (A1), (A2), and (A3), and one or more hydrolysable silicon compounds shown by the general formula (2). This silicon-containing compound can be produced by the same method for producing the silicon-containing compound mentioned above.

Examples of the compound shown by the general formula (2) include tetramethoxy silane, tetraethoxy silane, tetrapropoxy silane, tetraisopropoxy silane, trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, sec-butyl trimethoxy silane, sec-butyl triethoxy silane, sec-butyl tripropoxy silane, sec-butyl triisopropoxy silane, tert-butyl trimethoxy silane, tert-butyl triethoxy silane, tert-butyl tripropoxy silane, tert-butyl triisopropoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctyl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantyl trimethoxy silane, adamantyl triethoxy silane, adamantyl tripropoxy silane, adamantyl triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, tolyl trimethoxy silane, tolyl triethoxy silane, tolyl tripropoxy silane, tolyl triisopropoxy silane, anisyl trimethoxy silane, anisyl triethoxy silane, anisyl tripropoxy silane, anisyl triisopropoxy silane, phenethyl trimethoxy silane, phenethyl triethoxy silane, phenethyl tripropoxy silane, phenethyl triisopropoxy silane, benzoyloxymethyl trimethoxy silane, benzoyloxyethyl trimethoxy silane, benzoyloxypropyl trimethoxy silane, benzoyloxymethyl triethoxy silane, benzoyloxyethyl triethoxy silane, benzoyloxypropyl triethoxy silane, benzoyloxymethyl tripropoxy silane, benzoyloxyethyl tripropoxy silane, benzoyloxypropyl tripropoxy silane, phenylacetoxymethyl trimethoxy silane, phenylacetoxyethyl trimethoxy silane, phenylacetoxypropyl trimethoxy silane, phenylacetoxymethyl triethoxy silane, phenylacetoxyethyl triethoxy silane, phenylacetoxypropyl triethoxy silane, phenylacetoxymethyl tripropoxy silane, phenylacetoxyethyl tripropoxy silane, phenylacetoxypropyl tripropoxy silane, toluylacetoxymethyl trimethoxy silane, toluylacetoxyethyl trimethoxy silane, toluylacetoxypropyl trimethoxy silane, toluylacetoxymethyl triethoxy silane, toluylacetoxyethyl triethoxy silane, toluylacetoxypropyl triethoxy silane, toluylacetoxymethyl tripropoxy silane, toluylacetoxyethyl tripropoxy silane, toluylacetoxypropyl tripropoxy silane, hydrocinnamoyloxymethyl trimethoxy silane, hydrocinnamoyloxyethyl trimethoxy silane, hydrocinnamoyloxypropyl trimethoxy silane, hydrocinnamoyloxymethyl triethoxy silane, hydrocinnamoyloxyethyl triethoxy silane, hydrocinnamoyloxypropyl triethoxy silane, hydrocinnamoyloxymethyl tripropoxy silane, hydrocinnamoyloxyethyl tripropoxy silane, hydrocinnamoyloxypropyl tripropoxy silane, 2-phenylpropionyloxymethyl trimethoxy silane, 2-phenylpropionyloxyethyl trimethoxy silane, 2-phenylpropionyloxypropyl trimethoxy silane, 2-phenylpropionyloxymethyl triethoxy silane, 2-phenylpropionyloxyethyl triethoxy silane, 2-phenylpropionyloxypropyl triethoxy silane, 2-phenylpropionyloxymethyl tripropoxy silane, 2-phenylpropionyloxyethyl tripropoxy silane, 2-phenylpropionyloxypropyl tripropoxy silane, naphthyl trimethoxy silane, naphthyl triethoxy silane, naphthyl tripropoxy silane, naphthyl triisopropoxy silane, dimethyl dimethoxy silane, dimethyl diethoxy silane, methylethyl dimethoxy silane, methylethyl diethoxy silane, dimethyl dipropoxy silane, dimethyl diisopropoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-sec-butyl dimethoxy silane, di-sec-butyl diethoxy silane, di-sec-butyl dipropoxy silane, di-sec-butyl diisopropoxy silane, di-tert-butyl dimethoxy silane, di-tert-butyl diethoxy silane, di-tert-butyl dipropoxy silane, di-tert-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bisbicycloheptenyl dimethoxy silane, bisbicycloheptenyl diethoxy silane, bisbicycloheptenyl dipropoxy silane, bisbicycloheptenyl diisopropoxy silane, bisbicycloheptyl dimethoxy silane, bisbicycloheptyl diethoxy silane, bisbicycloheptyl dipropoxy silane, bisbicycloheptyl diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methylphenyl dimethoxy silane, methylphenyl diethoxy silane, diphenyl dipropoxy silane, diphenyl diisopropoxy silane, trimethyl methoxy silane, trimethyl ethoxy silane, dimethylethyl methoxy silane, dimethylethyl ethoxy silane, dimethylphenyl methoxy silane, dimethylphenyl ethoxy silane, dimethylbenzyl methoxy silane, dimethylbenzyl ethoxy silane, dimethylphenethyl methoxy silane, and dimethylphenethyl ethoxy silane.

Among them, preferable examples include tetramethoxy silane, tetraethoxy silane, methyltrimethoxy silane, methyl triethoxy silane, ethyl trimethoxy silane, ethyl triethoxy silane, vinyl trimethoxy silane, vinyl triethoxy silane, propyl trimethoxy silane, propyl triethoxy silane, isopropyl trimethoxy silane, isopropyl triethoxy silane, butyl trimethoxy silane, butyl triethoxy silane, isobutyl trimethoxy silane, isobutyl triethoxy silane, allyl trimethoxy silane, allyl triethoxy silane, cyclopentyl trimethoxy silane, cyclopentyl triethoxy silane, cyclohexyl trimethoxy silane, cyclohexyl triethoxy silane, cyclohexenyl trimethoxy silane, cyclohexenyl triethoxy silane, phenyl trimethoxy silane, phenyl triethoxy silane, benzyl trimethoxy silane, benzyl triethoxy silane, tolyl trimethoxy silane, tolyl triethoxy silane, anisyl trimethoxy silane, anisyl triethoxy silane, phenethyl trimethoxy silane, phenethyl triethoxy silane, phenylacetoxymethyl trimethoxy silane, phenylacetoxymethyl triethoxy silane, dimethyl dimethoxy silane, dimethyl diethoxy silane, diethyl dimethoxy silane, diethyl diethoxy silane, methylethyl dimethoxy silane, methylethyl diethoxysilane, dipropyl dimethoxy silane, dibutyl dimethoxy silane, methylphenyl dimethoxy silane, methylphenyl diethoxy silane, trimethyl methoxy silane, dimethylethyl methoxy silane, dimethylphenyl methoxy silane, dimethylbenzyl methoxy silane, and dimethylphenethyl methoxy silane.

[Composition for Forming a Silicon-Containing Resist Under Layer Film]

In addition, the present invention provides a composition for forming a silicon-containing resist under layer film that contains component (A): one or more of the silicon-containing polymer and the silicon-containing compound mentioned above, as a base polymer.

In addition to the component (A), the composition for forming a silicon-containing resist under layer film of the present invention preferably contains, as a base polymer, component (B): a silicon-containing compound (B1) obtained by hydrolysis or hydrolysis condensation of one or more hydrolysable silicon compounds shown by the general formula (2), $$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and 0≤m11+m12+m13≤3.

Alternatively, the composition preferably contains, as a base polymer, component (B): a silicon-containing compound (B2) obtained by hydrolysis or hydrolysis condensation of a mixture containing one or more hydrolysable silicon compounds shown by the general formula (2) and one or more of the silicon-containing polymers and the silicon-containing compounds of the present invention, provided that the component (B2) is different from the silicon-containing compound used as the component (A). Examples of the component (B) include the same as the silicon-containing compound (A4).

Examples of the hydrolysable silicon compounds shown by the general formula (2) are as exemplified above.

Incidentally, the component (B) can be produced by the same method for producing the silicon-containing compound mentioned above.

In the composition for forming a silicon-containing resist under layer film of the present invention, a mass ratio between the component (A) and the component (B) is preferably (B)≥(A). By using the silicon-containing polymer or the silicon-containing compound of the present invention with an appropriate mass ratio and with an appropriate compound, it is possible to obtain a composition capable of forming a resist under layer film having not only excellent etching selectivity and pattern adhesiveness but also patterning properties stable in both negative development and positive development.

[Other Components]
(Thermal Crosslinking Accelerator)

In the present invention, a thermal crosslinking accelerator may be blended to the composition for forming a silicon-containing resist under layer film. As the blendable thermal crosslinking accelerator, there may be mentioned compounds shown by the general formula (3) or (4), $$L_aH_bX \quad (3)$$

wherein L represents lithium, sodium, potassium, rubidium, or cesium; X represents a hydroxyl group or a monovalent, divalent, or more polyvalent organic acid group having 1 to 30 carbon atoms; "a" represents an integer of 1 or more, "b" represents 0 or an integer of 1 or more, and a+b represents a valency of the hydroxyl group or the organic acid group, $$MY \quad (4)$$

wherein M represents sulfonium ion, iodonium ion, phosphonium ion, or ammonium ion; and Y represents a non-nucleophilic counter ion.

Illustrative examples of Y include hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-tert-butylbenzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, methanesulfonate ion, sulfate ion, hydrogen sulfate ion, methyl sulfate ion, benzenesulfonate ion, toluenesulfonate ion, and tetraphenylborate ion.

Illustrative examples of the compound shown by the general formula (3) or (4) are described in Japanese Patent Application Publication No. 2010-262230 and No. 2014-141585.

The thermal crosslinking accelerators can be used solely or in combination of two or more kinds. The adding amount of the thermal crosslinking accelerator is preferably 0.01 to 50 parts by mass, more preferably 0.1 to 40 parts by mass, based on 100 parts by mass of the base polymer (i.e., the total of the components (A) and (B)).

(Organic Acid)

To improve stability of the composition for forming a silicon-containing resist under layer film of the present invention, a monovalent, divalent, or more polyvalent organic acid having 1 to 30 carbon atoms is preferably added. Examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichioroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Especially, oxalic acid, maleic acid, formic acid, acetic acid, propionic acid, citric acid, etc., are preferable. Moreover, two or more organic acids may be used to keep stability. The adding amount thereof is preferably 0.001 to 25 parts by mass, more preferably 0.01 to 15 parts by mass, much more preferably 0.1 to 5 parts by mass, based on 100 parts by mass of silicon atoms contained in the composition.

Otherwise, the organic acid is preferably added such that pH of the composition satisfies 0≤pH≤7, more preferably 0.3≤pH≤6.5, much more preferably 0.5≤pH≤6.

(Water)

Into the composition of the present invention, water may be added. When water is added, the silicon-containing polymer or the silicon-containing compound is hydrated, so that lithography performance is improved. The amount of water in the solvent component of the composition is preferably more than 0% by mass and less than 50% by mass, more preferably 0.3 to 30% by mass, much more preferably 0.5 to 20% by mass. If the amount is in such a range, uniformity of a silicon-containing resist under layer film becomes excellent, and eye holes can be suppressed. In addition, lithography performance is improved.

The amount of the total solvent including water is preferably 100 to 100,000 parts by mass, particularly 200 to 50,000 parts by mass, based on 100 parts by mass of the base polymer (the total of the components (A) and (B)).

(Photo-Acid Generator)

Into the composition of the present invention, a photo-acid generator may be added. Illustrative examples of the photo-acid generator to be used in the present invention include a material described in paragraphs (0160) to (0179) of Japanese Patent Laid-Open Publication No. 2009-126940.

(Stabilizer)

Further, into the composition of the present invention, a stabilizer may be added. As the stabilizer, a monohydric, dihydric, or polyhydric alcohol having cyclic ether substituent may be added. In particular, when a stabilizer described in paragraphs (0181) to (0184) of Japanese Patent Laid-Open Publication No. 2009-126940 is added, stability of the composition for forming a silicon-containing resist under layer film can be improved.

(Surfactant)

Furthermore, a surfactant may be added to the composition of the present invention, if necessary. Illustrative examples of the surfactant include materials described in paragraph (0185) of Japanese Patent Laid-Open Publication No. 2009-126940.

As mentioned above, when the inventive composition for forming a silicon-containing resist under layer film is used, a resist under layer film having excellent pattern adhesiveness and high etching selectivity can be formed in both positive development and negative development.

[Negative Patterning Process]

(Negative Patterning Process 1)

The present invention provides a patterning process including: forming an organic under layer film on a body to be processed by using a coating-type organic under layer film material; forming a silicon-containing resist under layer film on the organic under layer film by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an unexposed part of the photoresist film by using an organic solvent as a developer to form a negative pattern; transferring the pattern to the silicon-containing resist under layer film by dry etching using the photoresist film having the negative pattern thus formed as a mask; transferring the pattern to the organic under layer film by dry etching using the silicon-containing resist under layer film having the transferred pattern as a mask; and further transferring the pattern to the body to be processed by dry etching using the organic under layer film having the transferred pattern as a mask (so-called "multilayer resist method").

(Negative Patterning Process 2)

In addition, the present invention provides a patterning process comprising: forming a hard mask mainly consisting of carbon on a body to be processed by a CVD method; forming a silicon-containing resist under layer film on the CVD hard mask by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an unexposed part of the photoresist film by using an organic solvent as a developer to form a negative pattern; transferring the pattern to the silicon-containing resist under layer film by dry etching using the photoresist film having the negative pattern thus formed as a mask; transferring the pattern to the CVD hard mask by dry etching using the silicon-containing resist under layer film having the transferred pattern as a mask; and further transferring the pattern to the body to be processed by dry etching using the CVD hard mask having the transferred pattern as a mask.

When a negative pattern is formed by using a resist under layer film formed from the composition for forming a silicon-containing resist under layer film of the present invention, the pattern formed in the photoresist can be transferred to the substrate without generating the difference in size conversion, by optimizing the combination of the CVD film or the organic under layer film, as mentioned above.

The body to be processed used in the process may be a semiconductor apparatus substrate or a material in which any of a metal film, a metal carbide film, a metal oxide film, a metal nitride film, a metal oxycarbide film, and a metal oxynitride film is formed as a layer to be processed (a portion to be processed) on the semiconductor apparatus substrate.

As the semiconductor substrate, a silicon substrate is generally used, but it is not particularly limited thereto; a material such as Si, amorphous silicon (α-Si), p-Si, $SiO_2$, SiN, SiON, W, TiN, Al, etc., and a different material from the layer to be processed may be used.

The metal of the body to be processed may be silicon, titanium, tungsten, hafnium, zirconium, chromium, germanium, copper, aluminum, indium, gallium, arsenic, palladium, iron, tantalum, iridium, molybdenum, or an alloy thereof. The layer to be processed may be made of Si, $SiO_2$, SiN, SiON, SiOC, p-Si, α-Si, TiN, WSi, BPSG, SOG, Cr, CrO, CrON, MoSi, W, Al, Cu, Al—Si, or the like; various low dielectric constant (low-k) films, or etching stopper film thereof. The layer is generally formed with a thickness of 50 to 10,000 nm, particularly 100 to 5,000 nm.

As to the usable organic under layer film, there may be mentioned a material conventionally known as the resist under layer film for 3-layer resist method or 2-layer resist method using a silicon resist composition. Examples of the material for forming an organic under layer film include numerous resins known as the resist under layer film material for the 2-layer resist method or the 3-layer resist method, such as 4,4'-(9-fluorenylidene)bisphenol novolak resin (molecular weight: 11,000) described in Japanese Patent Laid-Open Publication No. 2005-128509, and novolak a resin obtained by condensation of formaldehyde with catechol, resorcinol, 4,4'-biphenol, 1,5-dihydroxynaphthol, 1,6-dihydroxynaphthol, 1,7-dihydroxynaphthol, 2,6-dihydroxynaphthol, or 2,7-dihydroxynaphthol, by using an acidic catalyst or an alkaline catalyst. In the case that higher heat resistance than a usual novolak is wanted, a polycyclic skeleton may be introduced like 6,6'-(9-fluorenylidene)-di(2-naphthol) novolak resin. Further, a polyimide resin may be selected as described in Japanese Patent Laid-Open Publication No. 2004-153125.

Particularly preferable resin for an organic under layer film is a resin having a naphthalene skeleton. Examples thereof include a condensation resin of formaldehyde with 1,5-dihydroxynaphthol, 1,6-dihydroxynaphthol, 1,7-dihydroxynaphthol, 2,6-dihydroxynaphthol, or 2,7-dihydroxynaphthol, and 6,6'-(9-fluorenylidene)-di(2-naphthol) novolak resin.

The organic under layer film can be formed on a body to be processed by spin coating or the like using a composition solution, similar to the photoresist film. After forming the organic under layer film by spin coating, it is desirable to bake it to evaporate the organic solvent therefrom. The baking temperature is preferably in the range of 80 to 600° C., and the baking time is preferably in the range of 10 to 300 seconds.

When a condensation resin of formaldehyde with 1,5-dihydroxynaphthol, 1,6-dihydroxynaphthol, 1,7-dihydroxynaphthol, 2,6-dihydroxynaphthol, or 2,7-dihydroxynaphthol is used as the resin for the organic under layer film, the baking temperature is preferably in the range of 80 to 400° C. When 6,6'-(9-fluorenylidene)-di(2-naphthol) novolak resin is used, the baking temperature is preferably in the range of 80 to 600° C.

The thickness of the organic under layer film is preferably 5 nm or more, particularly preferably 20 nm or more and 50,000 nm or less although it is not limited thereto and depends on the etching condition. The thickness of the silicon-containing resist under layer film in the present invention is preferably 1 nm or more and 500 nm or less, more preferably 300 nm or less, much more preferably 200 nm or less. The thickness of the photoresist film is preferably 1 nm or more and 200 nm or less.

The silicon-containing resist under layer film used in the patterning process of the present invention can be formed on a body to be processed by spin coating, etc., similarly to the photoresist film, by using the composition for forming a silicon-containing resist under layer film of the present invention. After spin coating, it is desired to bake it to evaporate the solvent, prevent from mixing with the photoresist film, and promote the crosslinking reaction. The baking temperature is preferably in the range of 50 to 500° C., and the heating time is preferably in the range of 10 to 300 seconds. Particularly preferable temperature range is 400° C. or less for reducing heat damage to the devices, though it is depending on the structure of the devices to be fabricated.

In the negative patterning process of the present invention, the resist composition for forming the photoresist film is not particularly limited so long as it is a chemical amplified resist composition, and can form a negative pattern by development using a developer consisting of an organic solvent.

For example, if the exposing step in the present invention is carried out by an exposure process using an ArF excimer laser beam, any resist composition used for a usual ArF excimer laser beam can be used as the resist composition.

As the resist composition for ArF excimer laser beam, many candidates have been well-known. When the well-known resins are roughly classified, there are a poly(meth)acryl type, a COMA (Cycloolefin Maleic Anhydride) type, a COMA-(meth)acrylic hybrid type, a ROMP (Ring Opening Metathesis Polymerization) series, and a polynorbornene type material, etc. Among them, the resist composition using the poly(meth)acryl type resin secures its etching resistance by introducing an alicyclic skeletal structure at the side chain, so that it is excellent in resolution property as compared with the other resin type, therefore it is preferably used.

In the negative patterning process, after the silicon-containing resist under layer film is formed, the photoresist film is formed thereon by using a photoresist composition solution. The film formation is preferably performed by spin coating, similarly to the silicon-containing resist under layer film. After the resist composition is applied by spin coating, pre-baking is carried out, preferably at 80 to 180° C. for 10 to 300 seconds. Then, exposure is performed, followed by organic solvent development to obtain a negative resist pattern. In addition, it is preferable to perform post-exposure baking (PEB) after the exposure.

As the developer of the organic solvent, it is possible to use a developer containing one or more components selected from: 4-methyl-2-pentanol, 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxy-isobutyrate, ethyl 2-hydroxy-isobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and acetic acid 2-phenylethyl. The total amount of one or more components in the developer is preferably 50% by mass or more in view of improvement of pattern collapse.

In the patterning process of the present invention, when the silicon-containing resist under layer film is used as an etching mask, the etching is preferably carried out by using a gas mainly consisting of fluorine-containing gas such as Freon gas. In order to reduce film loss of the photoresist film, the silicon-containing resist under layer film preferably has a high etching speed relative to the gas.

[Negative Patterning Process of the Present Invention According to 3-Layer Resist Method]

In the following, the negative patterning process of the present invention will be described more specifically by referring to FIG. 1 (I-A) to (I-I), but the present invention is not limited thereto. In this process, first, an organic under layer film 2 is formed on a body to be processed 1 by spin coating (FIG. 1 (I-A)). It is desired that the organic under layer film 2 have high etching resistance because this film acts as a mask during etching of the body to be processed 1; and it is also desired that the film is crosslinked by heat or acid after formed by spin coating because mixing with the silicon-containing resist under layer film at the upper layer is undesirable.

Then, a silicon-containing resist under layer film 3 is formed thereon by spin coating using the composition for forming a silicon-containing resist under layer film of the present invention (FIG. 1 (I-B)), and a photoresist film 4 is formed thereon by spin coating (FIG. 1 (I-C)). Meanwhile, it is preferable to form the silicon-containing resist under layer film 3 by using a composition giving the silicon-containing resist under layer film 3 whose contact angle with pure water in a part corresponding to an exposed part of the photoresist film 4 is 20 degrees or more and less than 70 degrees after exposure.

The photoresist film 4 is subjected to a usual pattern exposure, through a mask 5, by using a light source P corresponding to the photoresist film 4, such as KrF excimer laser beam, ArF excimer laser beam, $F_2$ laser beam, and EUV beam to form a pattern, preferably by any of a photolithography with a wavelength of 10 to 300 nm, a direct drawing by electron beam, and a nanoimprinting, or a combination thereof (FIG. 1 (I-D)). Thereafter, heat treatment under a condition matching with the photoresist film (FIG. 1 (I-E)), development by an organic solvent developer (negative development), and if necessary, rinsing are performed to obtain a negative resist pattern 4a (FIG. 1 (I-F)).

Then, using this negative resist pattern 4a as an etching mask, dry etching is carried out under a dry etching condition where the etching speed of the silicon-containing resist under layer film 3 is significantly higher than the photoresist film, for example, with fluorine-based gas plasma. As a result, a silicon-containing resist under layer film pattern of negative type 3a can be obtained without effect of pattern change due to the side etching of the resist film (FIG. 1 (I-G)).

Then, the organic under layer film 2 is dry-etched under a dry etching condition where the etching speed of the organic under layer film 2 is significantly high relative to the substrate having the silicon-containing resist under layer film pattern of negative type 3a obtained by transferring the negative resist pattern 4a, for example, by a reactive dry etching with gas plasma containing oxygen or by a reactive dry etching with gas plasma containing hydrogen and nitrogen. In this etching process, an organic under layer film pattern of negative type 2a is obtained, and the uppermost photoresist film is usually lost at the same time (FIG. 1 (I-H)). Then, using the organic under layer film pattern of negative type 2a thus obtained as an etching mask, the body to be processed 1 can be dry-etched with high precision, for example, by a fluorine-based dry etching or a chlorine-based dry etching. In this way, the pattern can be transferred to the body to be processed 1, thereby obtaining a negative pattern 1a (FIG. 1 (I-I)).

At this time, an organic under layer film formed from the above-mentioned composition containing the condensation resin of formaldehyde with dihydroxynaphthalene is preferably used in the 3-layer resist process since pattern collapse hardly occur in the formation of a fine pattern.

On the other hand, the 3-layer resist process also can be performed by applying an organic hard mask formed by a CVD method (CVD hard mask) instead of the organic under layer film 2. Also in this case, the body to be processed can be processed by the same procedure as mentioned above.

[Positive Patterning Process]
(Positive Patterning Process 1)

The present invention provides a patterning process comprising: forming an organic under layer film on a body to be processed by using a coating-type organic under layer film material; forming a silicon-containing resist under layer film on the organic under layer film by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an exposed part of the photoresist film by using an alkaline developer to form a positive pattern; transferring the pattern to the silicon-containing resist under layer film by dry etching using the photoresist film having the positive pattern thus formed as a mask; transferring the pattern to the organic under layer film by dry etching using the silicon-containing resist under layer film having the transferred pattern as a mask; and further transferring the pattern to the body to be processed by dry etching using the organic under layer film having the transferred pattern as a mask.

(Positive Patterning Process 2)

In addition, the present invention provides a patterning process comprising: forming a hard mask mainly consisting of carbon on a body to be processed by a CVD method; forming a, silicon-containing resist under layer film on the CVD hard mask by using the above-mentioned composition for forming a silicon-containing resist under layer film; forming a photoresist film on the silicon-containing resist under layer film by using a chemically amplified resist composition; after heat treatment, exposing the photoresist film to a high energy beam and dissolving an exposed part of the photoresist film by using an alkaline developer to form a positive pattern; transferring the pattern to the silicon-containing resist under layer film by dry etching using the photoresist film having the positive pattern thus formed as a mask; transferring the pattern to the CVD hard mask by dry etching using the silicon-containing resist under layer film having the transferred pattern as a mask; and further transferring the pattern to the body to be processed by dry etching using the CVD hard mask having the transferred pattern as a mask.

When a positive pattern is formed by using a resist under layer film formed from the composition for forming a silicon-containing resist under layer film of the present invention, the pattern formed in the photoresist film can be transferred to the substrate without generating the difference in size conversion, by optimizing the combination of the CVD film or the coating-type organic under layer film, as mentioned above.

In the positive patterning process of the present invention, the resist composition for forming the photoresist film is not particularly limited so long as it is a chemical amplified resist composition, and can form a positive pattern by development using an alkaline developer. The film-forming method, the body to be processed, the organic under layer film, and the CVD hard mask are as explained above in the negative patterning process.

In the positive patterning process, after forming the photoresist film, heat treatment is performed. Thereafter, exposure and alkaline development are carried out by alkaline developer to obtain a positive resist pattern. In addition, it is preferable to perform post-exposure baking (PEB) after the exposure.

As the alkaline developer, tetramethylammonium hydroxide (TMAH) may be used, for example.

[Positive Patterning Process of the Present Invention According to 3-Layer Resist Method]

In the following, the positive patterning process of the present invention will be described more specifically by referring to FIG. 1 (II-A) to (II-I), but the present invention is not limited thereto. In this process, first, an organic under layer film 2 is formed on a body to be processed 1 by spin coating (FIG. 1 (II-A)). It is desired that the organic under layer film 2 have high etching resistance because this film acts as a mask during etching of the body to be processed 1; and it is also desired that the film is crosslinked by heat or acid after formed by spin coating because mixing with the silicon-containing resist under layer film at the upper layer is undesirable.

Then, a silicon-containing resist under layer film 3 is formed thereon by spin coating using the composition for forming a silicon-containing resist under layer film of the present invention (FIG. 1 (II-B)), and a photoresist film 4 is formed thereon by spin coating (FIG. 1 (II-C)).

The photoresist film 4 is subjected to a usual pattern exposure, through a mask 5, by using a light source P corresponding to the photoresist film 4, such as KrF excimer laser beam, ArF excimer laser beam, $F_2$ laser beam, and EUV beam to form a pattern, preferably by any of a photolithography with a wavelength of 10 to 300 nm, a direct drawing by electron beam, and a nanoimprinting, or a combination thereof (FIG. 1 (II-D)). Thereafter, heat treatment under a condition matching with the photoresist film (FIG. 1 (II-E)), development by an alkaline developer (positive development), and if necessary, rinsing are performed to obtain a positive resist pattern 4b (FIG. 1 (II-F)).

Then, using this positive resist pattern 4b as an etching mask, dry etching is carried out under a dry etching condition where the etching speed of the silicon-containing resist under layer film 3 is significantly higher than the photoresist film, for example, with fluorine-based gas plasma. As a result, a silicon-containing resist under layer film pattern of positive type 3b can be obtained without effect of pattern change due to the side etching of the resist film (FIG. 1 (II-G)).

Then, the organic under layer film 2 is dry-etched under a dry etching condition where the etching speed of the organic under layer film 2 is significantly high relative to the substrate having the silicon-containing resist under layer film pattern of positive type 3b obtained by transferring the positive resist pattern, for example, by a reactive dry etching with gas plasma containing oxygen or by a reactive dry etching with gas plasma containing hydrogen and nitrogen. In this etching process, an organic under layer film pattern of positive type 2b is obtained, and the uppermost photoresist film is usually lost at the same time (FIG. 1 (II-H)). Then, using the organic under layer film pattern of positive type 2b thus obtained as an etching mask, the body to be processed 1 can be dry-etched with high precision, for example, by fluorine-based dry etching or a chlorine-based dry etching. In this way, the pattern can be transferred to the body to be processed 1, thereby obtaining a positive pattern 1b (FIG. 1 (II-I)).

At this time, an organic under layer film formed from the above-mentioned composition containing the condensation resin of formaldehyde with dihydroxynaphthalene is preferably used in the 3-layer resist process since pattern collapse hardly occur in the formation of a fine pattern.

On the other hand, the 3-layer resist process also can be performed by applying an organic hard mask formed by a CVD method (CVD hard mask) instead of the organic under layer film 2. Also in this case, the body to be processed can be processed by the same procedure as mentioned above.

EXAMPLES

Hereinafter, the present invention will be specifically described with reference to Synthesis examples, Examples, and Comparative examples, but the present invention is not restricted thereto. In the following examples, % means % by mass, and the molecular weight measurement was carried out by GPC.

Synthesis of Silicon-Containing Polymer (A1)

[Synthesis Example 1] Synthesis of Polymer 1

Into a 200 mL flask was put 14.6 g of propylene glycol monoethyl ether (PGEE) as a polymerization solvent, and heated at 80° C. under nitrogen atmosphere while stirring. 9.73 g (60.0 mmol) of 2-(4-vinylphenyl)-2-propanol [Monomer 1], 8.97 g (40.0 mmol) of 4-(trimethoxysilyl)styrene [Monomer 4], and as a polymerization initiator, a mixture containing 2.30 g of dimethyl-2,2'-azobis(2-methylpropionate) (product name: V601, available from Wako Pure Chemical Industries, Ltd.) and 29.1 g of PGEE were added thereto at 80° C. over 4 hours. After the solution was stirred at 80° C. for 16 hours, the temperature was decreased to room temperature to obtain 64 g of a 32% PGEE solution of Polymer 1 shown by the following structure. The molecular weight in terms of polystyrene and the dispersibility thereof were measured by GPC (Eluent: tetrahydrofuran), consequently finding the following results.

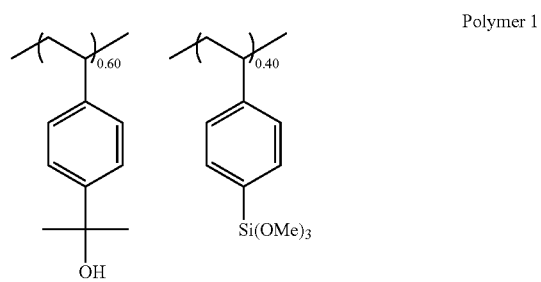

Polymer 1

Polymer composition ratio: unit derived from Monomer 1/unit derived from Monomer 4=60/40 (molar ratio)

Weight average molecular weight (Mw): 14,210

Dispersibility (Mw/Mn): 2.41

[Synthesis Examples 2 to 4] Synthesis of Polymers 2 to 4

The synthesis was performed under the same condition as in Synthesis example 1 by using polymerizable monomers shown in Table 1 to obtain Polymer 2 to Polymer 4 shown in Table 2.

TABLE 1

| Synthesis example | Polymerizable monomer |
| --- | --- |
| 1 | Monomer 1: 9.73 g, Monomer 4: 8.97 g |
| 2 | Monomer 2: 17.38 g, Monomer 4: 6.73 g |
| 3 | Monomer 1: 8.11 g, Monomer 5: 10.12 g |
| 4 | Monomer 3: 16.46 g, Monomer 6: 9.29 g |

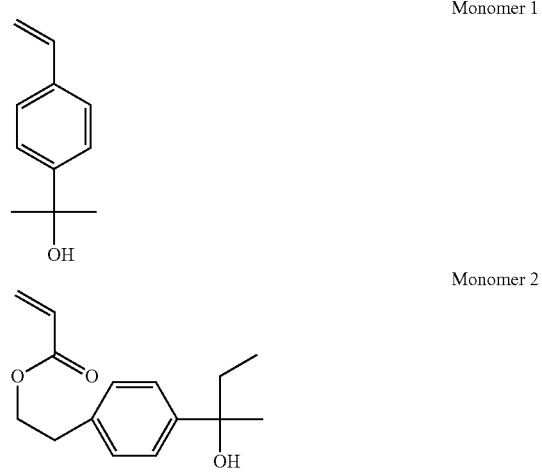

-continued
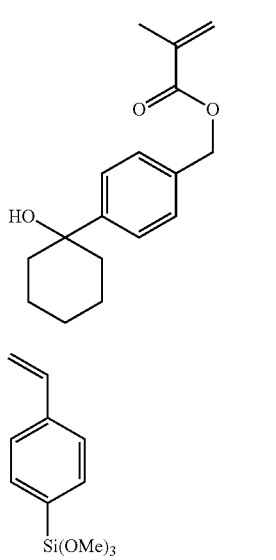
Monomer 3
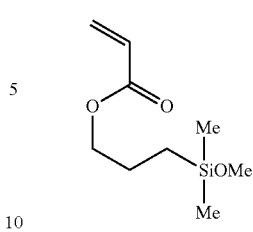
Monomer 4
Monomer 5
Monomer 6
TABLE 2
| Synthesis example | Product | Molecular weight (Mw) | Dispersibility (Mw/Mn) |
|---|---|---|---|
| 2 | 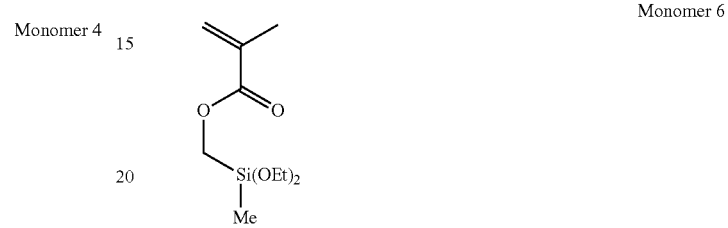 Polymer 2 | 15,140 | 2.51 |
| 3 | Polymer 3 | 14,840 | 2.53 |

TABLE 2-continued

| Synthesis example | Product | Molecular weight (Mw) | Dispersibility (Mw/Mn) |
|---|---|---|---|
| 4 | Polymer 4 | 14,590 | 2.57 |

Synthesis of Silicon-Containing Polymer (A2)

[Synthesis Example 5] Synthesis of Polymer 5

Into a 200 mL flask was put 14.6 g of propylene glycol monoethyl ether (PGEE) as a polymerization solvent, and heated at 80° C. under nitrogen atmosphere while stirring. 6.49 g (40.0 mmol) of 2-(4-vinylphenyl)-2-propanol [Monomer 1], 6.73 g (30.0 mmol) of 4-(trimethoxysilyl)styrene [Monomer 4], 5.29 g (30.0 mmol) of 4-tert-butoxystyrene [Monomer 7], and as a polymerization initiator, a mixture containing 2.30 g of V601 and 29.1 g of PGEE were added thereto at 80° C. over 4 hours. After the solution was stirred at 80° C. for 16 hours, the temperature was decreased to room temperature to obtain 64 g of a 32% PGEE solution of Polymer 5 shown by the following structure. The molecular weight in terms of polystyrene and the dispersibility thereof were measured by GPC (Eluent: tetrahydrofuran), consequently finding the following results.

Polymer composition ratio: unit derived from Monomer 1/unit derived from Monomer 4/unit derived from Monomer 7=40/30/30 (molar ratio)

Weight average molecular weight (Mw): 15,850

Dispersibility (Mw/Mn): 2.51

[Synthesis Example 6] Synthesis of Polymer 6

The synthesis was performed under the same condition as in Synthesis example 5 by using polymerizable monomers shown in Table 3 to obtain Polymer 6 shown in Table 4.

TABLE 3

| Synthesis example | Polymerizable monomer |
|---|---|
| 5 | Monomer 1: 6.49 g, Monomer 4: 6.73 g, Monomer 7: 5.29 g |
| 6 | Monomer 3: 10.97 g, Monomer 4: 6.73 g, Monomer 8: 4.03 g |

Polymer 5

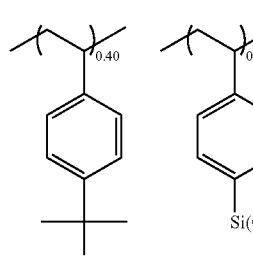
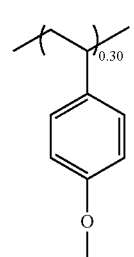
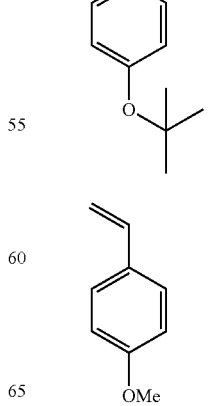

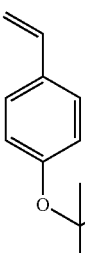

Monomer 7

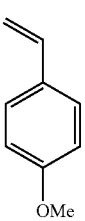

Monomer 8

TABLE 4

| Synthesis example | Product | Molecular weight (Mw) | Dispersibility (Mw/Mn) |
|---|---|---|---|
| 6 | Polymer 6 | 14,590 | 2.48 |

Synthesis of Silicon-Containing Compound (A3)

[Synthesis Example 7] Synthesis of Polymer 7

Into a 200 mL flask was put 100 g of a 20% tetrahydrofuran solution of Polymer 3, and then 20 g of a 10% oxalic acid aqueous solution was added dropwise thereto under nitrogen atmosphere while stirring. After stirring at 40° C. for 8 hours, the temperature was decreased to room temperature, and the tetrahydrofuran was distilled off by concentration under reduce pressure. The residue was dissolved in 200 mL of ethyl acetate and then washed with 50 mL of deionized water 3 times. 100 g of PGEE was added thereto, and the ethyl acetate was distilled off by concentration under reduced pressure to obtain 92 g of a 20% PGEE solution of Polymer 7 shown by the following structure. The molecular weight in terms of polystyrene and the dispersibility thereof were measured by GPC (Eluent: tetrahydrofuran), consequently finding the following results.

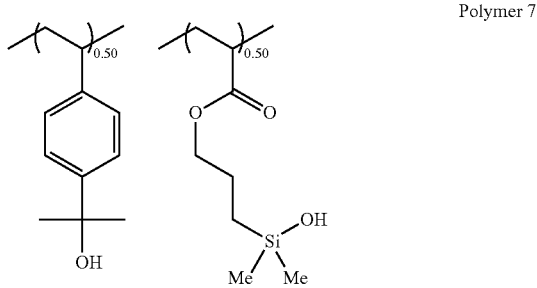

Polymer 7

Weight average molecular weight (Mw): 14,800
Dispersibility (Mw/Mn): 2.51

[Synthesis Example 8] Synthesis of Polymer 8

Into a 200 mL flask were put 50 g of a 20% tetrahydrofuran solution of Polymer 1 and 50 g of a 20% tetrahydrofuran solution of Polymer 5, and then 20 g of 0.2% nitric acid was added dropwise thereto under nitrogen atmosphere while stirring. After stirring at 40° C. for 8 hours, the temperature was decreased to room temperature, and the tetrahydrofuran was distilled off by concentration under reduce pressure. The residue was dissolved in 200 mL of ethyl acetate and then washed with 50 mL of deionized water 3 times. 100 g of PGEE was added thereto, and the ethyl acetate was distilled off by concentration under reduced pressure to obtain 92 g of a 20% PGEE solution of Polymer 8 shown by the following structure. The molecular weight in terms of polystyrene and the dispersibility thereof were measured by GPC (Eluent: tetrahydrofuran), consequently finding the following results.

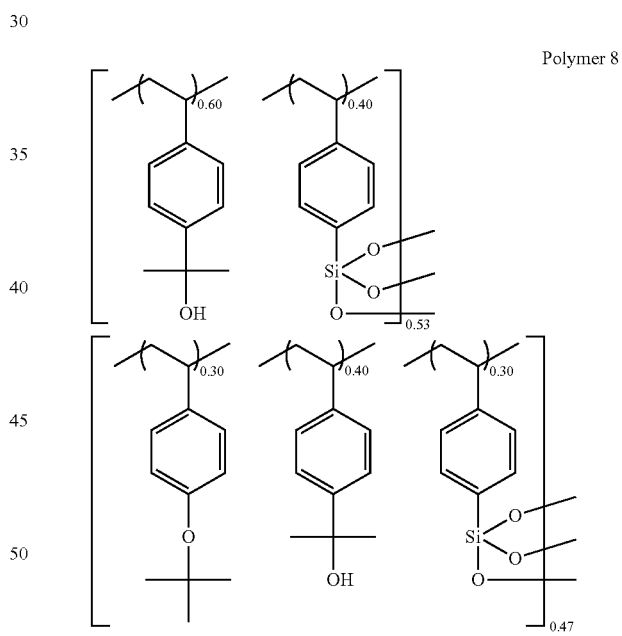

Polymer 8

Weight average molecular weight (Mw): 25,430
Dispersibility (Mw/Mn): 3.07

Synthesis of Silicon-Containing Compound (A4)

[Synthesis Example 9] Synthesis of Polymer 9

Into a 200 mL flask were put 100 g of a 10% PGEE solution of Polymer 1 and 4.4 g of tetraethoxy silane, and then 20 g of 0.2% nitric acid was added dropwise thereto under nitrogen atmosphere while stirring. After stirring at 40° C. for 8 hours, the temperature was decreased to room temperature, and the solution was dissolved in 400 mL of ethyl acetate and then washed with 50 mL of deionized water 3 times. 100 g of PGEE was added thereto, and the ethyl acetate was distilled off by concentration under reduced pressure to obtain 90 g of a 10% PGEE solution of Polymer 9 shown by the following structure. The molecular weight in terms of polystyrene and the dispersibility thereof were measured by GPC (Eluent: tetrahydrofuran), consequently finding the following results.

Polymer 9

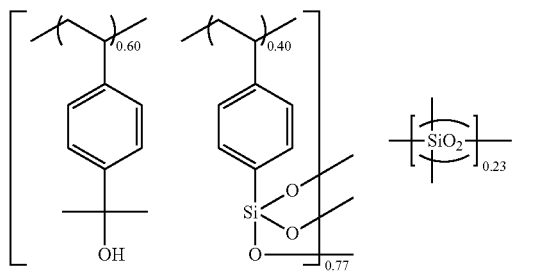

Weight average molecular weight (Mw): 19,550
Dispersibility (Mw/Mn): 2.87

[Synthesis Example 10] Synthesis of Polymer 10

Into a 200 mL flask were put 50 g of a 10% PGEE solution of Polymer 2, 50 g of a 10% PGEE solution of Polymer 5, and 3.2 g of tetramethoxy silane, and then 20 g of 0.2% nitric acid was added dropwise thereto under nitrogen atmosphere while stirring. After stirring at 35° C. for 8 hours, the temperature was decreased to room temperature, and the solution was dissolved in 400 mL of ethyl acetate and then washed with 50 mL of deionized water 3 times. 100 g of PGEE was added thereto, and the ethyl acetate was distilled off by concentration under reduced pressure to obtain 90 g of a 10% PGEE solution of Polymer 10 shown by the following structure. The molecular weight in terms of polystyrene and the dispersibility thereof were measured by GPC (Eluent: tetrahydrofuran), consequently finding the following results.

Polymer 10

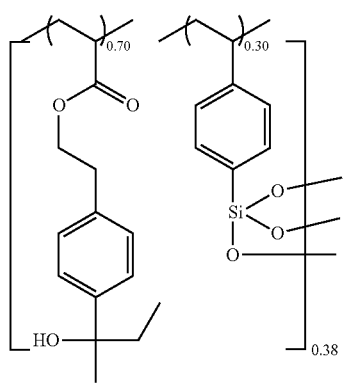

-continued

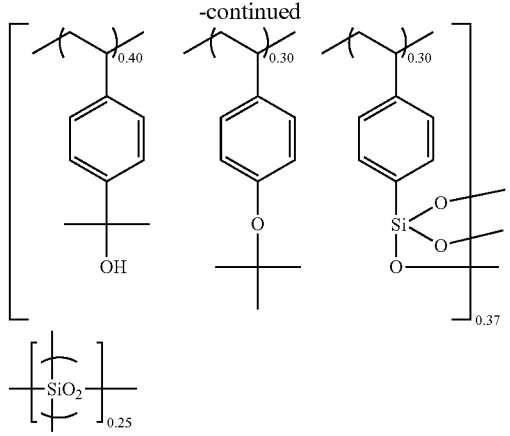

Weight average molecular weight (Mw): 28,640
Dispersibility (Mw/Mn): 2.96

[Synthesis Example 11] Synthesis of Polymer 11

Into a 200 mL flask were put 100 g of a 10% PGEE solution of Polymer 1, 2.9 g of methyl trimethoxy silane, and 3.2 g of tetramethoxy silane, and then 20 g of 0.2% nitric acid was added dropwise thereto under nitrogen atmosphere while stirring. After stirring at 35° C. for 8 hours, the temperature was decreased to room temperature, and the solution was dissolved in 400 mL of ethyl acetate and then washed with 50 mL of deionized water 3 times. 100 g of PGEE was added thereto, and the ethyl acetate was distilled off by concentration under reduced pressure to obtain 90 g of a 10% PGEE solution of Polymer 11 shown by the following structure. The molecular weight in terms of polystyrene and the dispersibility thereof were measured by GPC (Eluent: tetrahydrofuran), consequently finding the following results.

Polymer 11

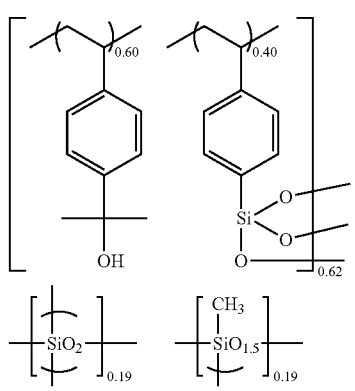

Weight average molecular weight (Mw): 17,790
Dispersibility (Mw/Mn): 2.66

Synthesis of Silicon-Containing Compound (B1)

[Synthesis Example 12] Synthesis of Polymer 12

To a mixture containing 120 g of methanol, 1 g of 70% nitric acid, and 60 g of deionized water was added a mixture containing 5.0 g of phenyl trimethoxy silane and 72.3 g of tetramethoxy silane, and the resulting mixture was maintained at 40° C. for 12 hours to perform hydrolysis condensation. After completion of the reaction, 300 g of PGEE was added thereto, and by-produced alcohol and excess water were distilled off under reduced pressure to obtain 300 g of a 10% PGEE solution of Polymer 12 shown by the following structure. The molecular weight in terms of polystyrene and the dispersibility thereof were measured by GPC (Eluent: tetrahydrofuran), consequently finding the following results.

Polymer 12

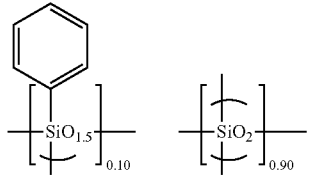

Weight average molecular weight (Mw): 2,500
Dispersibility (Mw/Mn): 2.14

[Synthesis Example 13] Synthesis of Polymer 13

To a mixture containing 120 g of methanol, 1 g of 70% nitric acid, and 60 g of deionized water was added a mixture containing 5.0 g of phenyl trimethoxy silane, 68.5 g of tetramethoxy silane, and 3.4 g of methyl trimethoxy silane, and the resulting mixture was maintained at 40° C. for 12 hours to perform hydrolysis condensation. After completion of the reaction, 300 g of PGEE was added thereto, and by-produced alcohol and excess water were distilled off under reduced pressure to obtain 300 g of a 10% PGEE solution of Polymer 13 shown by the following structure. The molecular weight in terms of polystyrene and the dispersibility thereof were measured by GPC (Eluent: tetrahydrofuran), consequently finding the following results.

Polymer 13

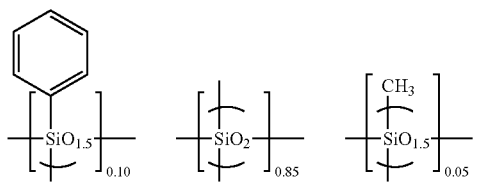

Weight average molecular weight (Mw): 2,400
Dispersibility (Mw/Mn): 2.10

Synthesis of Silicon-Containing Compound (B2)

[Synthesis Example 14] Synthesis of Polymer 14

To a mixture containing 120 g of methanol, 1 g of 70% nitric acid, and 60 g of deionized water was added a mixture containing 5.0 g of Polymer 1, 68.5 g of tetramethoxy silane, and 3.4 g of methyl trimethoxy silane, and the resulting mixture was maintained at 40° C. for 12 hours to perform hydrolysis condensation. After completion of the reaction, 300 g of PGEE was added thereto, and by-produced alcohol and excess water were distilled off under reduced pressure to obtain 300 g of a PGEE solution of Polymer 14 (polymer concentration: 10%) shown by the following structure. The molecular weight in terms of polystyrene and the dispersibility thereof were measured by GPC (Eluent: tetrahydrofuran), consequently finding the following results.

Polymer 14

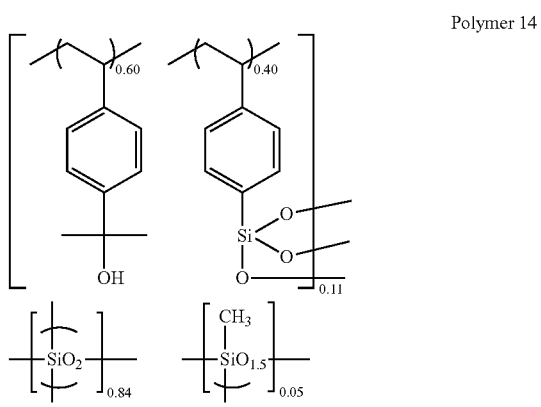

Weight average molecular weight (Mw): 10,820
Dispersibility (Mw/Mn): 2.90

Example and Comparative Example

The silicon-containing polymers and the silicon-containing compounds (Polymers 1 to 11) as component (A), the silicon-containing compounds (Polymers 12 to 14) as component (B) each obtained in Synthesis examples, a solvent, and additives were mixed in the ratios shown in Table 5, and the mixtures were filtered through a 0.1-μm filter made of a fluorine resin to prepare solutions of composition for forming a silicon-containing resist under layer film, which were named Sol. 1 to 28.

TABLE 5

| Solution of composition for forming a silicon-containing resist under layer film | Component A (parts by mass) | Component B (parts by mass) | Additives (parts by mass) | Solvent (parts by mass) |
|---|---|---|---|---|
| Sol. 1 | Polymer 1 A1: (0.1) | Polymer 12 B1: (3.9) | TPSOH(0.04) MA(0.04) | PGEE(150) Water(15) |
| Sol. 2 | Polymer 1 A1: (0.1) | Polymer 12 B1: (3.9) | TPSHCO$_3$(0.04) OA(0.04) | PGEE(150) Water(15) |
| Sol. 3 | Polymer 1 A1: (0.1) | Polymer 12 B1: (3.9) | TPSOx(0.04) MA(0.04) | PGEE(150) Water(15) |
| Sol. 4 | Polymer 1 A1: (0.1) | Polymer 12 B1: (3.9) | TPSTFA(0.04) MA(0.04) | PGEE(150) Water(15) |
| Sol. 5 | Polymer 1 A1: (0.1) | Polymer 12 B1: (3.9) | TPSOCOPh(0.04) OA(0.04) | PGEE(150) Water(15) |

TABLE 5-continued

| Solution of composition for forming a silicon-containing resist under layer film | Component A (parts by mass) | Component B (parts by mass) | Additives (parts by mass) | Solvent (parts by mass) |
|---|---|---|---|---|
| Sol. 6 | Polymer 1<br>A1: (0.1) | Polymer 12<br>B1: (3.9) | TPSNO$_3$(0.04)<br>OA(0.04) | PGEE(150)<br>Water(15) |
| Sol. 7 | Polymer 1<br>A1: (0.1) | Polymer 12<br>B1: (3.9) | TPSMSA(0.04)<br>MA(0.04) | PGEE(150)<br>Water(15) |
| Sol. 8 | Polymer 1<br>A1: (0.1) | Polymer 12<br>B1: (3.9) | QBANO$_3$(0.04)<br>MA(0.04) | PGEE(150)<br>Water(15) |
| Sol. 9 | Polymer 1<br>A1: (0.1) | Polymer 12<br>B1: (3.9) | QMATFA(0.04)<br>TPSNf(0.04)<br>MA(0.04) | PGEE(150)<br>Water(15) |
| Sol. 10 | Polymer 1<br>A1: (0.1) | Polymer 12<br>B1: (3.9) | QMAMA(0.04)<br>MA(0.04) | PGEE(150)<br>Water(15) |
| Sol. 11 | Polymer 2<br>A1: (0.1) | Polymer 12<br>B1: (3.9) | TPSMA(0.04)<br>MA(0.04) | PGEE(150)<br>Water(15) |
| Sol. 12 | Polymer 3<br>A1: (0.1) | Polymer 12<br>B1: (3.9) | TPSMA(0.04)<br>MA(0. 04) | PGEE(150)<br>Water(15) |
| Sol. 13 | Polymer 4<br>A1: (0.1) | Polymer 12<br>B1: (3.9) | TPSMA(0.04)<br>MA(0.04) | PGEE(150)<br>Water(15) |
| Sol. 14 | Polymer 5<br>A2: (0.1) | Polymer 12<br>B1: (3.9) | TPSMA(0.04)<br>TPSNf(0.04)<br>MA(0.04) | PGEE(150)<br>Water(15) |
| Sol. 15 | Polymer 6<br>A2: (0.1) | Polymer 12<br>B1: (3.9) | TPSMA(0.04)<br>MA(0.04) | PGEE(150)<br>Water(15) |
| Sol. 16 | Polymer 7<br>A3: (0.1) | Polymer 12<br>B1: (3.9) | TPSMA(0.04)<br>MA(0.04) | PGEE(150)<br>Water(15) |
| Sol. 17 | Polymer 8<br>A3: (0.1) | Polymer 12<br>B1: (3.9) | TPSMA(0.04)<br>OA(0.04) | PGEE(150)<br>Water(15) |
| Sol. 18 | Polymer 9<br>A4: (0.1) | Polymer 12<br>B1: (3.9) | TPSMA(0.04)<br>MA(0.04) | PGEE(150)<br>Water(15) |
| Sol. 19 | Polymer 10<br>A4: (0.1) | Polymer 12<br>B1: (3.9) | TPSMA(0.04)<br>MA(0. 04) | PGEE(150)<br>Water(15) |
| Sol. 20 | Polymer 11<br>A4: (0.1) | Polymer 12<br>B1: (3.9) | TPSNO$_3$(0.04)<br>MA(0.04) | PGEE (150)<br>Water (15) |
| Sol. 21 | Polymer 5<br>A2: (0.1) | Polymer 13<br>B1: (3.9) | TPSNO$_3$(0.04)<br>MA(0.04) | PGEE(150)<br>Water(15) |
| Sol. 22 | Polymer 5<br>A2: (0.1) | Polymer 14<br>B2: (3.9) | TPSNO$_3$(0.04)<br>MA(0.04) | PGEE (150)<br>Water (15) |
| Sol. 23 | Polymer 7<br>A3: (0.1) | Polymer 13<br>B1: (3.9) | TPSNO$_3$(0.04)<br>MA(0.04) | PGEE(150)<br>Water(15) |
| Sol. 24 | Polymer 8<br>A3: (0.1) | Polymer 14<br>B2: (3.9) | TPSNO$_3$(0.04)<br>MA(0.04) | PGEE(150)<br>Water(15) |
| Sol. 25 | Polymer 9<br>A4: (0.1) | Polymer 13<br>B1: (3.9) | TPSNO$_3$(0.04)<br>MA(0.04) | PGEE(150)<br>Water(15) |
| Sol. 26 | Polymer 10<br>A4: (0.1) | Polymer 14<br>B2: (3.9) | TPSNO$_3$(0.04)<br>MA(0.04) | PGEE(150)<br>Water(15) |
| Sol. 27 | none | Polymer 12<br>B1: (4.0) | TPSOH(0.04)<br>MA(0.04) | PGEE (150)<br>Water (15) |
| Sol. 28 | none | Polymer 12<br>B1: (4.0) | TPSMA(0.04)<br>TPSNf(0.04)<br>MA(0.04) | PGEE(150)<br>Water(15) |

Additives in Table 5 used are as follows:
TPSOH: triphenylsulfonium hydroxide
TPSHCO$_3$: mono-(triphenylsulfonium) carbonate
TPSOx: mono-(triphenylsulfonium) oxalate
TPSTFA: triphenylsulfonium trifluoroacetate
TPSOCOPh: triphenylsulfonium benzoate
TPSNO$_3$: triphenyl sulfonium nitrate
TPSMSA: triphenyl sulfonium methanesulfonate
QBANO$_3$: tetrabuthyl ammonium nitrate
QMATFA: tetramethyl ammonium trifluoroacetate
TPSNf: triphenyl sulfonium nonafluorobutane sulfonate
QMAMA: mono-(tetramethyl ammonium) maleate
TPSMA: mono-(triphenylsulfonium) maleate
MA: maleic acid
OA: oxalic acid Patterning Test by Positive Development Onto a silicon wafer, the following composition of a naphthalene skeleton-containing resin (UL polymer 1) was applied by spin coating and baked to form an organic under layer film having a film thickness of 200 nm. Then, the solutions of composition for forming a silicon-containing resist under layer film, Sol. 1 to 28, were each applied thereon and baked at 240° C. for 60 seconds to form a silicon-containing resist under layer film, Films 1 to 28, having a film thickness of 35 nm.

UL Polymer 1

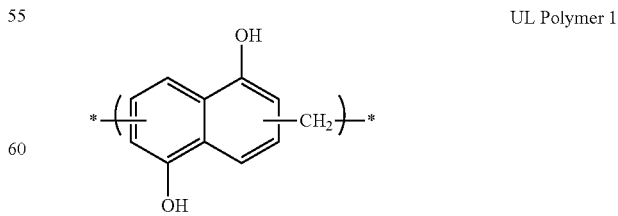

Molecular weight (Mw) and dispersibility (Mw/Mn) by gel-permeation chromatography (GPC) in terms of polystyrene Weight average molecular weight (Mw): 4,200

Dispersibility (Mw/Mn): 3.35

Thereafter, an ArF resist composition solution for positive development (PR-1) shown in Table 6 was applied onto the silicon-containing resist under layer film, and then baked at 110° C. for 60 seconds to form a photoresist film having a film thickness of 100 nm.

Next, these were exposed by an ArF immersion exposure apparatus (NSR-S610C, manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 42 nm 1:1 positive line and space pattern. Then, pattern collapse after development was observed by an electron microscope (CG4000) manufactured by Hitachi High-Technologies Corporation, and cross-sectional shape was measured with an electron microscope (S-9380) manufactured by Hitachi, Ltd. The results are shown in Table 7.

TABLE 6

|  | ArF resist polymer (parts by mass) | Acid generator (parts by mass) | Base (parts by mass) | Water-shedding polymer (parts by mass) | Solvent (parts by mass) |
|---|---|---|---|---|---|
| PR-1 | P1 (100) | PAG1 (10.0) | Q1 (4.25) | FP1 (4.0) | PGMEA(2,200) GBL(300) |

The molecular weight, dispersibility, and structural formula of ArF resist polymer 1, P1 described in Table 6 are shown below.

Molecular weight (Mw)=11,300

Dispersibility (Mw/Mn)=1.89

P1

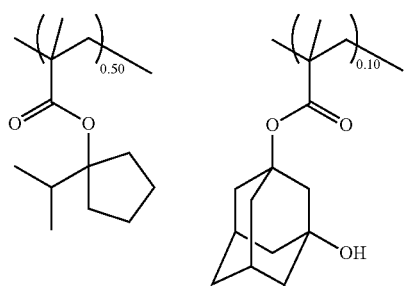

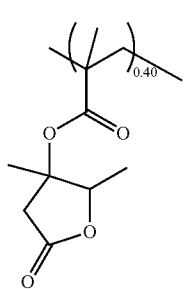

The structural formula of acid generator, PAG1 described in Table 6 are shown below.

PAG1

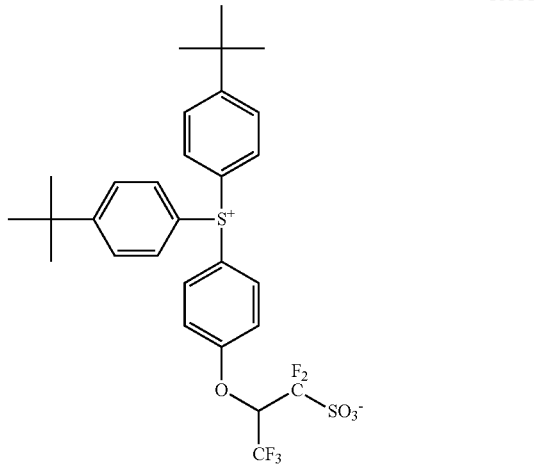

The structural formula of base: Q1 described in Table 6 are shown below.

Q1

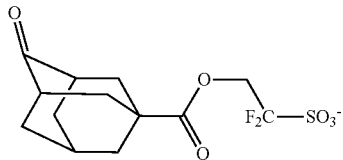

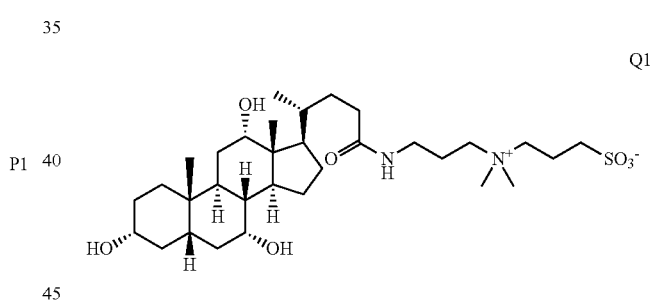

The molecular weight, dispersibility, and structural formula of water-shedding polymer, FP1 described in Table 6 are shown below.

Molecular weight (Mw)=8,900

Dispersibility (Mw/Mn)=1.96

FP1

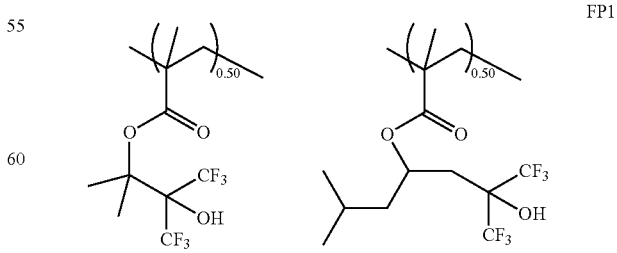

In Table 6, PGMEA and GBL denote propylene glycol monomethyl ether acetate and γ-butyrolactone, respectively.

TABLE 7

| Example | Silicon-containing resist under layer film | ArF resist composition solution | Pattern profile of cross section after development | Pattern collapse |
|---|---|---|---|---|
| Example 1-1 | Film 1 | PR-1 | vertical profile | none |
| Example 1-2 | Film 2 | PR-1 | vertical profile | none |
| Example 1-3 | Film 3 | PR-1 | vertical profile | none |
| Example 1-4 | Film 4 | PR-1 | vertical profile | none |
| Example 1-5 | Film 5 | PR-1 | vertical profile | none |
| Example 1-6 | Film 6 | PR-1 | vertical profile | none |
| Example 1-7 | Film 7 | PR-1 | vertical profile | none |
| Example 1-8 | Film 8 | PR-1 | vertical profile | none |
| Example 1-9 | Film 9 | PR-1 | vertical profile | none |
| Example 1-10 | Film 10 | PR-1 | vertical profile | none |
| Example 1-11 | Film 11 | PR-1 | vertical profile | none |
| Example 1-12 | Film 12 | PR-1 | vertical profile | none |
| Example 1-13 | Film 13 | PR-1 | vertical profile | none |
| Example 1-14 | Film 14 | PR-1 | vertical profile | none |
| Example 1-15 | Film 15 | PR-1 | vertical profile | none |
| Example 1-16 | Film 16 | PR-1 | vertical profile | none |
| Example 1-17 | Film 17 | PR-1 | vertical profile | none |
| Example 1-18 | Film 18 | PR-1 | vertical profile | none |
| Example 1-19 | Film 19 | PR-1 | vertical profile | none |
| Example 1-20 | Film 20 | PR-1 | vertical profile | none |
| Example 1-21 | Film 21 | PR-1 | vertical profile | none |
| Example 1-22 | Film 22 | PR-1 | vertical profile | none |
| Example 1-23 | Film 23 | PR-1 | vertical profile | none |
| Example 1-24 | Film 24 | PR-1 | vertical profile | none |
| Example 1-25 | Film 25 | PR-1 | vertical profile | none |
| Example 1-26 | Film 26 | PR-1 | vertical profile | none |
| Comparative example 1-1 | Film 27 | PR-1 | cross section cannot be observed due to pattern collapse | pattern collapse occurred in 48 nm |
| Comparative example 1-2 | Film 28 | PR-1 | cross section cannot be observed due to pattern collapse | pattern collapse occurred in 47 nm |

As shown in Table 7, in Examples 1-1 to 1-26, which used the composition for forming a silicon-containing resist under layer film that contains the silicon-containing polymer or the silicon-containing compound of the present invention, a vertical profile in the resist cross section could be obtained without pattern collapse. On the other hand, in Comparative examples 1-1 and 1-2 not containing the silicon-containing polymer or the silicon-containing compound of the present invention, pattern collapse occurred in 48 nm and 47 nm respectively, and thus the cross section could not be observed.

Patterning Test by Negative Development

Onto a silicon wafer, the above composition of the naphthalene skeleton-containing resin (UL polymer 1) was applied by spin coating and baked to form an organic under layer film having a film thickness of 200 nm. Then, the solutions of composition for forming a silicon-containing resist under layer film, Sol. 14, 21, 22, and 28, were each applied thereon and baked at 240° C. for 60 seconds to form a silicon-containing resist under layer film, Films 14, 21, 22, and 28, having a film thickness of 35 nm.

Thereafter, an ArF resist composition solution for negative development (NR-1) shown in Table 8 was applied onto the silicon-containing resist under layer film, and then baked at 110° C. for 60 seconds to form a photoresist film having a film thickness of 100 nm. Next, these were exposed by an ArF immersion exposure apparatus (NSR-S610C, manufactured by Nikon Corporation, NA: 1.30, σ: 0.98/0.65, 35° polarized dipole illumination, 6% halftone phase shift mask), and baked at 100° C. for 60 seconds (PEB). Thereafter, while rotating with 30 rpm, butyl acetate was discharged for 3 seconds from a development nozzle as a developer, rotation was then stopped, and paddle development was performed for 27 seconds. The resulting wafer was rinsed with diisoamyl ether, spin dried, and baked at 100° C. for 20 seconds to evaporate the rinsing solvent. According to this patterning, 42 nm 1:1 negative line and space pattern was obtained. Then, pattern collapse after development was observed by an electron microscope (CG4000) manufactured by Hitachi High-Technologies Corporation, and cross-sectional shape was measured with an electron microscope (S-9380) manufactured by Hitachi, Ltd. The results are shown in Table 9.

TABLE 8

| | ArF resist polymer (parts by mass) | Acid generator (parts by mass) | Base (parts by mass) | Water-shedding polymer (parts by mass) | Solvent (parts by mass) |
|---|---|---|---|---|---|
| NR-1 | P2 (100) | PAG2 (10.0) | Q2 (2.0) | FP1 (4.0) | PGMEA(2,200) GBL(300) |

The molecular weight, dispersibility, and structural formula of ArF resist polymer 2, P2 described in Table 8 are shown below.

Molecular weight (Mw)=8,900

Dispersibility (Mw/Mn)=1.93

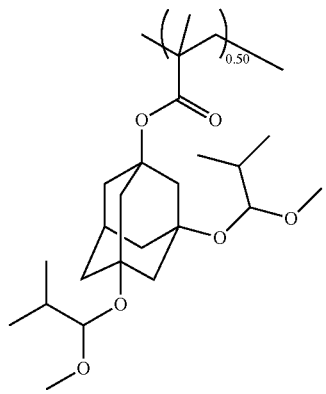

P2

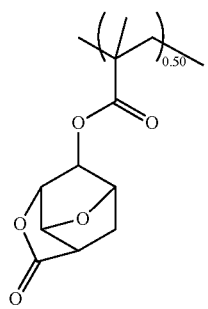

The structural formula of acid generator, PAG2 described in Table 8 are shown below.

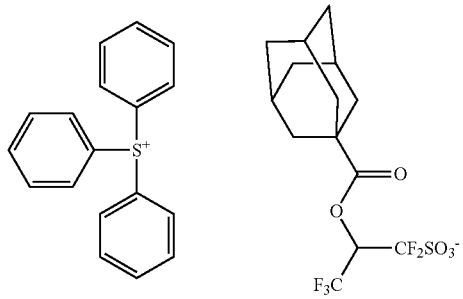

PAG2

The structural formula of base: Q2 described in Table 8 are shown below.

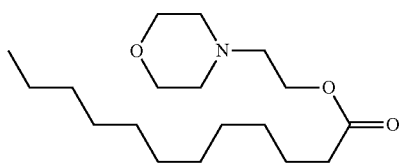

Q2

Water-shedding polymer, FP1 described in Table 8 is the same as that used in PR-1 of the patterning test by positive development.

TABLE 9

| Example | Silicon-containing resist under layer film | ArF resist composition solution | Pattern profile of cross section after development | Pattern collapse |
|---|---|---|---|---|
| Example 2-1 | Film 14 | NR-1 | vertical profile | none |
| Example 2-2 | Film 21 | NR-1 | vertical profile | none |
| Example 2-3 | Film 22 | NR-1 | vertical profile | none |
| Comparative example 2-1 | Film 28 | NR-1 | cross section cannot be observed due to pattern collapse | pattern collapse occurred in 48 nm |

As shown in Table 9, in Examples 2-1 to 2-3, which used the composition for forming a silicon-containing resist under layer film that contains the silicon-containing polymer or the silicon-containing compound of the present invention, a vertical profile in the resist cross section could be obtained without pattern collapse. Thus, when a silicon-containing resist under layer film was formed by the composition for forming a silicon-containing resist under layer film of the present invention, a good resist pattern could be obtained in both cases of positive development and negative development. On the other hand, in Comparative examples 2-1 not containing the silicon-containing polymer or the silicon-containing compound of the present invention, pattern collapse occurred in 48 nm.

Pattern Etching Test: Positive Pattern

By using the positive resist pattern obtained in the patterning test by positive development (Examples 1-11 to 1-26) as a mask, the pattern was transferred to the silicon-containing resist under layer film by dry etching under the following condition (1), and further transferred to the organic under layer film by dry etching under the following condition (2). Then, cross-sectional shape of the obtained pattern was measured with an electron microscope (S-9380) manufactured by Hitachi, Ltd., and pattern roughness was observed by an electron microscope (CG4000) manufactured by Hitachi High-Technologies Corporation. The results are shown in Table 10.

(1) Etching condition in $CHF_3/CF_4$ gas system Device: dry etching device Telius SP manufactured by Tokyo Electron Ltd.

| Etching condition (1): | |
|---|---|
| Chamber pressure | 10 Pa |
| Upper/Lower RF power | 500 W/300 W |
| $CHF_3$ gas flow rate | 50 mL/min |
| $CF_4$ gas flow rate | 150 mL/min |
| Ar gas flow rate | 100 mL/min |
| Treatment time | 40 seconds |

(2) Etching condition in $O_2/N_2$ gas system Device: dry etching device Telius SP manufactured by Tokyo Electron Ltd.

| Etching condition (2): | |
|---|---|
| Chamber pressure | 2 Pa |
| Upper/Lower RF power | 1000 W/300 W |
| $O_2$ gas flow rate | 300 mL/min |
| $N_2$ gas flow rate | 100 mL/min |
| Ar gas flow rate | 100 mL/min |
| Treatment time | 30 seconds |

TABLE 10

| Example | Silicon-containing resist under layer film | Pattern profile of cross section after dry etching | Pattern roughness |
|---|---|---|---|
| Example 3-1 | Film 11 | vertical profile | 2.0 nm |
| Example 3-2 | Film 12 | vertical profile | 1.8 nm |
| Example 3-3 | Film 13 | vertical profile | 1.6 nm |
| Example 3-4 | Film 14 | vertical profile | 1.7 nm |
| Example 3-5 | Film 15 | vertical profile | 1.6 nm |
| Example 3-6 | Film 16 | vertical profile | 1.9 nm |
| Example 3-7 | Film 17 | vertical profile | 2.0 nm |
| Example 3-8 | Film 18 | vertical profile | 1.5 nm |
| Example 3-9 | Film 19 | vertical profile | 1.9 nm |
| Example 3-10 | Film 20 | vertical profile | 1.9 nm |
| Example 3-11 | Film 21 | vertical profile | 1.8 nm |
| Example 3-12 | Film 22 | vertical profile | 1.9 nm |
| Example 3-13 | Film 23 | vertical profile | 1.9 nm |
| Example 3-14 | Film 24 | vertical profile | 1.7 nm |
| Example 3-15 | Film 25 | vertical profile | 1.6 nm |
| Example 3-16 | Film 26 | vertical profile | 1.5 nm |

As shown in Table 10, it was revealed that when the composition for forming a silicon-containing resist under layer film of the present invention was used, cross-sectional shape and pattern roughness of the pattern after processing the organic under layer film was excellent as well as cross-sectional shape of the resist pattern after positive development.

Pattern Etching Test: Negative Pattern

By using the negative resist pattern obtained in the patterning test by negative development (Examples 2-1 to 2-3) as a mask, the pattern was transferred to the silicon-containing resist under layer film by dry etching under the foregoing condition (1), and further transferred to the organic under layer film by dry etching under the foregoing condition (2). Then, cross-sectional shape of the obtained pattern was measured with an electron microscope (S-9380) manufactured by Hitachi, Ltd., and pattern roughness was observed by an electron microscope (CG4000) manufactured by Hitachi High-Technologies Corporation. The results are shown in Table 11.

TABLE 11

| Example | Silicon-containing resist under layer film | Pattern profile of cross section after dry etching | Pattern roughness |
| --- | --- | --- | --- |
| Example 4-1 | Film 14 | vertical profile | 1.6 nm |
| Example 4-2 | Film 21 | vertical profile | 1.9 nm |
| Example 4-3 | Film 22 | vertical profile | 1.5 nm |

As shown in Table 11, it was revealed that when the composition for forming a silicon-containing resist under layer film of the present invention was used, cross-sectional shape and pattern roughness of the pattern after processing the organic under layer film was excellent as well as cross-sectional shape of the resist pattern after negative development.

As described above, the composition for forming a silicon-containing resist under layer film that contains the silicon-containing polymer or the silicon-containing compound of the present invention enables a resist under layer film having excellent adhesiveness with a resist upper layer film to be formed in both negative development and positive development. Accordingly, when the composition for forming a silicon-containing resist under layer film of the present invention is used, a pattern excellent in surface roughness can be formed without causing pattern collapse.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A silicon-containing polymer comprising a repeating unit shown by the general formula (1-3) and one or more repeating units selected from repeating units shown by the general formulae (1-1) and (1-2) as a partial structure,

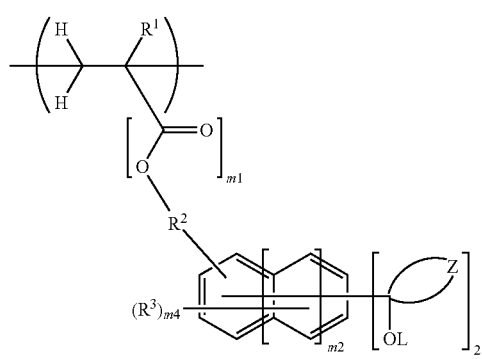

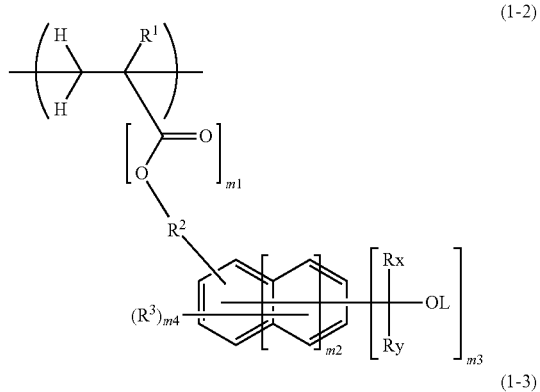

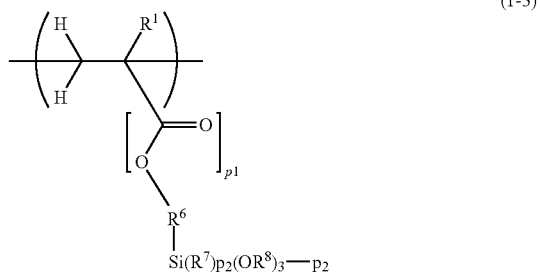

wherein $R^1$ represents a hydrogen atom, a fluorine atom, a methyl group, or a trifluoromethyl group; $R^2$ represents a single bond or an alkylene group having 1 to 10 carbon atoms and optionally containing an ether oxygen atom within the chain of the alkylene group; $R^3$ represents a hydrogen atom, a halogen atom, a linear, branched, or cyclic acyloxy group having 2 to 8 carbon atoms and optionally substituted with halogen, a linear, branched, or cyclic alkyl group having 1 to 6 carbon atoms and optionally substituted with halogen, or a linear, branched, or cyclic alkoxy group having 1 to 6 carbon atoms and optionally substituted with halogen; $R^6$ represents a single bond, a phenylene group optionally containing a substituent, or an alkylene group having 1 to 10 carbon atoms and optionally containing an ether oxygen atom within the chain of the alkylene group; $R^7$ represents a hydrogen atom or an organic group having 1 to 30 carbon atoms; $R^8$ represents a hydrogen atom or an alkyl group having 1 to 6 carbon atoms; $R_x$ and $R_y$ independently represent a hydrogen atom or an alkyl group having 1 to 15 carbon atoms and optionally substituted with a hydroxyl group or an alkoxy group, wherein $R_x$ and $R_y$ may be mutually bonded to form a ring with the carbon atoms to which $R_x$ and $R_y$ are bonded, with the proviso that $R_x$ and $R_y$ do not both represent hydrogen atoms; L represents a hydrogen atom, a linear, branched, or cyclic aliphatic monovalent hydrocarbon group having 1 to 10 carbon atoms and optionally containing an ether oxygen atom, a carbonyl group, or a carbonyloxy group within the chain of the hydrocarbon atom, or a monovalent aromatic group optionally containing a substituent; Z represents an alicyclic group formed together with the carbon atom to which Z is bonded, the alicyclic group having 5 to 15 carbon atoms and optionally containing a heteroatom; m1 represents 0 or 1; m2 represents an integer of 0 to 2; m3 represents an integer of 1 to 3; m4 represents an integer satisfying 5+2×m2−m3; p1 represents 0 or 1; and p2 represents an integer of 0 to 2.

2. The silicon-containing polymer according to claim 1, further comprising a repeating unit shown by the general formula (1-4) as the partial structure,

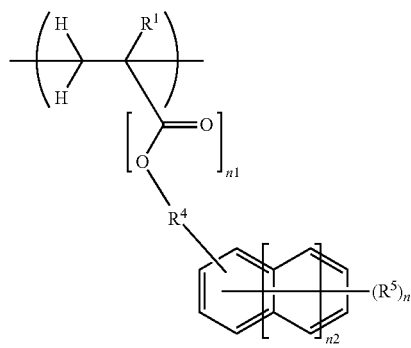

(1-4)

wherein $R^1$ has the same meaning as defined above; $R^4$ represents a single bond or an alkylene group having 1 to 10 carbon atoms and optionally containing an ether oxygen atom within the chain of the alkylene group; $R^5$ represents a hydroxyl group, a halogen atom, a linear, branched, or cyclic acyloxy group having 2 to 8 carbon atoms and optionally substituted with halogen, a linear, branched, or cyclic alkyl group having 1 to 6 carbon atoms and optionally substituted with halogen, or a linear, branched, or cyclic alkoxy group having 1 to 6 carbon atoms and optionally substituted with halogen; n1 represents 0 or 1; n2 represents an integer of 0 to 2; and n3 represent an integer of 0 to 3.

3. A silicon-containing compound obtained by hydrolysis or hydrolysis condensation of a single substance or a mixture of one or more silicon-containing polymers selected from the silicon-containing polymer according to claim 1.

4. A silicon-containing compound obtained by hydrolysis or hydrolysis condensation of a mixture containing one or more hydrolysable silicon compounds shown by the general formula (2) and one or more of the silicon-containing polymer according to claim 1, a hydrolysate, and a hydrolysis condensate thereof, $$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and 0≤m11+m12+m13≤3.

5. A composition for forming a silicon-containing resist under layer film, comprising (A) a silicon-containing polymer according to claim 1 and a solvent.

6. A composition for forming a silicon-containing resist under layer film, comprising (A) a silicon-containing compound according to claim 3 and a solvent.

7. A composition for forming a silicon-containing resist under layer film, comprising (A) a silicon-containing compound according to claim 4 and a solvent.

8. The composition for forming a silicon-containing resist under layer film according to claim 5, further comprising (B) a silicon-containing compound obtained by hydrolysis condensation of one or more hydrolysable silicon compounds shown by the general formula (2), $$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and 0≤m11+m12+m13≤3.

9. The composition for forming a silicon-containing resist under layer film according to claim 6, further comprising (B) a silicon-containing compound obtained by hydrolysis condensation of one or more hydrolysable silicon compounds shown by the general formula (2), $$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and 0≤m11+m12+m13≤3.

10. The composition for forming a silicon-containing resist under layer film according to claim 7, further comprising (B) a silicon-containing compound obtained by hydrolysis condensation of one or more hydrolysable silicon compounds shown by the general formula (2), $$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and 0≤m11+m12+m13≤3.

11. The composition for forming a silicon-containing resist under layer film according to claim 5, further comprising (B) a silicon-containing compound obtained by hydrolysis or hydrolysis condensation of a mixture containing one or more hydrolysable silicon compounds shown by the general formula (2) and one or more of the silicon-containing polymer, a hydrolysate, and a hydrolysis condensate thereof, $$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and 0≤m11+m12+m13≤3, the component (B) being different from the silicon-containing compound used as the component (A).

12. The composition for forming a silicon-containing resist under layer film according to claim 6, further comprising (B) a silicon-containing compound obtained by hydrolysis or hydrolysis condensation of a mixture containing one or more hydrolysable silicon compounds shown by the general formula (2) and one or more of the silicon-containing polymer, a hydrolysate, and a hydrolysis condensate thereof, $$R^{11}{}_{m11}R^{12}{}_{m12}R^{13}{}_{m13}Si(OR^{14})_{(4-m11-m12-m13)} \quad (2)$$

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and 0≤m11+m12+m13≤3, the component (B) being different from the silicon-containing compound used as the component (A).

13. The composition for forming a silicon-containing resist under layer film according to claim 7, further comprising (B) a silicon-containing compound obtained by hydrolysis or hydrolysis condensation of a mixture containing one or more hydrolysable silicon compounds shown by the general formula (2) and one or more of the silicon-containing polymer, a hydrolysate, and a hydrolysis condensate thereof, $$R^{11}{}_{m11}R^{12}{}_{m12}R^{13}{}_{m13}Si(OR^{14})_{(4-m11-m12-m13)} \quad (2)$$

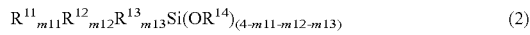

wherein $R^{11}$, $R^{12}$, and $R^{13}$ independently represent a hydrogen atom or a monovalent organic group having 1 to 30 carbon atoms; $R^{14}$ represents a hydrogen atom or an alkyl group having 1 to 6 carbon atoms; m11, m12, and m13 are each 0 or 1; and $0 \le m11+m12+m13 \le 3$, the component (B) being different from the silicon-containing compound used as the component (A).

14. The composition for forming a silicon-containing resist under layer film according to claim 8, wherein a mass ratio between the component (A) and the component (B) is $(B) \ge (A)$.

15. The composition for forming a silicon-containing resist under layer film according to claim 11, wherein a mass ratio between the component (A) and the component (B) is $(B) \ge (A)$.

16. A patterning process comprising:
forming an organic under layer film on a body to be processed by using a coating-type organic under layer film material;
forming a silicon-containing resist under layer film on the organic under layer film by using the composition for forming a silicon-containing resist under layer film according to claim 5;
forming a photoresist film on the silicon-containing resist under layer film by using a chemically amplified resist composition;
after heat treatment, exposing the photoresist film to a high energy beam and dissolving an exposed part of the photoresist film by using an alkaline developer to form a positive pattern;
transferring the pattern to the silicon-containing resist under layer film by dry etching using the photoresist film having the formed pattern as a mask;
transferring the pattern to the organic under layer film by dry etching using the silicon-containing resist under layer film having the transferred pattern as a mask; and
further transferring the pattern to the body to be processed by dry etching using the organic under layer film having the transferred pattern as a mask.

17. The patterning process according to claim 16, wherein the coating-type organic under layer film material contains a resin having a naphthalene skeleton.

18. A patterning process comprising:
forming a hard mask mainly consisting of carbon on a body to be processed by a CVD method;
forming a silicon-containing resist under layer film on the CVD hard mask by using the composition for forming a silicon-containing resist under layer film according to claim 5;
forming a photoresist film on the silicon-containing resist under layer film by using a chemically amplified resist composition;
after heat treatment, exposing the photoresist film to a high energy beam and dissolving an exposed part of the photoresist film by using an alkaline developer to form a positive pattern;
transferring the pattern to the resist under layer film by dry etching using the photoresist film having the formed pattern as a mask;
transferring the pattern to the CVD hard mask by dry etching using the resist under layer film having the transferred pattern as a mask; and
further transferring the pattern to the body to be processed by dry etching using the CVD hard mask having the transferred pattern as a mask.

19. A patterning process comprising:
forming an organic under layer film on a body to be processed by using a coating-type organic under layer film material;
forming a silicon-containing resist under layer film on the organic under layer film by using the composition for forming a silicon-containing resist under layer film according to claim 5;
forming a photoresist film on the silicon-containing resist under layer film by using a chemically amplified resist composition;
after heat treatment, exposing the photoresist film to a high energy beam and dissolving an unexposed part of the photoresist film by using an organic solvent as a developer to form a negative pattern;
transferring the pattern to the silicon-containing resist under layer film by dry etching using the photoresist film having the formed pattern as a mask;
transferring the pattern to the organic under layer film by dry etching using the silicon-containing resist under layer film having the transferred pattern as a mask; and
further transferring the pattern to the body to be processed by dry etching using the organic under layer film having the transferred pattern as a mask.

20. The patterning process according to claim 19, wherein the coating-type organic under layer film material contains a resin having a naphthalene skeleton.

21. A patterning process comprising:
forming a hard mask mainly consisting of carbon on a body to be processed by a CVD method;
forming a silicon-containing resist under layer film on the CVD hard mask by using the composition for forming a silicon-containing resist under layer film according to claim 5;
forming a photoresist film on the silicon-containing resist under layer film by using a chemically amplified resist composition;
after heat treatment, exposing the photoresist film to a high energy beam and dissolving an unexposed part of the photoresist film by using an organic solvent as a developer to form a negative pattern;
transferring the pattern to the silicon-containing resist under layer film by dry etching using the photoresist film having the formed pattern as a mask;
transferring the pattern to the CVD hard mask by dry etching using the silicon-containing resist under layer film having the transferred pattern as a mask; and
further transferring the pattern to the body to be processed by dry etching using the CVD hard mask having the transferred pattern as a mask.

22. The patterning process according to claim 16, wherein the body to be processed is a semiconductor apparatus substrate or the semiconductor apparatus substrate coated with any of a metal film, a metal carbide film, a metal oxide film, a metal nitride film, a metal oxycarbide film, and a metal oxynitride film.

23. The patterning process according to claim 22, wherein the metal of the body to be processed is any of silicon, titanium, tungsten, hafnium, zirconium, chromium, germanium, copper, aluminum, indium, gallium, arsenic, palladium, iron, tantalum, iridium, molybdenum, or an alloy thereof.

* * * * *